(12) United States Patent
Yoshimizu

(10) Patent No.: US 11,264,403 B2
(45) Date of Patent: Mar. 1, 2022

(54) SEMICONDUCTOR MEMORY DEVICE

(71) Applicant: Kioxia Corporation, Minato-ku (JP)

(72) Inventor: Yasuhito Yoshimizu, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 64 days.

(21) Appl. No.: 16/818,742

(22) Filed: Mar. 13, 2020

(65) Prior Publication Data

US 2021/0082950 A1 Mar. 18, 2021

(30) Foreign Application Priority Data

Sep. 17, 2019 (JP) .............................. JP2019-168684

(51) Int. Cl.
*H01L 27/11582* (2017.01)
*H01L 27/11556* (2017.01)
(Continued)

(52) U.S. Cl.
CPC .... *H01L 27/11582* (2013.01); *G11C 16/0483* (2013.01); *H01L 23/528* (2013.01);
(Continued)

(58) Field of Classification Search
CPC ......... H01L 27/11582; H01L 27/11524; H01L 27/11556; H01L 27/11565;
(Continued)

(56) References Cited

U.S. PATENT DOCUMENTS

| 7,696,559 B2 | 4/2010 | Arai et al. |
| 8,951,430 B2 | 2/2015 | Li et al. |

(Continued)

FOREIGN PATENT DOCUMENTS

| JP | 4084932 B2 | 4/2008 |
| JP | 2010-161132 A | 7/2010 |
| JP | 2014-150195 A | 8/2014 |
| JP | 2019-54182 A | 4/2019 |
| WO | WO 2010/018893 A1 | 2/2010 |

OTHER PUBLICATIONS

Zhipeng Huang, et al., "Metal-Assisted Chemical Etching of Silicon: A Review", Advanced Materials, vol. 23, Issue 2, Sep. 2010, 24 pages.

*Primary Examiner* — Galina G Yushina
(74) *Attorney, Agent, or Firm* — Oblon, McClelland, Maier & Neustadt, L.L.P.

(57) ABSTRACT

According to one embodiment, a semiconductor memory device includes: first and second interconnect layers; a plurality of third interconnect layers stacked between the first and second interconnect layers; a first insulating layer passing through the plurality of third interconnect layers, and including one end that is in contact with a first face of the first interconnect layer; a first memory pillar including a first semiconductor layer passing through the plurality of third interconnect layers and a charge storage layer provided between the plurality of third interconnect layers and the first semiconductor layer. A distance between a third face of the first interconnect layer opposite to the first face and the second interconnect layer in the first direction, differs at a position corresponding to the first insulating layer from at positions corresponding to the third interconnect layers.

20 Claims, 55 Drawing Sheets

(51) Int. Cl.
  *H01L 23/528* (2006.01)
  *H01L 21/768* (2006.01)
  *G11C 16/04* (2006.01)
  *H01L 27/11524* (2017.01)
  *H01L 27/11529* (2017.01)
  *H01L 27/11565* (2017.01)

(52) U.S. Cl.
  CPC .. *H01L 27/11524* (2013.01); *H01L 27/11556* (2013.01); *H01L 21/76877* (2013.01); *H01L 27/11529* (2013.01); *H01L 27/11565* (2013.01)

(58) Field of Classification Search
  CPC ......... H01L 27/11529; H01L 27/11519; H01L 27/11573; H01L 27/1157; H01L 21/76877; H01L 23/5283; H01L 2924/1434
  See application file for complete search history.

(56) References Cited

U.S. PATENT DOCUMENTS

| | | | |
|---|---|---|---|
| 9,929,179 | B2 | 3/2018 | Son et al. |
| 10,236,254 | B1 | 3/2019 | Arai et al. |
| 2001/0030337 | A1 | 10/2001 | Weis |
| 2010/0171162 | A1 | 7/2010 | Katsumata et al. |
| 2017/0069644 | A1* | 3/2017 | Kikushima ........ H01L 29/40114 |
| 2017/0148748 | A1* | 5/2017 | Jeong ................ H01L 27/11524 |
| 2017/0263637 | A1 | 9/2017 | Sakata et al. |
| 2018/0122904 | A1* | 5/2018 | Matsumoto ......... H01L 29/1037 |
| 2018/0294331 | A1* | 10/2018 | Cho .................... H01L 29/0607 |
| 2020/0013796 | A1* | 1/2020 | Fujita ................ H01L 27/11582 |
| 2020/0286910 | A1* | 9/2020 | Kashima ........... H01L 27/11524 |
| 2020/0303406 | A1* | 9/2020 | Komiya .......... H01L 21/823475 |

\* cited by examiner

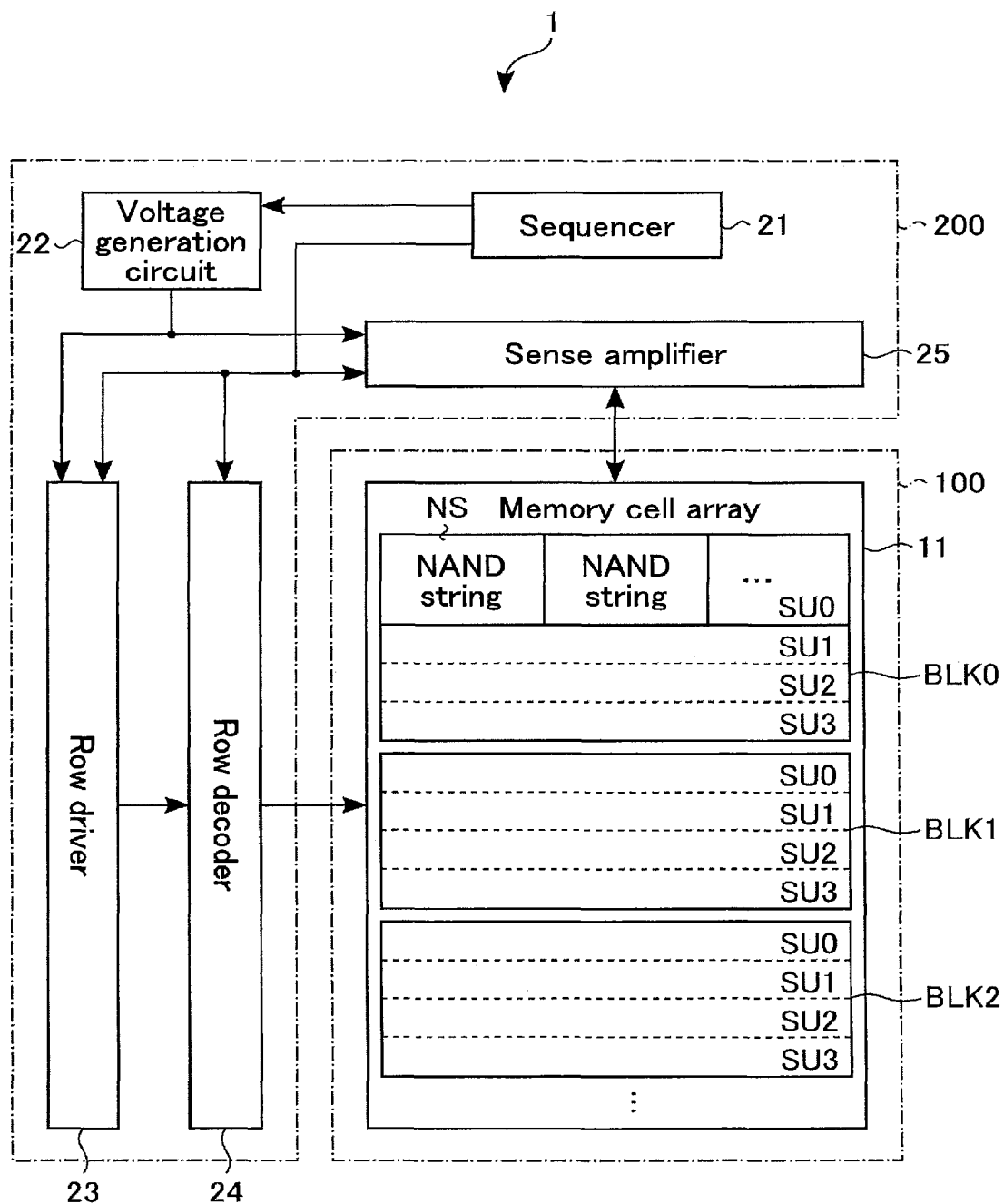
F I G. 1

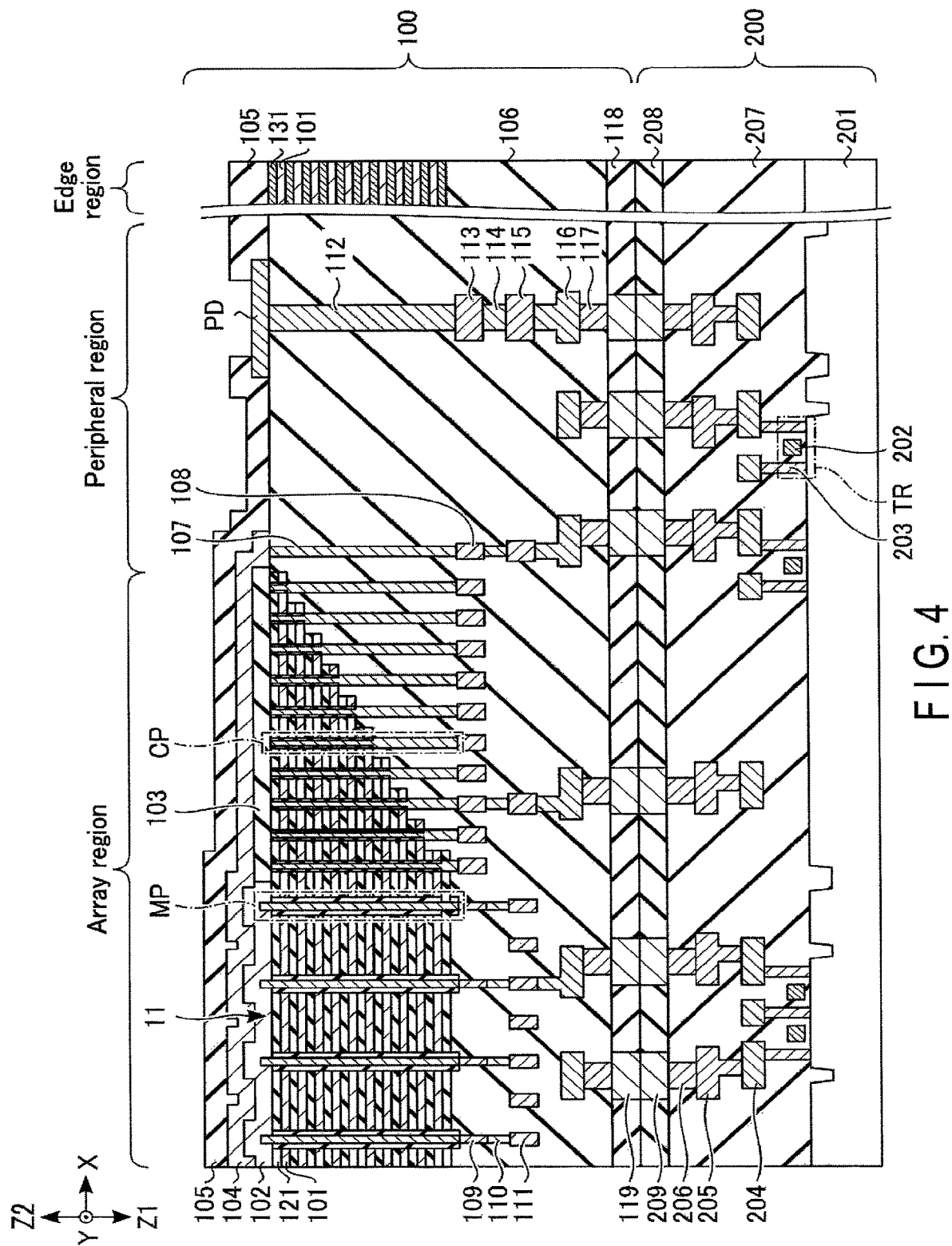
F I G. 4

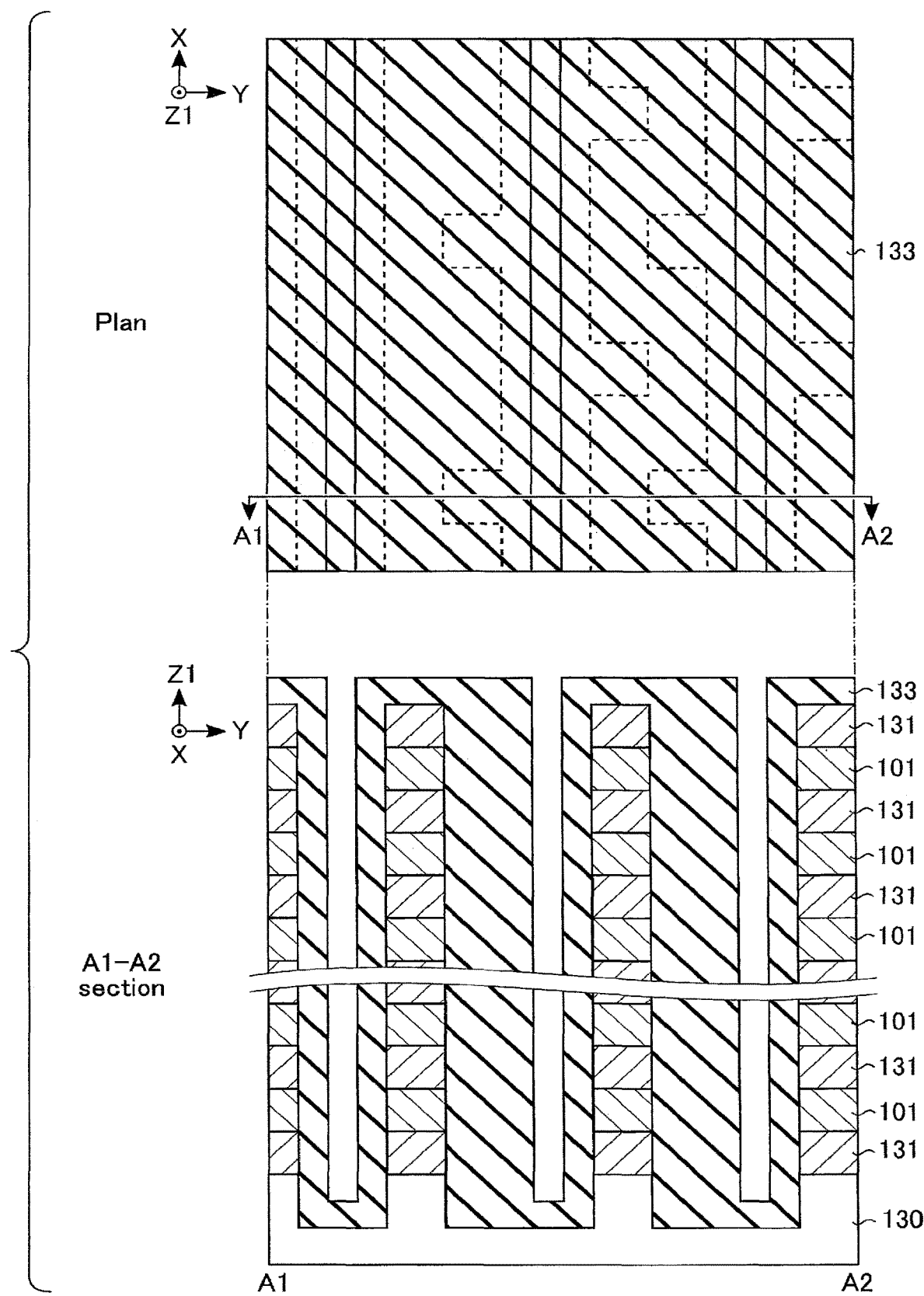
F I G. 12

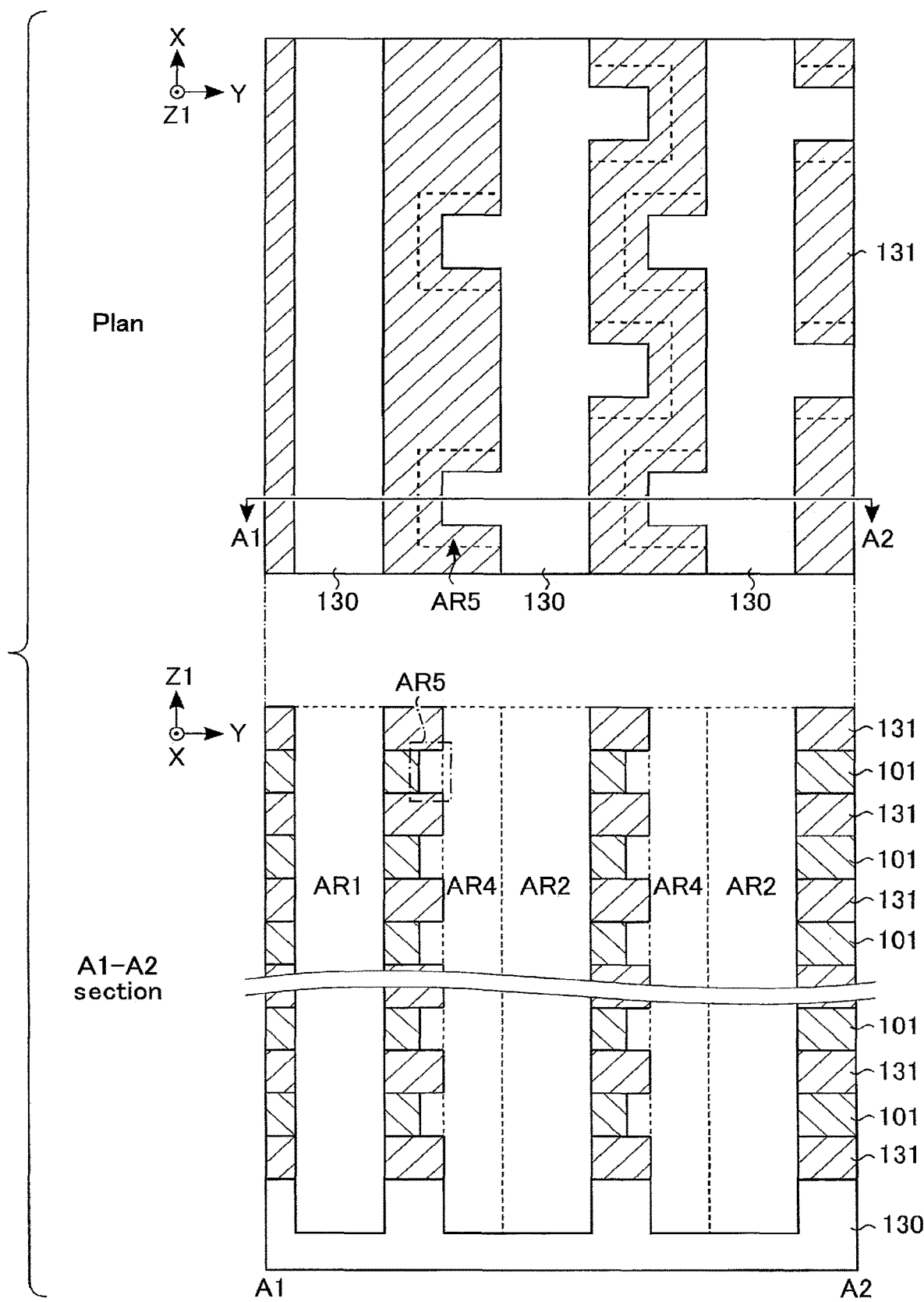
F I G. 17

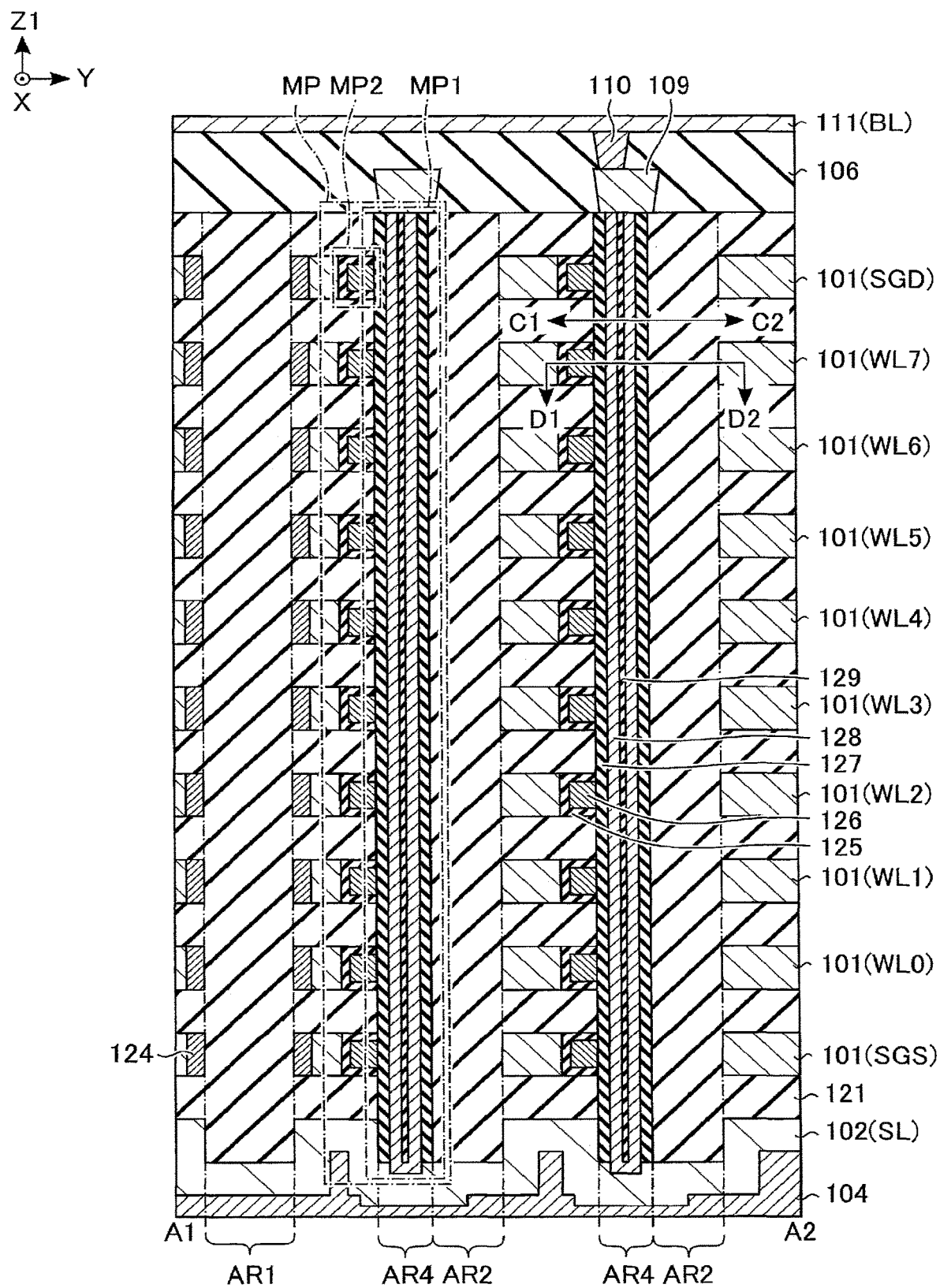
F I G. 46

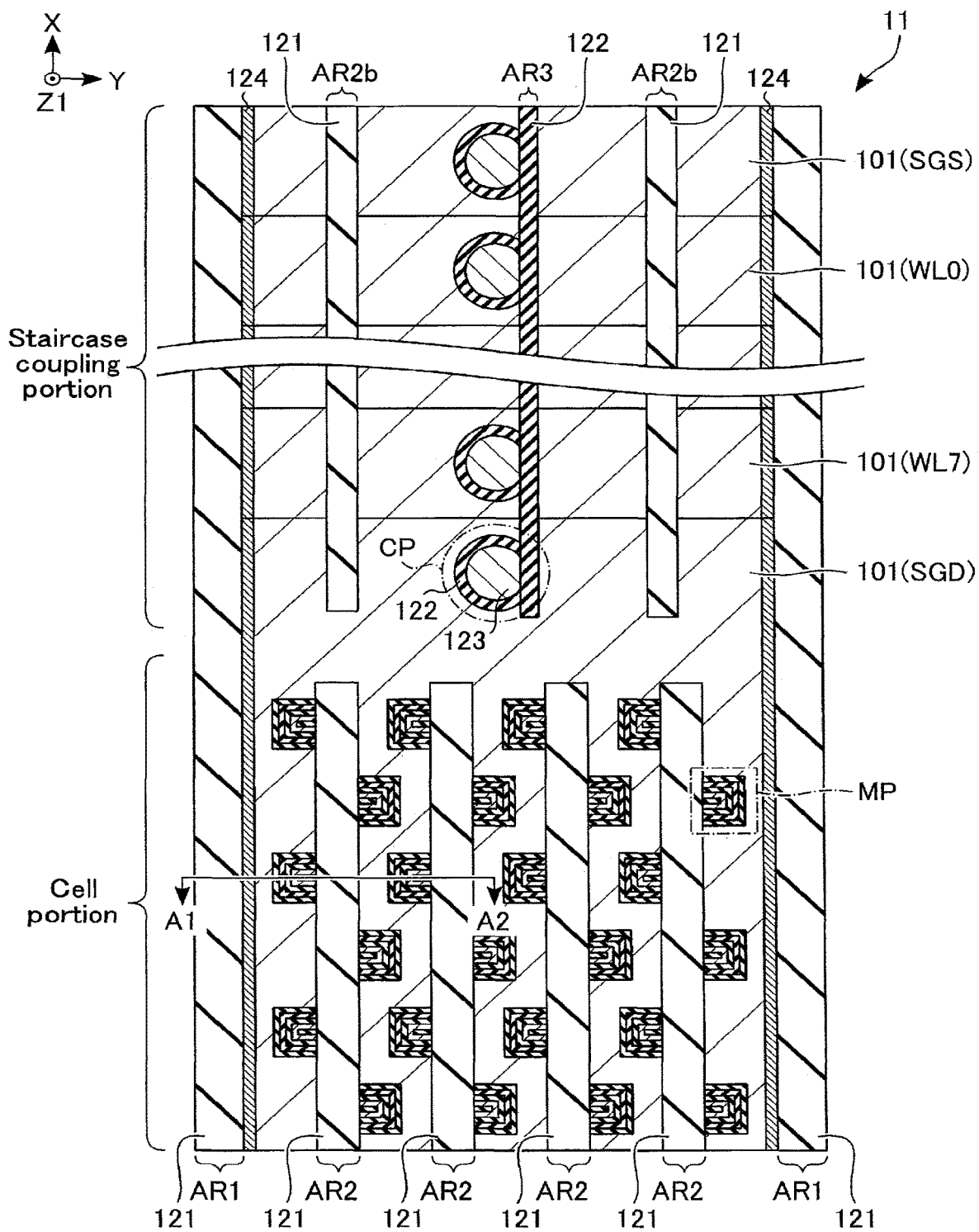
F I G. 48

SEMICONDUCTOR MEMORY DEVICE

CROSS-REFERENCE TO RELATED APPLICATIONS

This application is based upon and claims the benefit of priority from Japanese Patent Application No. 2019-168684, filed Sep. 17, 2019, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 1 is a block diagram illustrating a semiconductor memory device according to a first embodiment;

FIG. 4 is a cross-sectional view of the semiconductor memory device according to the first embodiment;

FIG. 9 to FIG. 20 are diagrams of the cell portion of the memory cell array and illustrate a manufacturing process of the semiconductor memory device according to the first embodiment;

FIG. 46 is a cross-sectional view of a cell portion of a memory cell array provided in a semiconductor memory device according to a third embodiment;

FIG. 48 is a plan of a memory cell array provided in a semiconductor memory device according to a fourth embodiment;

DETAILED DESCRIPTION

Figure 2:
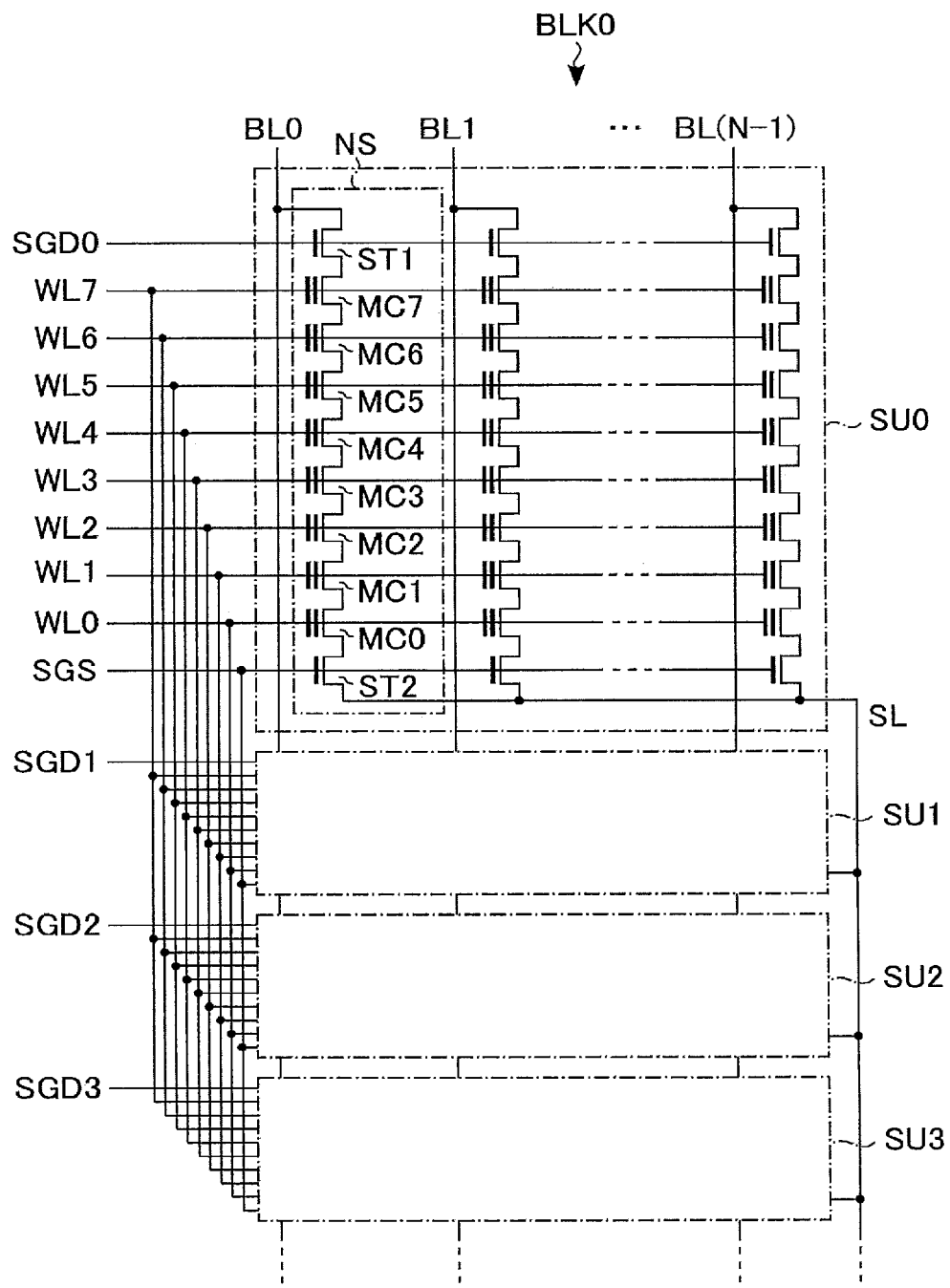
FIG. 2 is a circuit diagram of a memory cell array provided in the semiconductor memory device according to the first embodiment.

In general, according to one embodiment, a semiconductor memory device includes: a first interconnect layer; a second interconnect layer electrically coupled to the first interconnect layer; a plurality of third interconnect layers stacked apart from each other in a first direction between the first interconnect layer and the second interconnect layer in the first direction, and extending in a second direction that intersects the first direction; a first insulating layer passing through the plurality of third interconnect layers, including one end that is in contact with a first face of the first interconnect layer, and extending in the second direction; a first memory pillar including a first semiconductor layer and a charge storage layer, the first semiconductor layer passing through the plurality of third interconnect layers, including a side face in contact with a second face of the first insulating layer extending in the second direction and facing a third direction intersecting the first and second directions, including one end in contact with the first face of the first interconnect layer, and extending in the first direction, and the charge storage layer being capable of storing data and provided between the plurality of third interconnect layers and the first semiconductor layer. A distance between a third face of the first interconnect layer opposite to the first face and the second interconnect layer in the first direction, differs at a position corresponding to the first insulating layer from at positions corresponding to the third interconnect layers.

Hereinafter, embodiments will be described with reference to the accompanying drawings. In the description below, structural elements having substantially the same functions and configurations will be denoted by the same reference symbols, and a repetitive description will be given only where necessary. Each of the embodiments described below merely indicates an exemplary apparatus and method of implementing the technical idea of the embodiment. The technical ideas underlying the embodiments in no way limit the element materials, shapes, configurations, arrangements etc. to those described below. The technical ideas of the embodiments can be modified in various manners within the scope of the claims.

1. First Embodiment

A semiconductor memory device according to the first embodiment will be described. In the description below, the semiconductor memory device will be described, referring to a three-dimensionally stacked NAND type flash memory wherein memory cell transistors are stacked three-dimensionally above a semiconductor substrate.

1.1 Configuration 1.1.1 Overall Configuration of Semiconductor Memory Device

First, an overall configuration of the semiconductor memory device 1 will be described with reference to FIG. 1. FIG. 1 is an example of a block diagram illustrating a fundamental general configuration of the semiconductor memory device. In FIG. 1, part of the coupling between blocks is shown by arrow lines, but the coupling between blocks is not limited to this.

As shown in FIG. 1, the semiconductor memory device 1 includes an array chip 100 and a circuit chip 200.

The array chip 100 includes a memory cell array 11.

The memory cell array 11 includes a plurality of blocks BLK (BLK0, BLK1, BLK2 . . . ). Each of the blocks BLK includes a plurality of string units SU (SU0 to SU3) (four string units in the present embodiment). The string unit SU is a set of NAND strings NS in which memory cell transistors are coupled in series. The number of blocks in the memory cell array 11 and the number of string units SU in each block BLK are arbitrary.

The circuit chip 200 includes a sequencer 21, a voltage generation circuit 22, a row driver 23, a row decoder 24, and a sense amplifier 25.

The row driver 23 supplies voltages applied from the voltage generation circuit 22 to the row decoder 24 based on, for example, an address signal (a page address signal, or the like) received from an external controller (not shown).

The row decoder 24 decodes a row address based on, for example, an address signal (a block address signal, or the like) received from the external controller. The row decoder 24 selects one of the blocks BLK based on the decoding result, and couples the selected block BLK to the row driver 23.

The sense amplifier 25 senses data read from string unit SU of block BLK in a read operation. The sense amplifier 25 supplies voltages corresponding to write data to the memory cell array 11 in a write operation.

The sequencer 21 controls the overall operation of the semiconductor memory device 1. More specifically, the sequencer 21 controls the voltage generation circuit 22, row driver 23, row decoder 24, sense amplifier 25, etc., during a write operation, a read operation and an erase operation.

The voltage generation circuit 22 generates voltages used for the write operation, read operation and erase operation, and supplies the voltages to the row driver 23, sense amplifier 25, etc.

1.1.2 Circuit Configuration of Memory Cell Array

Next, a circuit configuration of the memory cell array 11 will be described with reference to FIG. 2. The example in FIG. 2 shows block BLK0, but the configurations of the other blocks BLK are the same.

As shown in FIG. 2, block BLK0 includes, for example, four string units SU0 to SU3. Each string unit SU includes a plurality of NAND strings NS. Each of the NAND strings NS includes, for example, eight memory cell transistors MC (MC0 to MC7) and select transistors ST1 and ST2. Each of the memory cell transistors MC includes a control gate and a charge storage layer, and holds data in a nonvolatile manner. Where memory cell transistors MC0 to MC7 do not have to be discriminated from each other, each of them will be hereinafter expressed as memory cell transistor MC.

Memory cell transistor MC may be a MONOS type using an insulating film as a charge storage layer, or an FG (floating gate) type using a conductor as a charge storage layer. In connection with the present embodiment, the FG type will be described by way of example. The number of memory cell transistors MC in the NAND string NS is not limited to eight but may be 16, 32, 64, 96, 128, or the like. That is, the number of memory cell transistors MC is not limited to a specific value. The number of select transistors ST1 and ST2 in each NAND string NS may be one or more.

In the NAND string NS, current paths are coupled in series in the order of select transistor ST2, memory cell transistors MC0 to MC7 and select transistor ST1. The drain of select transistor ST1 is coupled to the corresponding bit line BL. The source of select transistor ST2 is coupled to source line SL.

The control gates of memory cell transistors MC0 to MC7 in blocks BLK are commonly coupled to word lines WL0 to WL7, respectively. More specifically, for example, the control gates of a plurality of memory cell transistors MC0 in block BLK0 are commonly coupled to word line WL0.

The gates of select transistors ST1 in each string unit SU are coupled to select gate line SGD. More specifically, the gates of a plurality of select transistors ST1 in string unit SU0 are coupled in common to select gate line SGD0. The gates of a plurality of select transistors ST1 (not shown) of string unit SU1 are coupled in common to select gate line SGD1. This holds true of string units SU2 and SAU3 as well. Where select gate lines SGD0 to SGD3 do not have to be discriminated from each other, they will be expressed as select gate lines SGD.

The gates of a plurality of select transistors ST2 in block BLK are commonly coupled to select gate line SGS. The gates of select transistors ST2 of different string units may be coupled to respective different select gate lines SGS.

The drains of a plurality of select transistors ST1 in string unit SU are coupled to different bit lines BL (BL0 to BL(N−1), where N is an integer of 2 or more). That is, a plurality of NAND strings NS in string unit SU are coupled to different bit lines BL, respectively. In each block BLK, bit line BL couples one NAND string NS of string unit SU0, one NAND string NS of string unit SU1, one NAND string NS of string unit SU2 and one NAND string NS of string unit SU3 in common.

The sources of a plurality of select transistors ST2 of a plurality of blocks BLK are commonly coupled to a source line SL.

That is, string unit SU is an aggregation of a plurality of NAND strings NS which are coupled to respective different bit lines BL and are coupled to the same select gate line SGD. Block BLK is an aggregation of a plurality of string units SU that share word lines WL. The memory cell array 11 is an aggregation of a plurality of blocks BLK that share bit lines BL.

1.1.3 Planar Configuration of Semiconductor Memory Device

Next, an example of the planar configuration of the semiconductor memory device 1 will be described with reference to FIG. 3.

Figure 3:
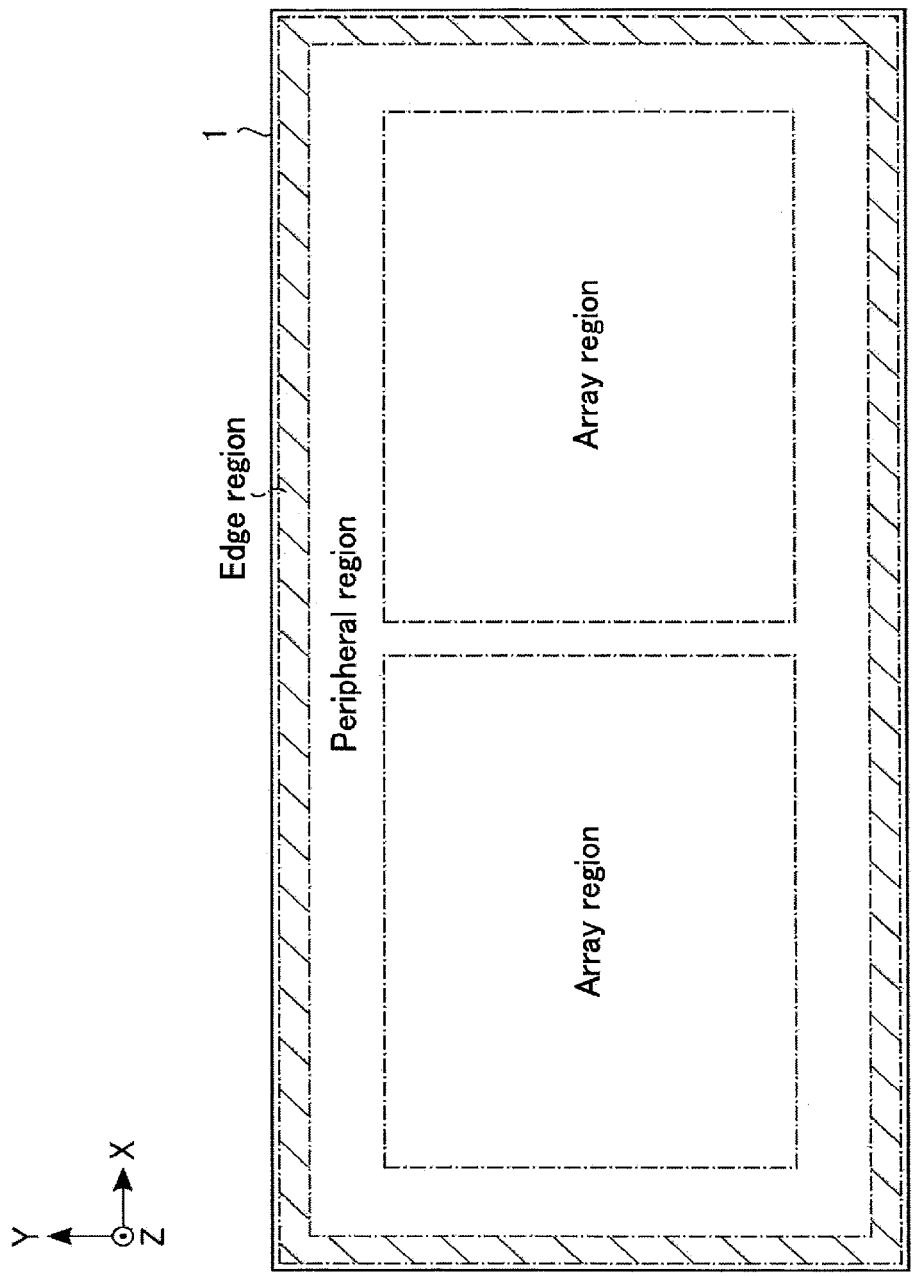
FIG. 3 is a plan of the semiconductor memory device according to the first embodiment.

As shown in FIG. 3, the semiconductor memory device 1 includes an array region, a peripheral region and an edge region. The array region is a region that includes the memory cell array 11. The array region may include the row driver 23, row decoder 24, sense amplifier 25, etc.

The peripheral region is a region that does not include the memory cell array 11, and is a region in which circuits other than the memory cell array 11, electrode pads used for coupling between the semiconductor memory device 1 and external devices, etc. are provided.

The edge region is a neighboring region including a chip end. The edge region is, for example, a region in which scribe lines, an alignment pattern for lithography used in the manufacturing process of the semiconductor memory device 1, a characteristic check pattern, etc. are provided.

1.1.4 Sectional Configuration of Semiconductor Memory Device

Next, an example of the cross-sectional configuration of the semiconductor memory device 1 will be described with reference to FIG. 4. FIG. 4 shows a cross section taken along the X direction of FIG. 3. In the description below, the X direction is substantially parallel to the semiconductor substrate 201 and corresponds to, for example, the direction in which word lines WL extend. The Y direction is substantially parallel to the semiconductor substrate 201, intersects the X direction, and corresponds to, for example, a direction in which bit lines BL extend. The Z1 direction is substantially perpendicular to the semiconductor substrate 201 and corresponds to the direction that is away from the array chip 100 toward the circuit chip 200. The Z2 direction is substantially perpendicular to the semiconductor substrate 201 and corresponds to the direction that is away from the circuit chip 200 toward the array chip 100. Where the Z1 direction and the Z2 direction do not have to be discriminated from each other, they will be referred to as the Z direction.

As shown in FIG. 4, the semiconductor memory device 1 has a configuration in which the array chip 100 and the circuit chip 200 are bonded to each other.

The array chip 100 includes a memory cell array 11 and various interconnects for coupling the memory cell array 11 and the circuit chip 200 to each other.

More specifically, the array chip 100 includes a plurality of interconnect layers 101 and insulating layers 121 that are alternately stacked in the array region, a plurality of interconnect layers 101 and sacrificial layers 131 that are alternately stacked in the edge region, interconnect layers 102, 104, 108, 111, 113, 115 and 116, a plurality of contact plugs CP, 107, 109, 110, 112, 114 and 117, a plurality of electrode pads PD and 119, insulating layers 103, 105, 106 and 118, and memory pillars MP.

In the example shown in FIG. 4, eleven insulating layers 121 and ten interconnect layers 101 are alternately stacked in the array region. That is, the plurality of interconnect layers 101 are stacked away from each other in the Z direction, and function as word lines WL and select gate lines SGD and SGS. A plurality of memory pillars MP penetrate the plurality of insulating layers 121 and the plurality of interconnect layers 101 and extend in the Z direction. The memory pillars MP protrude from the upper face of insulating layer 121 in the Z2 direction. One of the memory pillars MP corresponds to one NAND string NS. Details of the memory pillars MP will be described later.

Interconnect layer 102 is provided on the uppermost insulating layer 121 (above interconnect layers 101) as viewed in the Z2 direction, and functions as source line SL. One end of each memory pillar MP is coupled to interconnect layer 102. Interconnect layer 102 is so formed as to conformally cover the plurality of memory pillars MP. For this reason, the upper face of interconnect layer 102 as viewed in the Z2 direction has protrusions attributable to the memory pillars MP. The other end of each memory pillar MP is coupled through contact plugs 109 and 110 to interconnect layer 111 functioning as bit line BL. That is, interconnect layer 102 and interconnect layer 111 can be electrically coupled through the memory pillars MP. Further, interconnect layer 111 is electrically coupled to a given one of the electrode pads 119, for example, through interconnect layer 116 and contact plug 117. Electrode pads 119 are used for coupling to the circuit chip 200.

The ends of the plurality of interconnect layers 101 extending in the X direction are drawn out in such a manner as to form a staircase structure. Each interconnect layer 101 is electrically coupled to one of interconnect layers 108 through contact plug CP. Each interconnect layer 108 is electrically coupled to a given one of the electrode pads 119, for example, through contact plug 114, interconnect layers 115 and 116 and contact plug 117. Details of contact plug CP will be described later. Insulating layer 103 is provided on the contact plugs CP such that the contact plugs CP and interconnect layer 104 are not electrically coupled to each other.

Interconnect layer 104 that electrically couples interconnect layer 102 and contact plug 107 is provided on both interconnect layer 102 and insulating layer 103 in the Z2 direction. Interconnect layer 104 is electrically coupled to one of interconnect layers 108 through contact plug 107. Each interconnect layer 108 is electrically coupled to a given one of the electrode pads 119, for example, through contact plug 114, interconnect layers 115 and 116 and contact plug 117.

A plurality of electrode pads PD are provided on the upper face of the array chip 100 as viewed in the Z2 direction. The electrode pads PD are used for coupling between the semiconductor memory device 1 and external devices. Each electrode pad PD is electrically coupled to a given one of electrode pads 119 through contact plug 112, interconnect layer 113, contact plug 114, interconnect layers 115 and 116 and contact plug 117.

Insulating layer 105 functioning as a passivation film is formed on the upper face of the array chip 100 as viewed in the Z2 direction such that part of the electrode pads PD, interconnect layer 104 and insulating layer 106 are covered. Insulating layer 105 is provided with openings corresponding to electrode pads PD.

Insulating layer 118 is provided on insulating layer 106 in the Z1 direction. A plurality of electrode pads 119 are provided in insulating layer 118 and are coupled to the circuit chip 200.

Eleven sacrificial layers 131 and ten interconnect layers 101 are alternately stacked in at least part of the edge region and the peripheral region (not shown). The eleven sacrificial layers 131 are provided in the same layers as insulating layers 121. More specifically, for example, a stacked body in which semiconductor layers corresponding to the sacrificial layers 131 and semiconductor layers corresponding to the interconnect layers 101 are alternately stacked is provided in the edge region. In the present embodiment, a method of replacing the sacrificial layers 131 with the insulating layers 121 (hereinafter referred to as "replacement") is used in the manufacturing process of the semiconductor memory device 1. Therefore, a region where the sacrificial layers 131 and interconnect layers 101 are stacked without the replacement remains in at least part of the edge region and peripheral region. Details of the replacement will be described later.

Interconnect layers 101, 102, 104, 108, 111, 113, 115 and 116 are formed of a conductive material; for example, they may be formed of a metallic material, a p-type semiconductor, or an n-type semiconductor. Hereinafter, reference will be made to the case where polysilicon doped with impurities (phosphorus (P), boron (B), or the like) is used as interconnect layer 101. Contact plugs 107, 109, 110, 112, 114 and 117 are formed of a conductive material; for example, they may be formed of a metallic material, a p-type semiconductor, or an n-type semiconductor. Electrode pads PD and 119 are formed of a conductive material; for example, they may be formed of a metallic material. Hereinafter, reference will be made to the case where electrode pads 119 contain copper (Cu). Insulating layers 103, 105, 106 and 118 may be formed of silicon oxide ($SiO_2$), for example.

The circuit chip 200 includes a sequencer 21, a voltage generation circuit 22, a row driver 23, a row decoder 24, a sense amplifier 25, and various interconnects for coupling these circuits.

More specifically, the circuit chip 200 includes a semiconductor substrate 201, a plurality of transistors TR, a plurality of interconnect layers 204 and 205, a plurality of contact plugs 203 and 206, a plurality of electrode pads 209, and insulating layers 207 and 208.

The plurality of transistors TR are used in the sequencer 21, voltage generation circuit 22, row driver 23, row decoder 24, sense amplifier 25, etc. Each transistor TR. includes a gate insulating film (not shown) provided on the semiconductor substrate 201, a gate electrode 202 provided on the gate insulating film, and a source and a drain (not shown) formed in the semiconductor substrate 201. The source and drain are electrically coupled to interconnect layers 204 through contact plugs 203. Interconnect layers 204 are electrically coupled to interconnect layers 205. Interconnect layers 205 are electrically coupled to electrode pads 209 through contact plugs 206.

Insulating layer 207 is provided on the semiconductor substrate 201. Insulating layer 208 is provided on insulating layer 207. A plurality of electrode pads 209 are provided in insulating layer 208 and are electrically coupled to the plurality of electrode pads 119 of the array chip 100, respectively.

Interconnect layers 204 and 205, contact plugs 203 and 206 and gate electrodes 202 are formed of a conductive material; for example, they may be formed of a metal material, a p-type semiconductor, or an n-type semiconductor. Electrode pads 209 are formed of a conductive material; for example, they may be formed of a metallic material. Hereinafter, reference will be made to the case where electrode pads 209 contain copper (Cu). Insulating layers 207 and 208 may be, for example, silicon oxide ($SiO_2$).

1.1.5 Planar Configuration of Memory Cell Array

Figure 5:
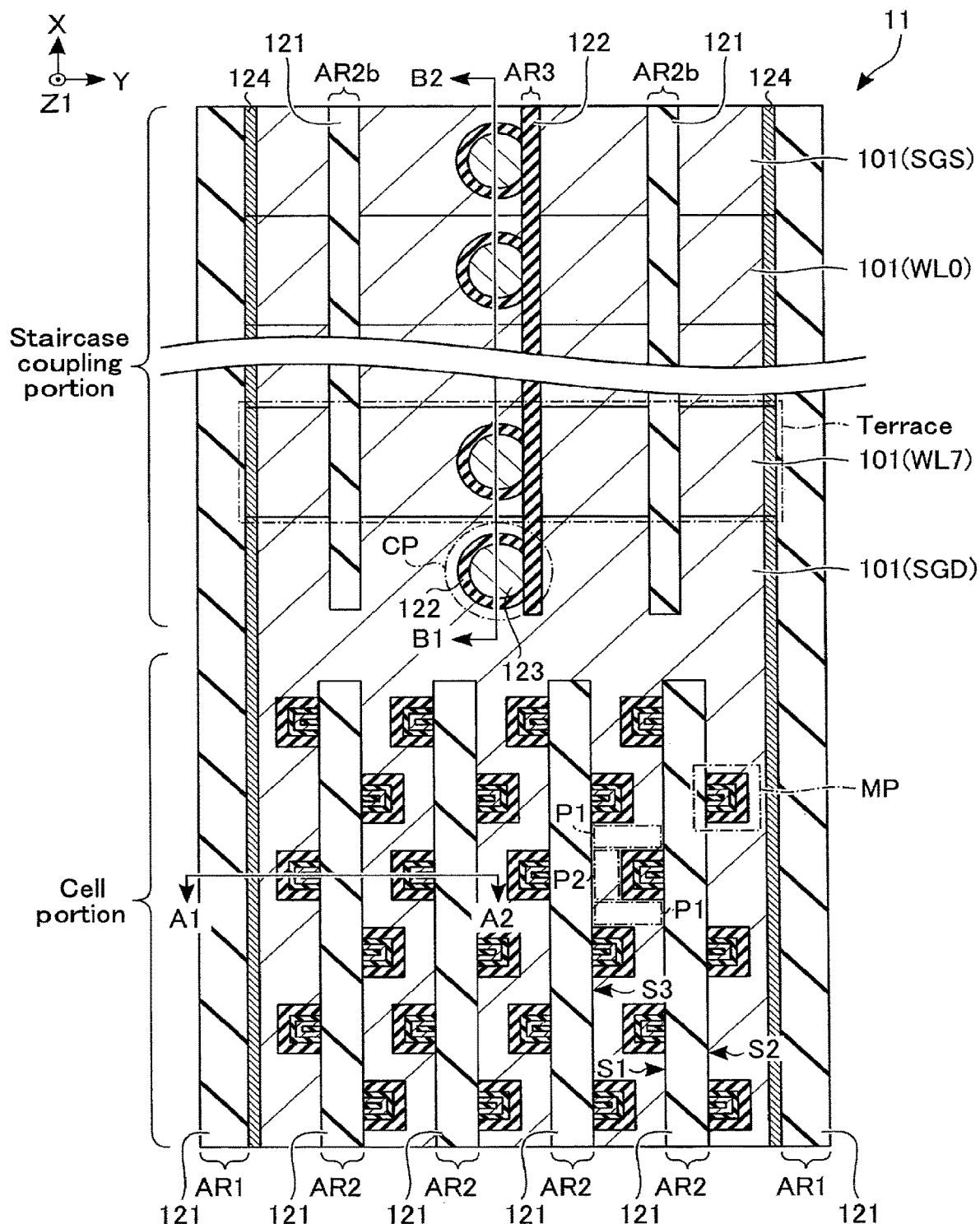
FIG. 5 is a plan of the memory cell array provided in the semiconductor memory device according to the first embodiment.

Next, an example of the planar configuration of the memory cell array 11 will be described with reference to FIG. 5. FIG. 5 shows part of one block BLK, and illustration of part of the insulating layers is omitted to simplify the description.

As shown in FIG. 5, in the present embodiment, interconnect layers 101 that function as select gate line SGS, word lines WL0 to WL7, and select gate line SGD in the order from the lowermost layer are stacked in the Z1 direction perpendicular to the semiconductor substrate, such that they are separate from each other in the Z1 direction.

Areas AR1 extending in the X direction are provided such that the plurality of interconnect layers 101, that is, word lines WL and select gate lines SOS and SGD, are separated for each block BLK. Areas AR1 are filled with insulating layer 121 Insulating layer 121 is formed of $SiO_2$, for example.

Interconnect layers 124 extending in the X direction is provided between interconnect layer 101 and area AR1 (insulating layer 121). Interconnect layers 124 functions as a low resistance layer for reducing the interconnect resistance of word line WL and select gate lines SGS and SGD. Interconnect layer 124 is formed of a conductive material having a lower resistance than the conductive material of interconnect layer 101. In the description below, reference will be made to the case where interconnect layer 124 has a stacked structure of titanium nitride (TiN) and tungsten (W). TiN functions as a barrier layer for preventing the reaction between W and a semiconductor layer from occurring when a film of W is formed by CVD (chemical vapor deposition). TiN also functions as an adhesion layer for improving the adhesion with W.

The memory cell array 11 includes a cell portion and a staircase coupling portion.

In the cell portion, a plurality of memory pillars MP corresponding to the NAND strings NS are arranged, for example, in a staggered fashion. The memory pillars MP penetrate (pass) the plurality of interconnect layers 101 and extend in the Z1 direction. The upper ends of the memory pillars MP are electrically coupled to bit lines BL (not shown) extending in the Y direction.

In the cell portion, a plurality of areas AR2 (four areas in the example shown in FIG. 5) penetrating the plurality of interconnect layers 101 and extending in the X direction are provided. Areas AR2 are filled with insulating layer 121. For one area AR2, a plurality of memory pillars MP are arranged such that they are alternately in contact with two side faces extending in the X direction and facing the Y direction. It should be noted that the arrangement of the memory pillars MP can be arbitrarily determined, and it is only required that the memory pillars MP are in contact with area AR2.

More specifically, for example, a plurality of memory pillars MP are arranged side by side in the X direction such that they are in contact with one side face S1 of area AR2 (insulating layer 121) extending in the X direction and facing the Y direction. Similarly, a plurality of memory pillars MP are arranged side by side in the X direction such that they are in contact with the other face S2 of area AR2 extending in the X direction and being opposite to side face 51. The memory pillars MP that are in contact with side face S1 and the memory pillars MP that are in contact with side face S2 are alternately arranged in the X direction.

Further, between two adjacent areas AR2, the plurality of memory pillars MP that are in contact with the opposite side faces (for example, side face S1 and side face S3) are alternately arranged in the X direction. Accordingly, interconnect layer 101 provided between two adjacent areas AR2 includes portions P1 extending in the Y direction and portions P2 extending in the X direction, and these portions are alternately coupled at the ends to provide a zigzag shape. In other words, between side face S1 and side face S3, interconnect layer 101 has a shape which is like a rectangular wave extending in the X direction.

In the staircase coupling portion, a plurality of interconnect layers 101 are drawn out in the X direction to provide a staircase structure. At the end of each interconnect layer 101, a coupling portion to contact plug CP is provided. The coupling portion will be hereinafter referred to as a "terrace".

In the staircase coupling portion, a plurality of contact plugs CP that are electrically coupled to respective ones of the plurality of interconnect layers 101 (terraces) are provided. The upper ends of the contact plugs CP are coupled to interconnect layers 108, respectively. An insulating layer 122 is formed on the side face of each contact plug CP, and the inside thereof is filled with a conductor 123. The insulating layer 122 is formed of $SiO_2$, for example. The conductor 123 is formed of a conductive material. In the description below, reference will be made to the case where the conductor 123 has a stacked structure of TiN and W.

In the staircase coupling portion as well as in the cell portion, a plurality of areas AR2b (two areas in the example shown in FIG. 5) penetrating the plurality of interconnect layers 101 and extending in the X direction are provided. Areas AR2b are filled with insulating layer 121. Areas AR2 provided in the cell portion and areas AR2b provided in the staircase coupling portion are not in contact with each other. In addition, the number of areas AR2 provided in the cell portion and the number of areas AR2b provided in the staircase coupling portion may be the same or different.

In the staircase coupling portion, area AR3 penetrating the plurality of interconnect layers 101 and extending in the X direction is provided. Area AR3 is filled with insulating layer 122. A plurality of contact plugs CP are arranged along the X direction such that they are in contact with one side face of area AR3 (insulating layer 122) extending in the X direction and facing the Y direction. That is, the insulating layer 122 of area AR3 and the insulating layers 122 of the contact plugs CP are in contact with each other. For example, the contact plugs CP are in contact with area AR3, so that they have substantially a cylindrical shape. It should be noted that the arrangement of the contact plugs CP can be arbitrarily determined, and it is only required that the contact plugs CP are in contact with area AR3.

A plurality of contact plugs CP are arranged side by side in the X direction such that they are in contact with the side face of area AR3 extending in the X direction. It should be noted that the arrangement of the contact plugs CP can be arbitrarily determined, and it is only required that the contact plugs CP are in contact with area AR3. It should be also noted that a plurality of areas AR3 may be provided.

1.1.6 Configuration of Cell Portion

Figure 6:
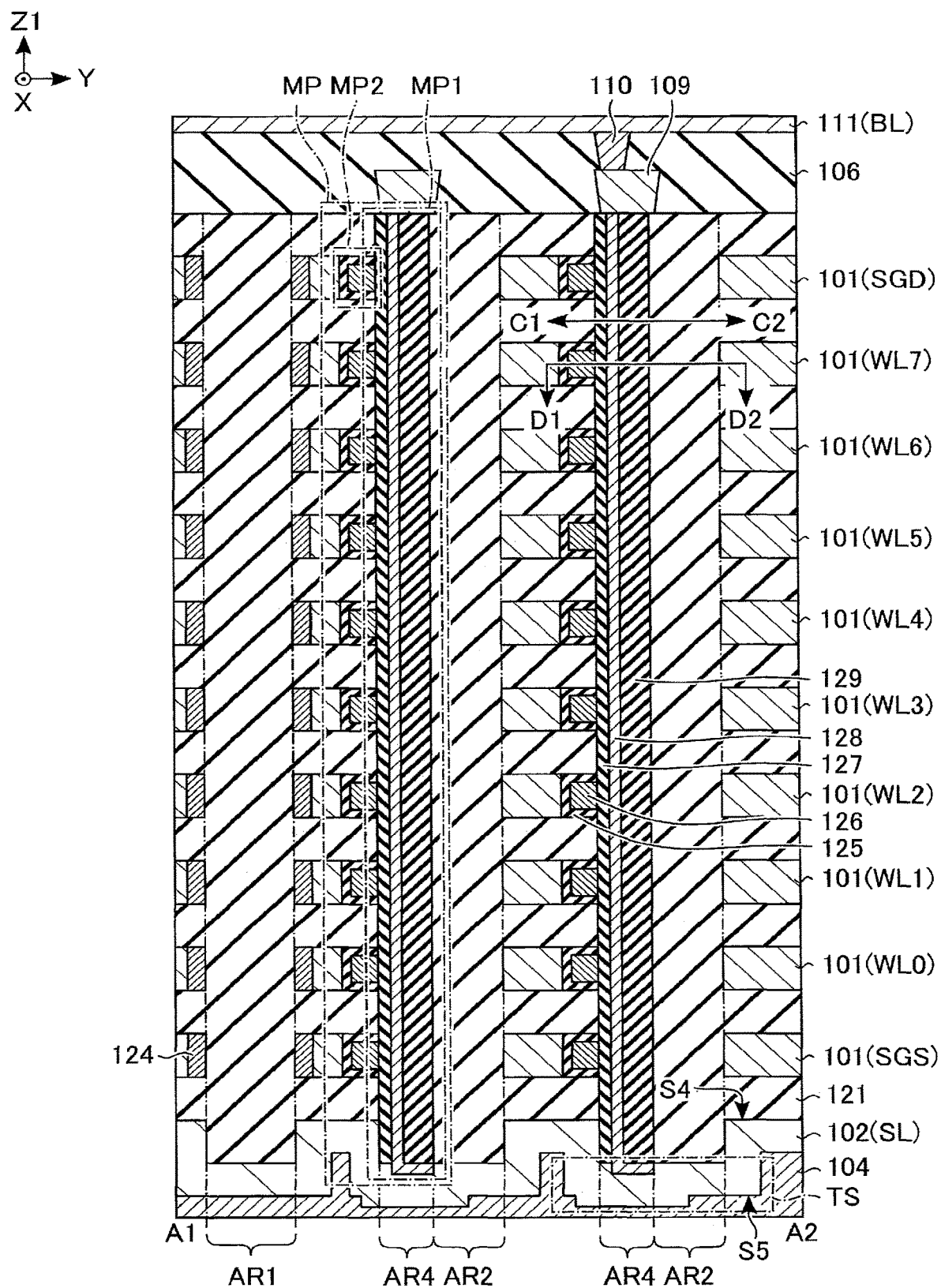
FIG. 6 is a cross-sectional view of a cell portion of the memory cell array provided in the semiconductor memory device according to the first embodiment.
Figure 7:
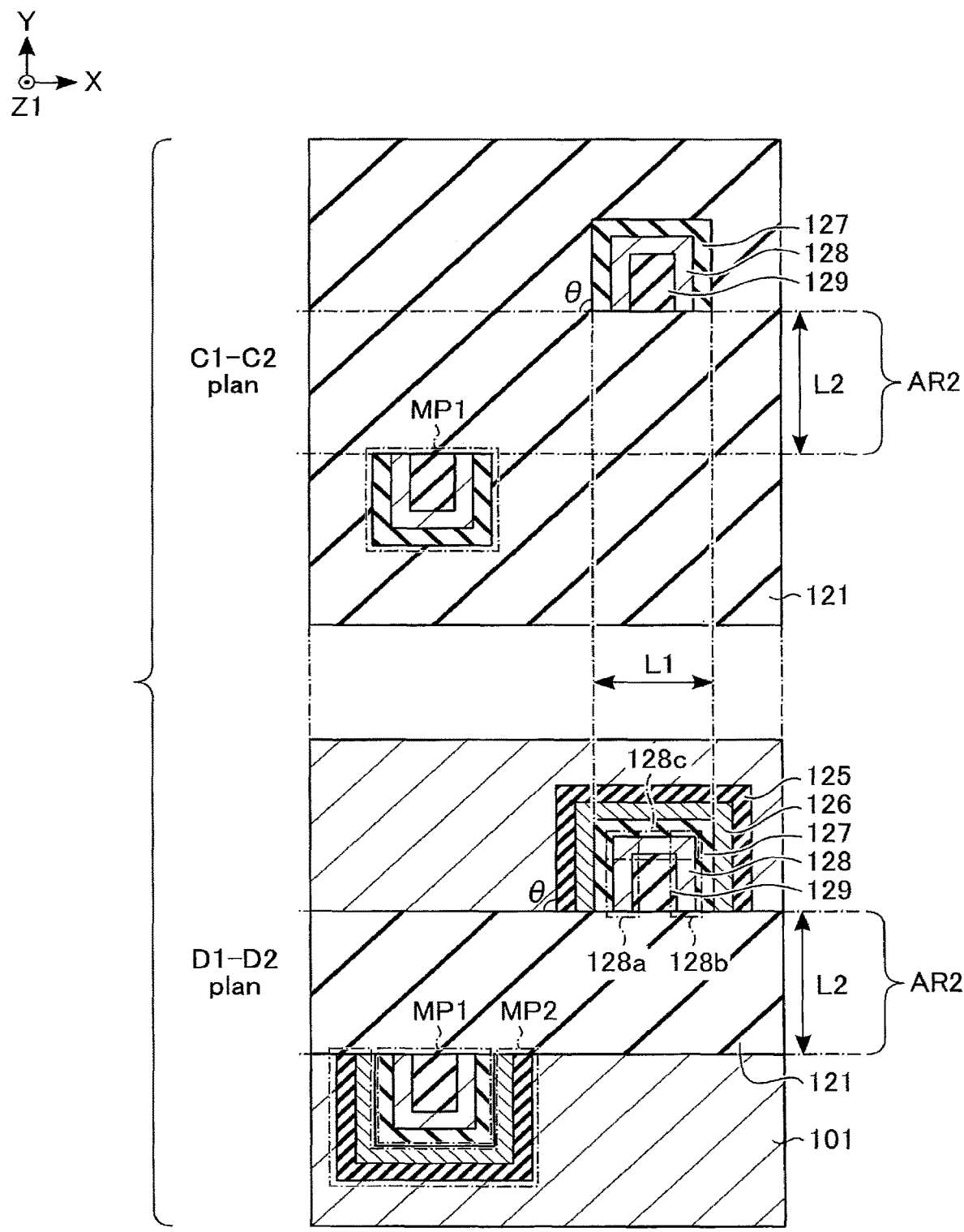
FIG. 7 is plans of the cell portion of the memory cell array provided in the semiconductor memory device according to the first embodiment.

Next, an example of the configuration of the cell portion of the memory cell array 11 will be described with reference to FIGS. 6 and 7. FIG. 6 shows a cross-sectional view of the cell portion taken along line A1-A2 of FIG. 5. FIG. 7 shows plans taken along line C1-C2 and line D1-D2 of FIG. 6. Hereinafter, the plan along line C1-C2 will be referred to as a C1-C2 plan, and the plan along line D1-D2 will be referred to as a D1-D2 plan.

As shown in FIG. 6, interconnect layer 102 extending in the X and Y directions is formed on interconnect layer 104 in the Z1 direction. Interconnect layer 102 functions as a source line SL. In the Zi direction, the bottom face S5 of interconnect layer 102 has a protrusion TS. That is, the face S5 of interconnect layer 102 has an uneven shape in the XY plane and is not flat. More specifically, interconnect layer 102 includes face S4 which is in contact with the bottom face of insulating layer 121 provided below the lowermost interconnect layer 101 (select gate line SGS), described later, as viewed in the Z1 direction, insulating layer 121 provided in areas AR1 and AR2, and the column portion MP1 (area. AR4) of the memory pillar MP, and face S5 opposite to face S4 (located on the opposite side to face S4) and being in contact with interconnect layer 104. For example, interconnect layer 102 is formed such that the film thickness as viewed in the Zi direction is substantially uniform with respect to insulating layer 121 provided below the lowermost interconnect layer 101, insulating layer 121 provided in areas AR1 and AR2, and the bottom faces (that is, the ends located on the side of interconnect layer 102) of the column portions MP1 (areas AR4) of the memory pillars MP. As viewed in the Z1 direction, the bottom face of insulating layer 121 provided below the lowermost interconnect layer 101, the bottom faces of areas AR1 and AR2, and the bottom faces of the column portions MP1 (areas AR4) are different in height position. Thus, interconnect layer 102 has protrusions TS on the side of face S5 in correspondence to areas AR1 and AR2 and the column portions MP1 (areas AR4). Therefore, the distance between interconnect layer 111 and face S5 differs between at the position corresponding to area AR2 and at the position corresponding to interconnect layer 101. The distance between the end of insulating layer 121 that is in contact with face S4 in area AR2 (that is, the end of insulating layer 121 on the side of interconnect layer 102) and interconnect layer 111 is longer than the distance between the end at which insulating layer 121 provided between the lowermost interconnect layer 101 as viewed in the Z1 direction and interconnect layer 102 (that is, insulating layer 121 which is one of the plurality of insulating layers 121 alternately stacked with the plurality of interconnect layers 101 and which is located closest to interconnect layer 102) is in contact with face S4 and interconnect layer 111.

For example, ten interconnect layers 101 are stacked above interconnect layer 102 such that they are spaced apart in the Z1 direction. The ten interconnect layers 101 function, for example, as select gate line SGS, word lines WL0 to WL7 and select gate line SGD in the order from the lowermost layer.

Areas AR1 and AR2 are provided such that they extend in the X direction, penetrate (pass) the plurality of interconnect layer 101, and the bottom faces thereof reach interconnect layer 102 . The region between areas ARI and AR2, the region between the plurality of interconnect layers 101, the region between interconnect layer 102 and interconnect layer 101 and the region between the uppermost interconnect layer 101 and insulating layer 106 are filled with insulating layer 121.

A memory pillar MP is provided such that it is in contact with the side face of area AR2 and extends in the Z1 direction. The memory pillar MP of the present embodiment includes a column portion MP1 and a plurality of branch portions MP2. One of the branch portions MP2 corresponds to one memory cell transistor MC. One side face of the column portion MP1 is in contact with insulating layer 121 in area AR2. The area corresponding to the column portion MP1 is denoted as AR4. The column portion MP1 penetrates (passes) the plurality of interconnect layers 101 and extends in the Z1 direction. For example, the height positions of the top and bottom faces of the column portion MP1 are substantially the same as the height position of area AR2, as viewed in the Z1 direction. The column portion MP1 includes a tunnel insulating film 127, a semiconductor layer 128, and a core layer 129 which extend in the Z1 direction. The semiconductor layer 128 is a region where channels of the memory cell transistors MC and select transistors ST1 and ST2 are formed.

The branch portions MP2 are provided in the same layers as interconnect layers 101. Each branch portion MP2 includes a block insulating film 125 and a charge storage layer 126. A block insulating film 125 is provided such that it surrounds the side face of the charge storage layer 126 that is not in contact with the tunnel insulating film 127 and the top and bottom faces of the charge storage layer. That is, the block insulating film 125 is provided between interconnect layers 101 and the charge storage layer 126 and between the charge storage layer 126 and insulating layers 121 provided between interconnect layers 101.

The block insulating film 125, the tunnel insulating film 127 and the core layer 129 are formed of $SiO_2$, for example. The charge storage layer 126 is formed of a conductive material, which is, for example, polycrystalline silicon. The semiconductor layer 128 is formed of polysilicon, for example.

Insulating layer 106 is provided on insulating layer 121. Contact plugs 109 and 110 are stacked on semiconductor layer 128. For example, contact plug 110 extends in the Y direction and is electrically coupled to interconnect layer 111 that functions as bit line BL.

In the Y direction, interconnect layer 124 extending in the X direction is provided between insulating layer 121 and interconnect layer 101 in area AR1.

Memory cell transistors MC0 to MC7 are constituted by memory pillar MP and eight interconnect layers 101 that function as word lines WL0 to WL7, respectively. Accordingly, data corresponding to the memory cell transistors MC0 to MC7 is held between each of the word lines WL0 to WL7 and semiconductor layer 128. Similarly, select transistors ST1 and ST2 are constituted by memory pillar MP and interconnect layers 101 that function as select gate lines SGD and SGS, respectively.

Next, a description will be given of the planar configuration of memory pillar MP.

As shown in FIG. 7, the C1-C2 plan is a plan of a region where interconnect layers 101 are not provided (the region between two interconnect layers 101 in the Z1 direction). That is, the C1-C2 plan is a plan of the column portion MP1. The D1-D2 plan is a plan of a region where interconnect layers 101 are provided. That is, the D1-D2 plan is a plan of the column portion MP1 and the branch portion MP2.

The column portion MP1 has, for example, a quadrangular prism shape whose upper face is substantially quadrangular. The shape of the upper face of the column portion MP1 is not limited to the quadrangle. For example, the shape of the upper face of the column portion MP1 may be polygonal or semicircular as long as one side is in contact with area AR2. For example, the column portion MP1 and the branch portion MP2 preferably have rounded corners opposite to area AR2 (away from area AR2). Thus, an electric field is prevented from being concentrated in a particular region (corner portion) of the memory cell transistor MC. A tunnel insulating film 127 is provided on the three side faces of the column portion MP1 that are not in contact with the insulating layer 121 in area AR2. Inside the column portion MP1, a semiconductor layer 128 is provided such that the side faces thereof are in contact with the three side faces of the tunnel insulating film 127 and the bottom face thereof is in contact with interconnect layer 102.

More specifically, for example, the semiconductor layer 128 includes a first portion 128a and a second portion 128b which extend in the Y direction, and a third portion 128c which extends in the X direction. The first portion 128a and the second portion 128b are in contact with area AR2 (insulating layer 121) at one end as viewed in the Y direction. The ends of the third portion 128c are in contact with the other end of the first portion 128a and the other end of the second portion 128b, respectively.

Inside the column portion MP1, a core layer 129 is provided such that a space surrounded by the semiconductor layer 128 and the insulating layer 121 in area AR2 is filled.

In the branch portion MP2, a charge storage layer 126 is provided in the same layer of each interconnect layer 101 in such a manner as to surround the three faces of the tunnel insulating film 127. That is, the charge storage layer 126 is provided between interconnect layer 101 and the tunnel insulating film 127. In addition, a block insulating film 125 is provided between interconnect layer 101 and the charge storage layer 126.

That is, the block insulating film 125, the charge storage layer 126 and the tunnel insulating film 127 have a similar shape to that of the semiconductor layer 128. The core layer 129 has, for example, a quadrangular prism shape whose one side face is in contact with area AR2 (insulating layer 121).

In the present embodiment, the relationship L1<L2 is satisfied, where L1 is the width (length) of the column portion MP1 as viewed in the X direction, and L2 is the width (length) of area AR2 as viewed in the Y direction. This relationship is attributable to the manufacturing method of the memory cell array 11. The manufacturing method of the memory cell array 11 will be described later.

It is preferable that the angle θ between the side face of the memory pillar MP facing the X direction and the side face of area AR2 facing the Y direction is approximately 90°. For example, if the etching amount varies when the semiconductor layer 128 is etched from area AR2, the side face of the memory pillar MP may be degenerated from the face where area AR2 and area AR4 are in contact to the inside of area AR4. If the angle θ is larger than 90°, length L1 decreases due to the degeneration, and the size of the memory cell transistor MC decreases. On the other hand, if the angle θ is smaller than 90°, a slit extending in the Z direction is formed when the memory pillar is filled with the core layer 129, resulting in a defective shape.

1.1.7 Configuration of Staircase Coupling Portion

Figure 8:
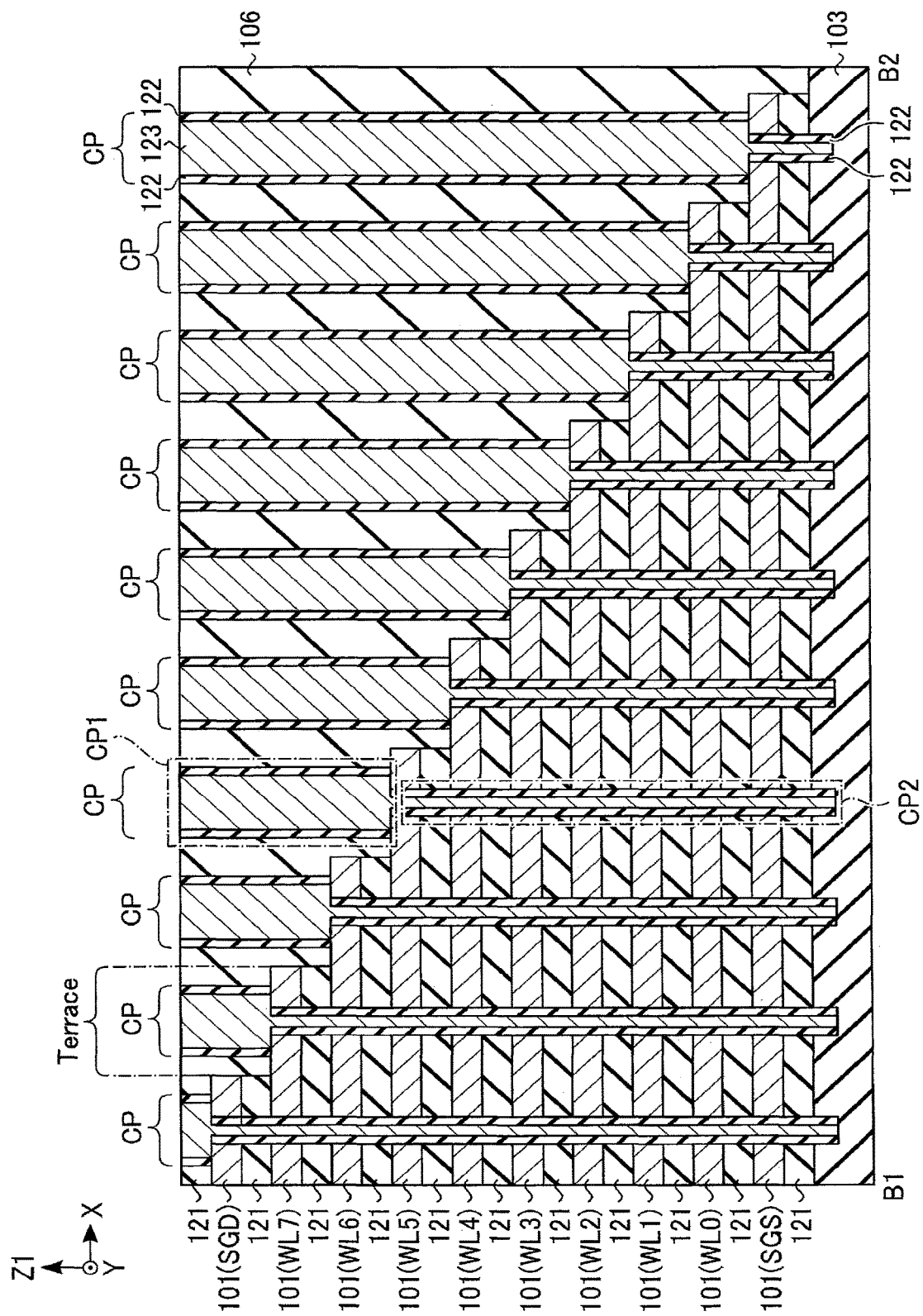
FIG. 8 is a cross-sectional view of a staircase coupling portion of the memory cell array provided in the semiconductor memory device according to the first embodiment.

Next, a configuration of the staircase coupling portion will be described with reference to FIG. 8. FIG. 8 is a cross-sectional view of the staircase coupling portion taken along line B1-B2 of FIG. 5.

As shown in FIG. 8, in the staircase coupling portion, a terrace for electrical coupling to contact plug CP is provided at the end of each interconnect layer 101 as viewed in the X direction.

The contact plug CP includes a first portion CP1 and a second portion CP2.

The first portion CP1 is provided on the terrace and extends in the Z1 direction. The first portion CP1 electrically couples the terrace (interconnect layer 101) and an interconnect layer (not shown) provided above the terrace. The first portion CP1 is provided on the terrace and has, for example, a substantially cylindrical shape. An insulating layer 122 is formed on the side face of the first portion CP1. The inside of the first portion CP1 is filled with a conductor 123 whose side face is in contact with the insulating layer 122 and whose bottom face is in contact with interconnect layer 101.

The second portion CP2 extends in the Z1 direction and penetrates the terrace and interconnect layers 101 and insulating layers 121 provided below the terrace. The upper face of the second portion CP2 is in contact with the first portion CP1, and the bottom face thereof reaches insulating layer 103. The second portion CP2 has, for example, a substantially cylindrical shape having an inner diameter smaller than that of the first portion CP1. An insulating layer 122 is formed on the side face of the second portion CP2. The inside of the second portion CP2 is filled with a conductor 123, as in the inside of the first portion CP1. The inside of the second portion CP2 may be filled with the insulating layer 122.

1.2 Manufacturing Method of Semiconductor Memory Device 1.2.1 Manufacturing Method of Memory Pillar Next, an example of a method of manufacturing the memory pillar MP will be described with reference to FIGS. 9 to 20. FIGS. 9 to 20 show a plan of the cell portion of the memory cell array 11 and a cross-sectional view taken along line A1-A2 (referred to as the A1-A2 section).

In the description below, reference will be made to the case where wet etching using a metal catalyst (MaCE: metal-assisted chemical etching) is adopted for etching the memory pillar MP and areas AR1, AR2 and AR4. For example, in MaCE, when wet etching of a semiconductor is performed with a metal serving as a catalyst being formed on the semiconductor, the semiconductor is preferentially etched at the interface between the semiconductor and the metal catalyst layer. Since the catalyst layer settles in the etched semiconductor, anisotropic etching is enabled.

As the catalyst layer, for example, a material having a relatively high redox potential is used, such as gold (Au), platinum (Pt), silver (Ag) or palladium (Pd). The catalytic metal can be formed, for example, by sputtering, CVD, plating, or the like. The catalyst metal is not limited to a single composition or a single layer but may be a composition containing a plurality of elements or a multiple layer. As the catalyst layer, a carbon material such as graphene may be used, or a metal containing graphene or the like may be used. In the description below, reference will be made to the case where Au is used as a catalyst layer.

In the present embodiment, a mixed solution of hydrofluoric acid (HF) and hydrogen peroxide ($H_2O_2$) is used as a wet etching solution of a group IV semiconductor such as Si or Ge during the MaCE. In the method used, therefore, a structure corresponding to insulating layers 121 between interconnect layers 101 (polysilicon) is first formed with sacrificial layers 131, and then the sacrificial layers 131 are replaced with the insulating layers 121.

Two kinds of semiconductor material layers enabling MaCE are used as the sacrificial layers 131 and interconnect layers 101. The semiconductor materials can be selected, for example, from group IV elements such as Si, Ge or C. The semiconductor materials may be, for example, two kinds of Si that have different impurity species and impurity concentrations by including a group III element such as B or Al or a group V element such as P or As as impurities. These two kinds of materials include: group III-V semiconductor materials such as GaAs, AlAs, AlGaAs, InP, InAs InGaAs, GaN, InN, InGaN, GaAlN, AlN, BN and AlBN; group II-VI semiconductor materials such as ZnO and ZnS; or InGaZnO which is a mixture of the above materials. In the description below, reference will be made to the case where Si is used as interconnect layers 101 and SiGe is used as the sacrificial layers 131. If the concentration of Ge in SiGe is low, proper etching selectivity is not provided with respect to interconnect layers 101 using polysilicon when the sacrifice layers (SiGe) 131 are removed in the replacement. On the other hand, if the concentration of Ge in SiGe is high, side etching (spreading in the XY plane) of the SiGe layer is likely to occur during MaCE. For this reason, the concentration of Ge in SiGe is preferably 10 to 20%.

Figure 9:
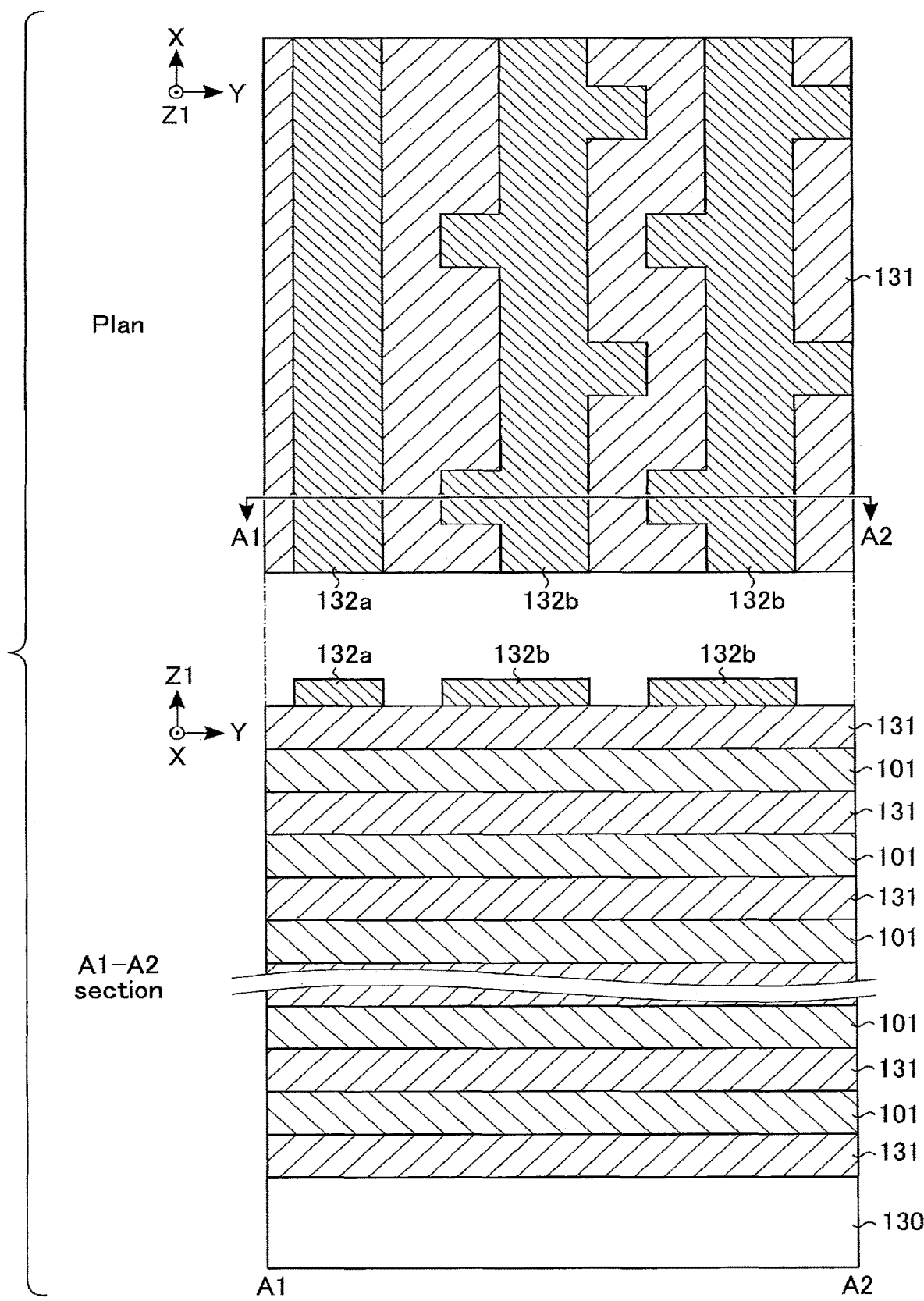

As shown in FIG. 9, for example, eleven sacrificial layers 131 and ten interconnect layers 101 are alternately stacked on a semiconductor substrate 130. The sacrificial layers 131 are formed of SiGe, for example.

Next, on the uppermost sacrificial layer 131, catalyst layer 132a corresponding to area AR1 and catalyst layers 132b corresponding to area AR2 and the column portion MP1 of the memory pillar MP (area AR4 described later) are formed. Each of catalyst layers 132b includes a line portion corresponding to area AR2 and extending in the X direction, and a protrusion portion corresponding to the column portion MP1 and protruding in the Y direction. Catalyst layers 132a and 132b are formed of a material that acts as a catalyst during MaCE; they are made of Au, for example.

A catalyst layer (not shown) corresponding to area AR2b is formed in the staircase coupling portion.

Figure 10:
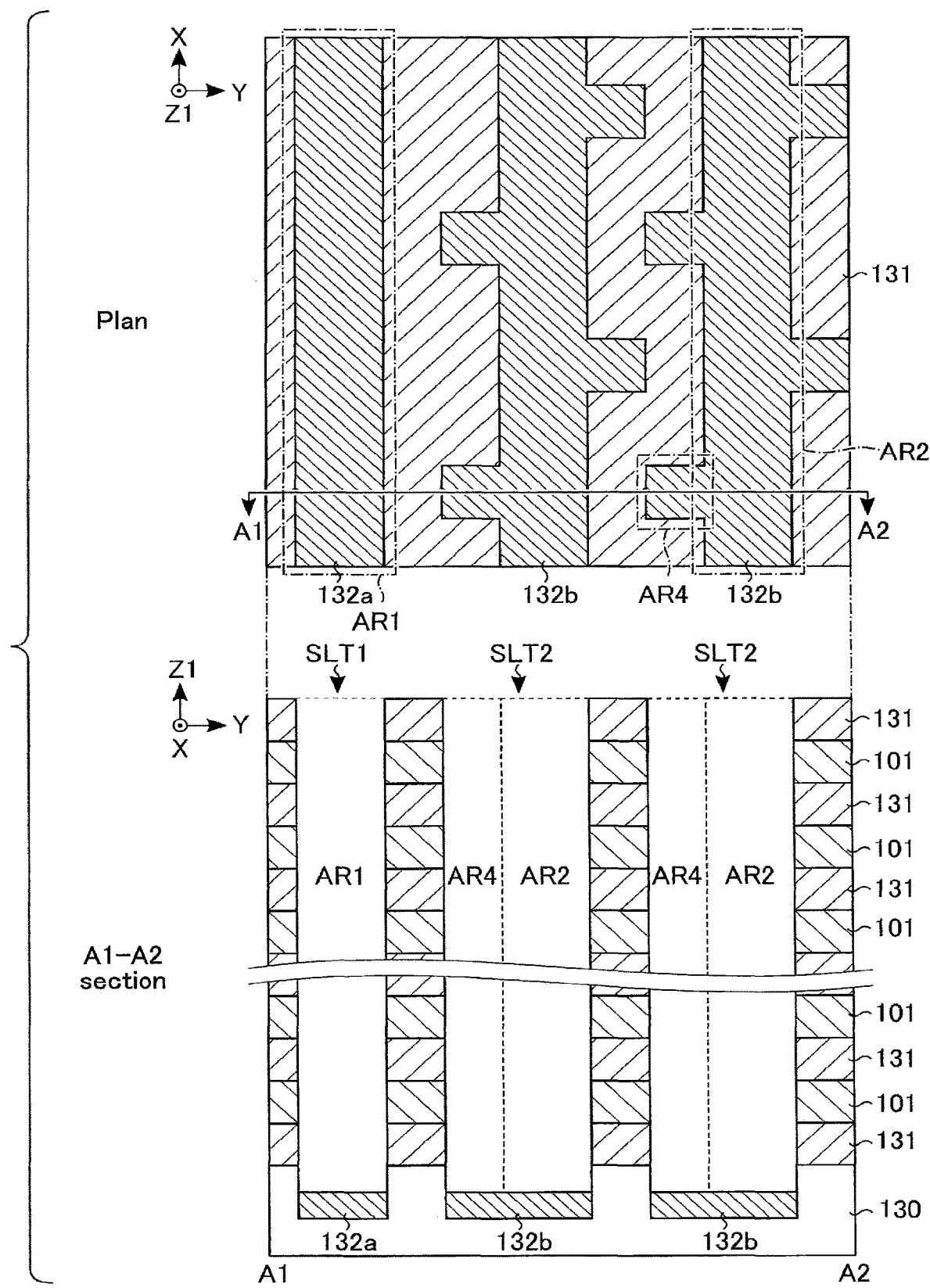

As shown in FIG. 10, interconnect layers 101 and sacrificial layers 131 are etched by MaCE to form a slit SLT1 corresponding to catalyst layer 132a and slits SLT2 corresponding to catalyst layers 132b. The bottoms of slits SLT1 and SLT2 reach the semiconductor substrate 130. Catalyst layers 132a and 132b remain on the bottom faces of slits SLT1 and SLT2. Slit SLT1 corresponds to area AR1. Each slit SLT2 includes area AR2, and area AR4 corresponding to the column portion MP1. It should be noted that the height positions of the bottoms of slits SLT1 and SLT2 may vary as long as they are within the semiconductor substrate 130.

More specifically, in the MaCE process, the wafer on which a stacked body of the semiconductor materials (interconnect layers 101 and sacrificial layers 131) and the catalyst layers (132a and 132b) are formed is immersed in a first chemical solution (etching solution). The first chemical liquid is, for example, a mixed liquid of hydrofluoric acid and hydrogen peroxide water. When the wafer is immersed in the first chemical solution, the semiconductor layer surface (for example, silicon) is dissolved in the etching solution at the interfaces between the semiconductor layer surface, the catalyst layer and the first chemical solution. With this reaction repeated in the surface of the stacked body, the stacked semiconductor layers are etched vertically. As a result, areas AR1, AR2 and AR4 are formed. The shapes of areas AR1, AR2 and AR4 (for example, the depths of trenches) are controlled by adjusting the sizes of the catalyst layers 132a and 132b, etching times, etc.

Figure 11:
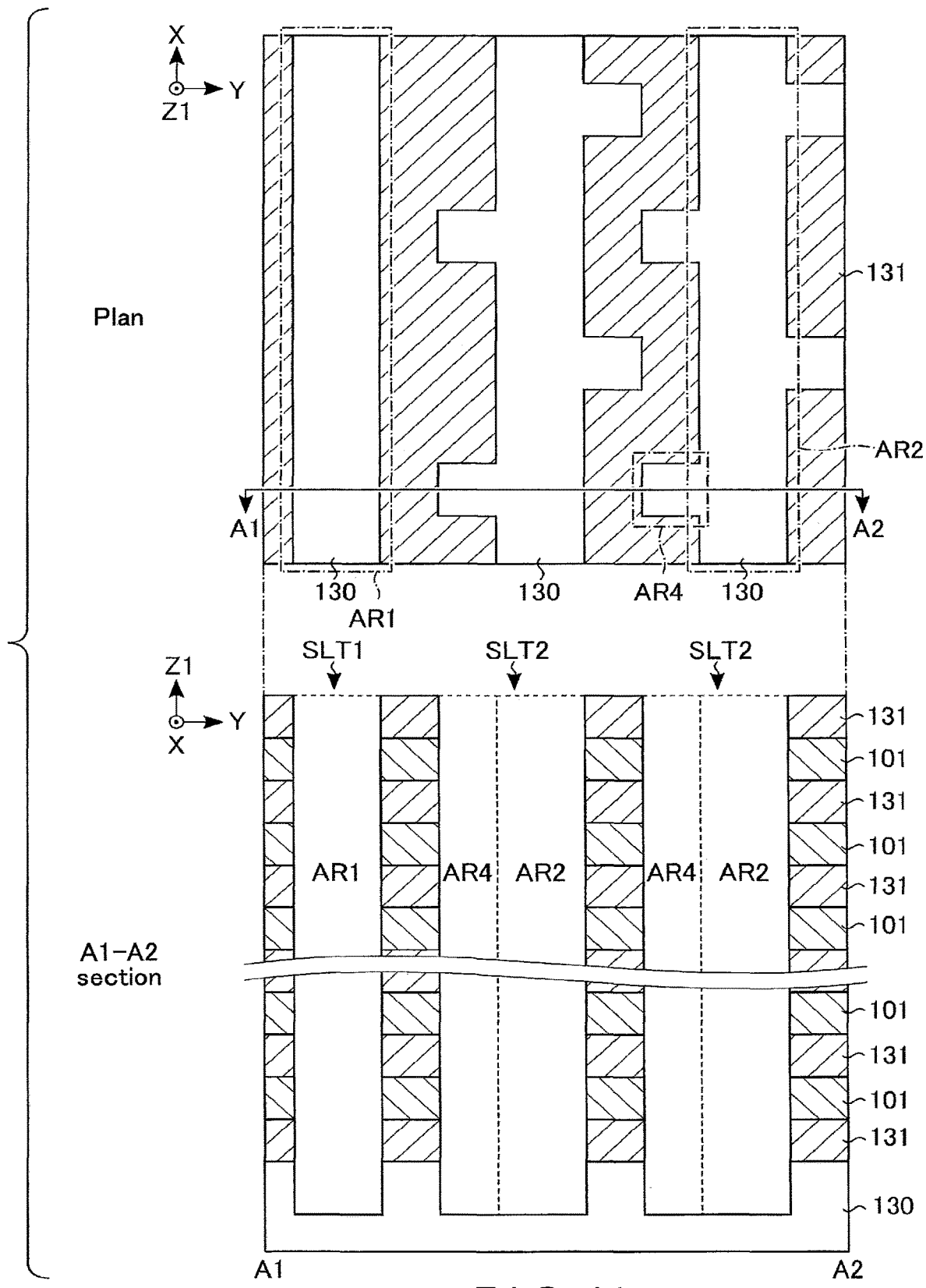

As shown in FIG. 11, in the catalyst layer removing step, the catalyst layers are removed by immersing the wafer in a second chemical solution. More specifically, catalyst layers 132a and 132b are removed by wet etching using a second chemical solution that contains, for example, aqua regia, iodine-based solution, or cyan-based solution.

As shown in FIG. 12, an insulating layer 133 having a film thickness that fills areas AR4 and does not fill slit SLT1 and areas AR2 of slits SLT2 is formed. In order to fill areas AR4 (column portion MP1) and not to fill areas AR2, areas AR4 (column portion MP1) and areas AR2 have the relationship L1<L2 described in connection with FIG. 7. That is, the thickness of the insulating layer 133 is more than length (L1)/2 and less than length (L2)/2. The insulating layer 133 is formed of silicon nitride (SiN), for example.

Figure 13:
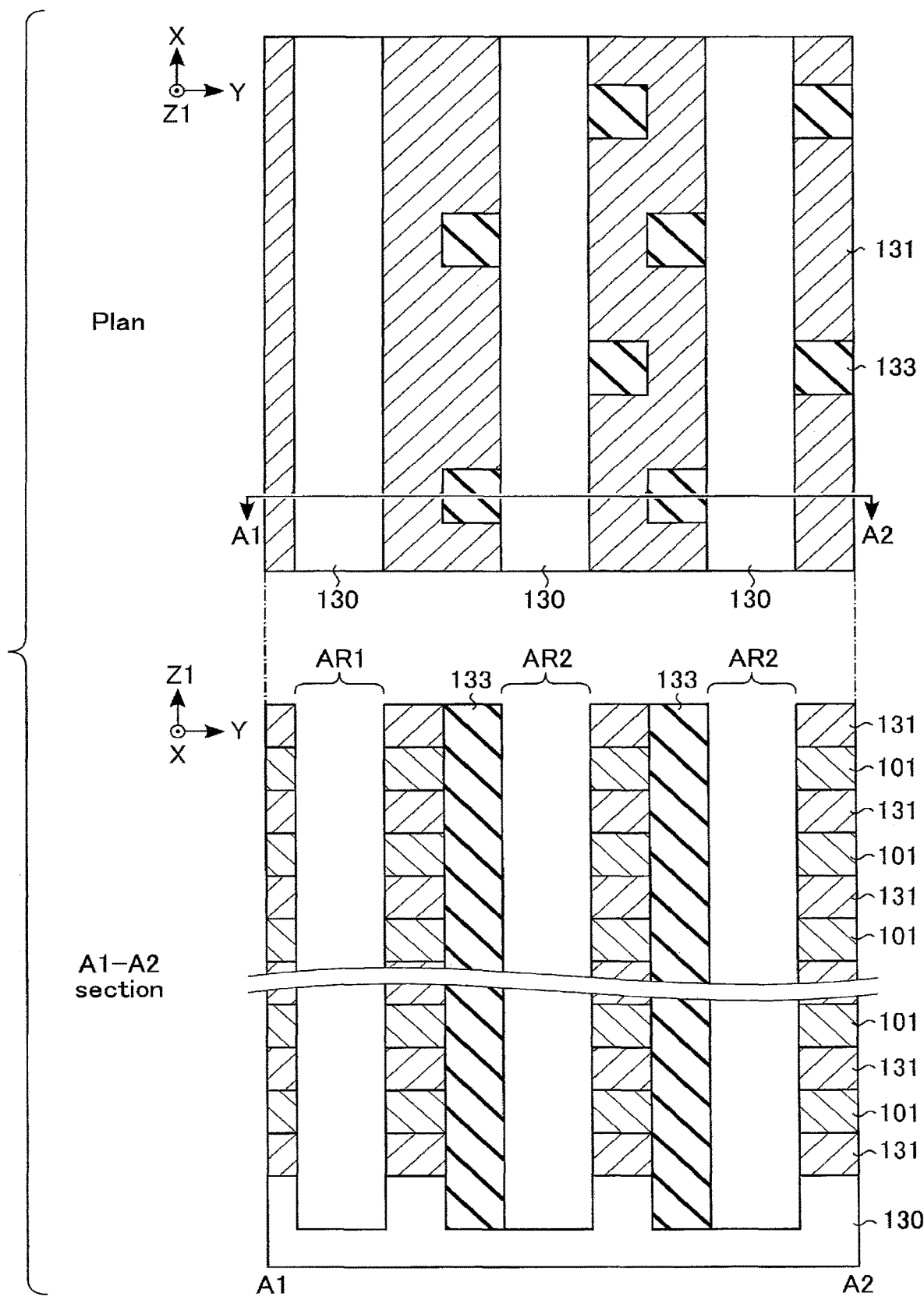

As shown in FIG. 13, the insulating layer 133 in area AR1 and areas AR2 is removed, for example, by isotropic etching based on wet etching. At this time, areas AR4 are filled with the insulating layer 133.

Figure 14:
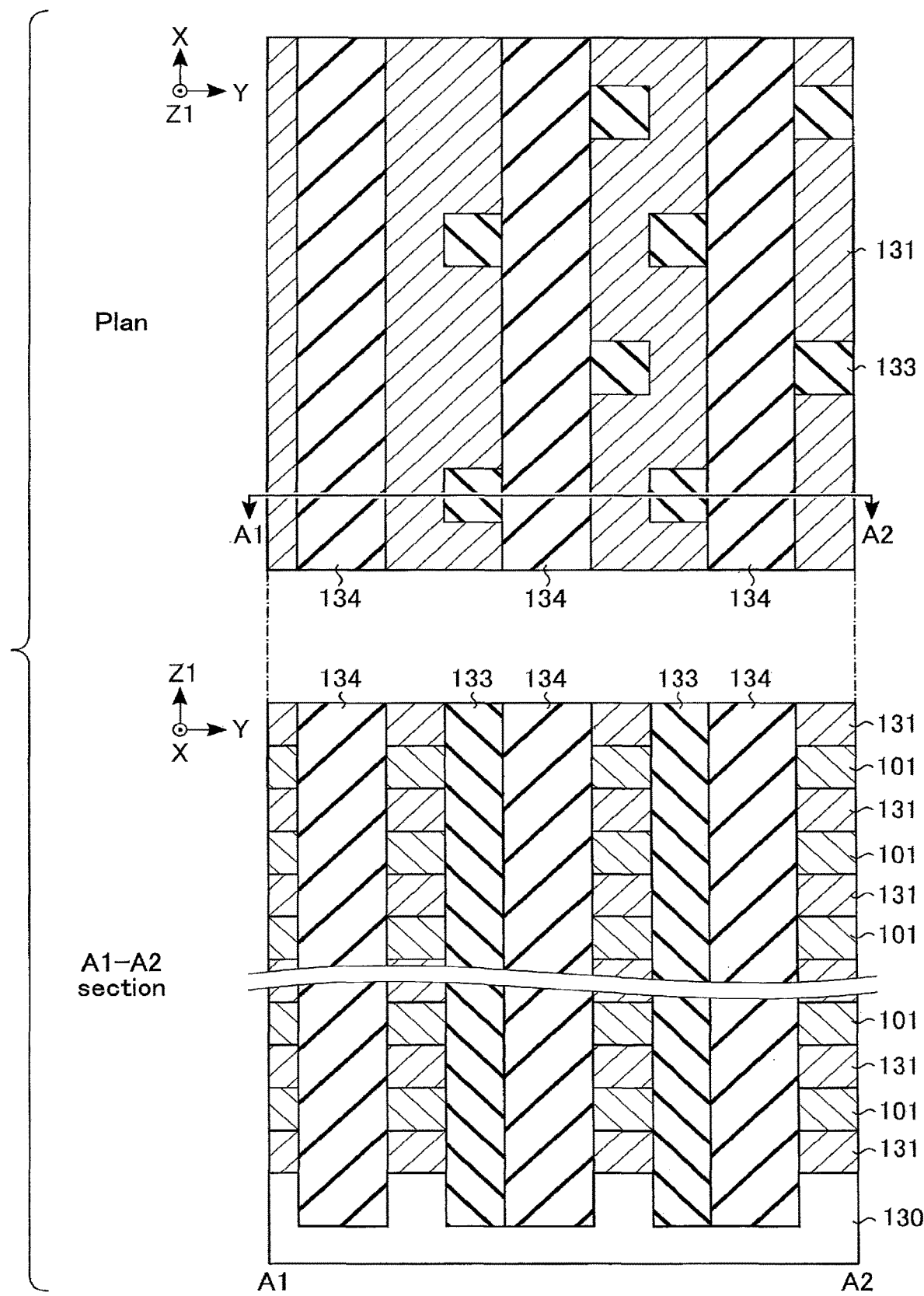

As shown in FIG. 14, area AR1 and areas AR2 are filled with an insulating layer 134, and then the insulating layer 134 on the uppermost sacrificial layer 131 is removed, for example, by CMP (chemical mechanical polishing). The insulating layer 134 is formed of $SiO_2$, for example.

Figure 15:
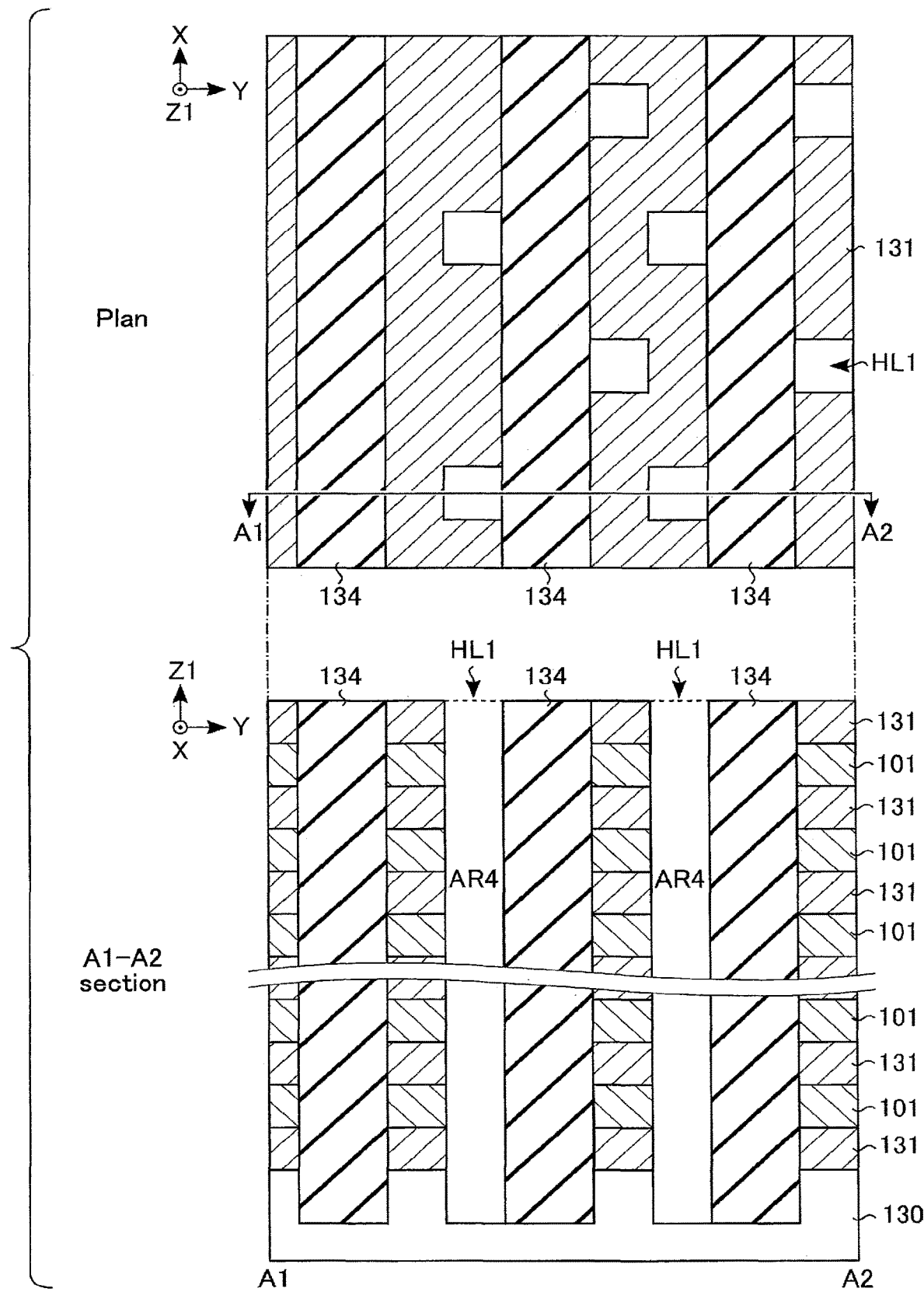

As shown in FIG. 15, the insulating layer 133 in areas AR4 is removed, for example, by wet etching, and holes HL1 are formed thereby.

Figure 16:
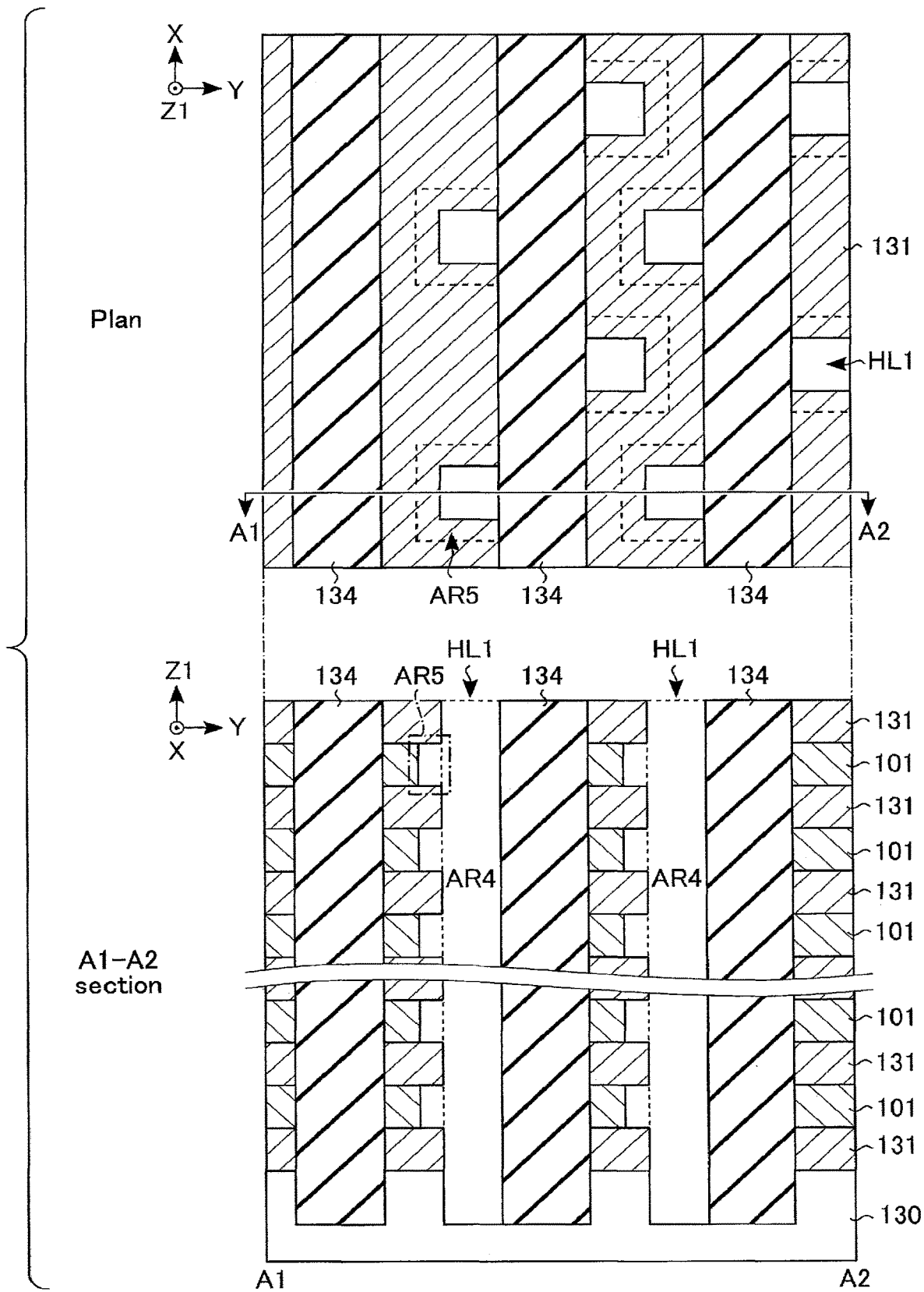

As shown in FIG. 16, interconnect layers 101 are etched from the side faces of the holes HL1 by wet etching to form areas AR5. Areas AR5 correspond to the branch portions MP2 of the memory pillar MP.

As shown in FIG. 17, the insulating layer 134 in areas ARI and AR2 is removed, for example, by wet etching.

Figure 18:
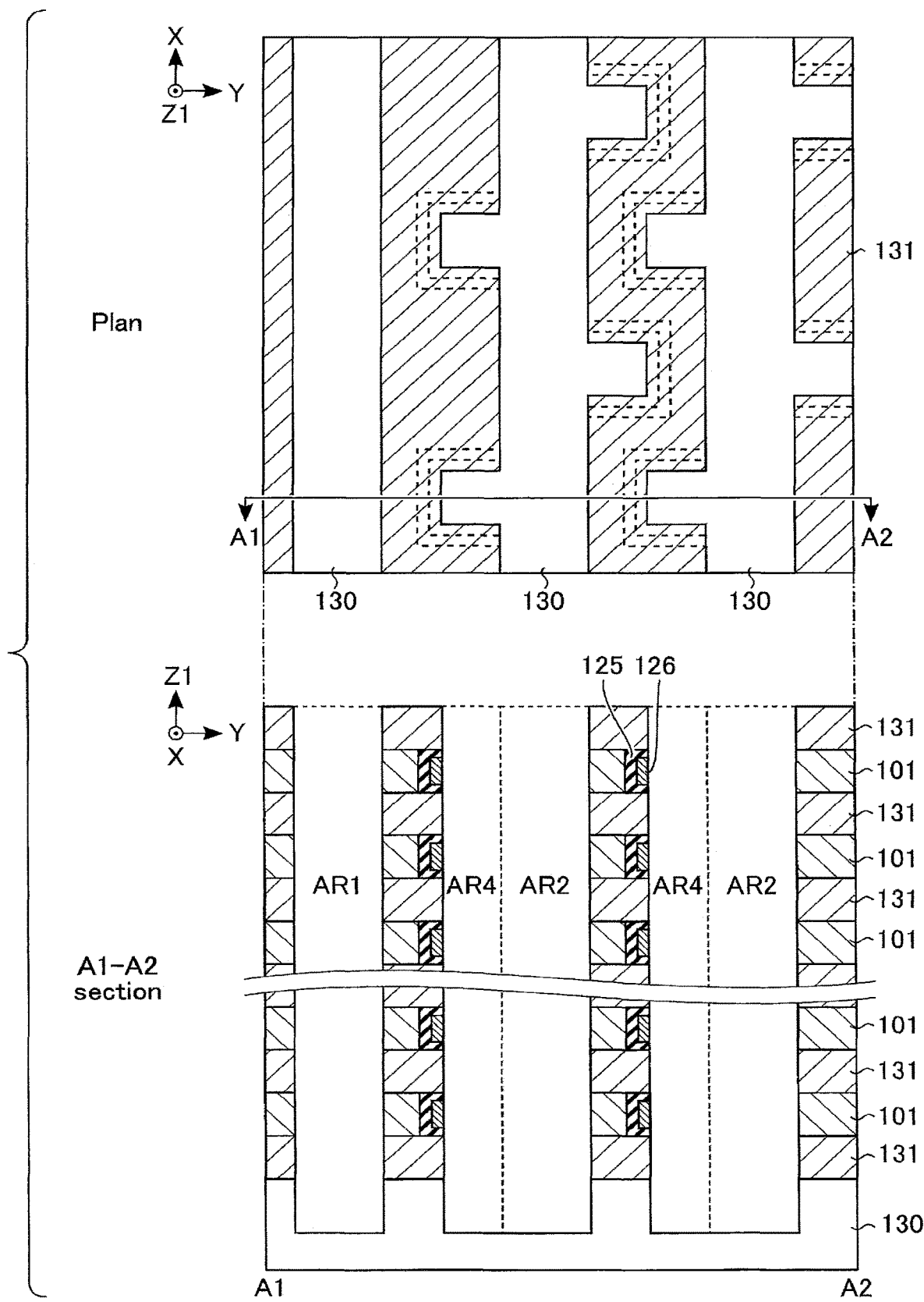

As shown in FIG. 18, a block insulating film 125 and a charge storage layer 126 are formed in each area AR5. More specifically, first, a block insulating film 125 having a thickness that does not fill each area AR5 is formed. Then, a charge storage layer 126 having a thickness that fills each area AR5 is formed. Next, the block insulating film 125 and the charge storage layer 126 formed outside areas AR5 are removed by wet etching, CDE (chemical dry etching), or the like. As a result, the block insulating film 125 and the charge storage layer 126 remain in each area AR5.

Figure 19:
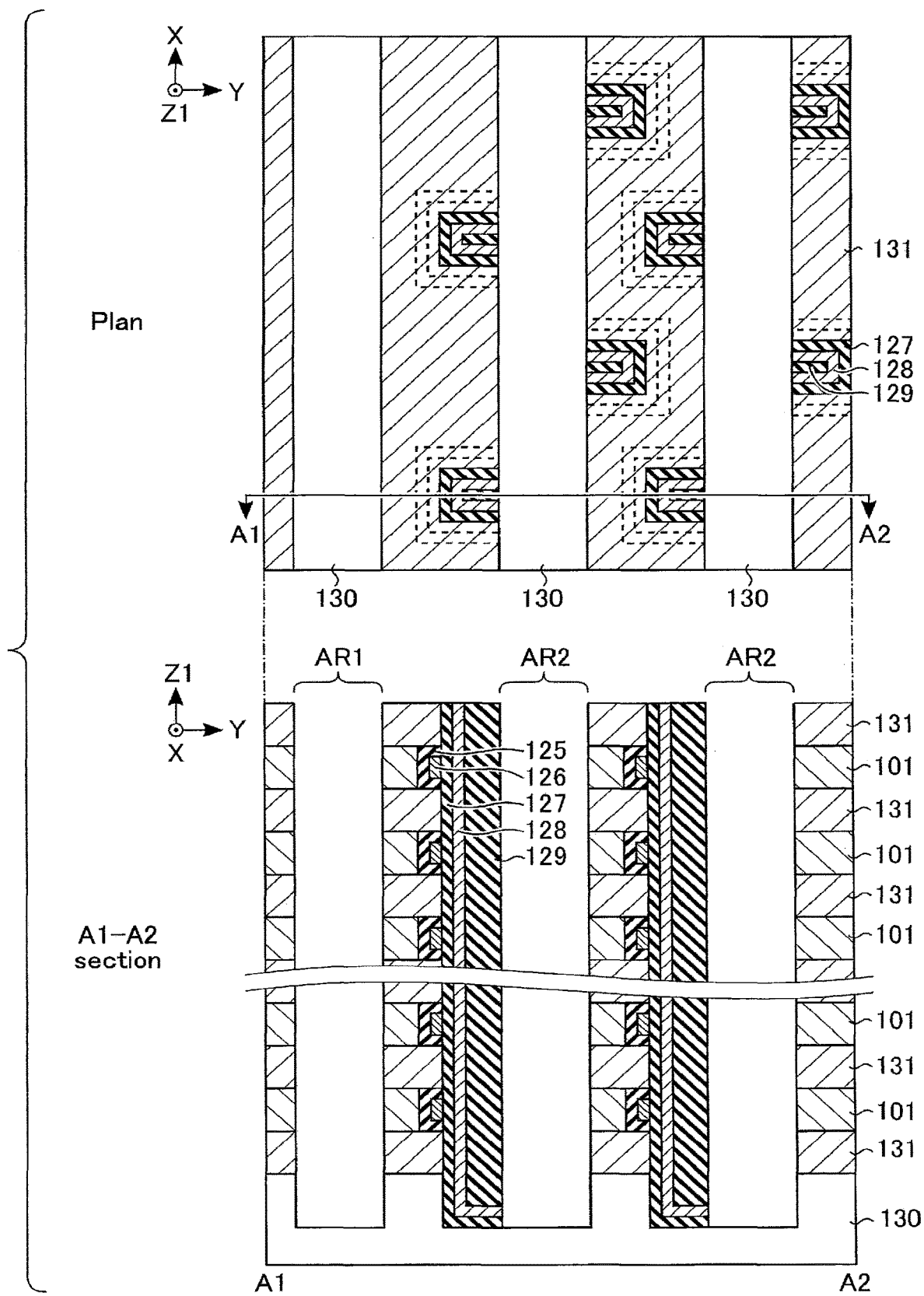

As shown in FIG. 19, a tunnel insulating film 127, a semiconductor layer 128, and a core layer 129 are formed in each area AR4. More specifically, first, a tunnel insulating film 127 and a semiconductor layer 128 having a thickness that does not fill area AR4 are stacked. Then, a core layer 129 having a thickness that fills area AR4 is formed. Next, the tunnel insulating film 127, the semiconductor layer 128, and the core layer 129 that are formed on the uppermost sacrificial layer 131 and in areas AR1 and AR2 are removed by wet etching or CDE. As a result, the tunnel insulating film 127, the semiconductor layer 128, and the core layer 129 remain in area AR4. Thereby, the memory pillar MP is formed.

Figure 20:
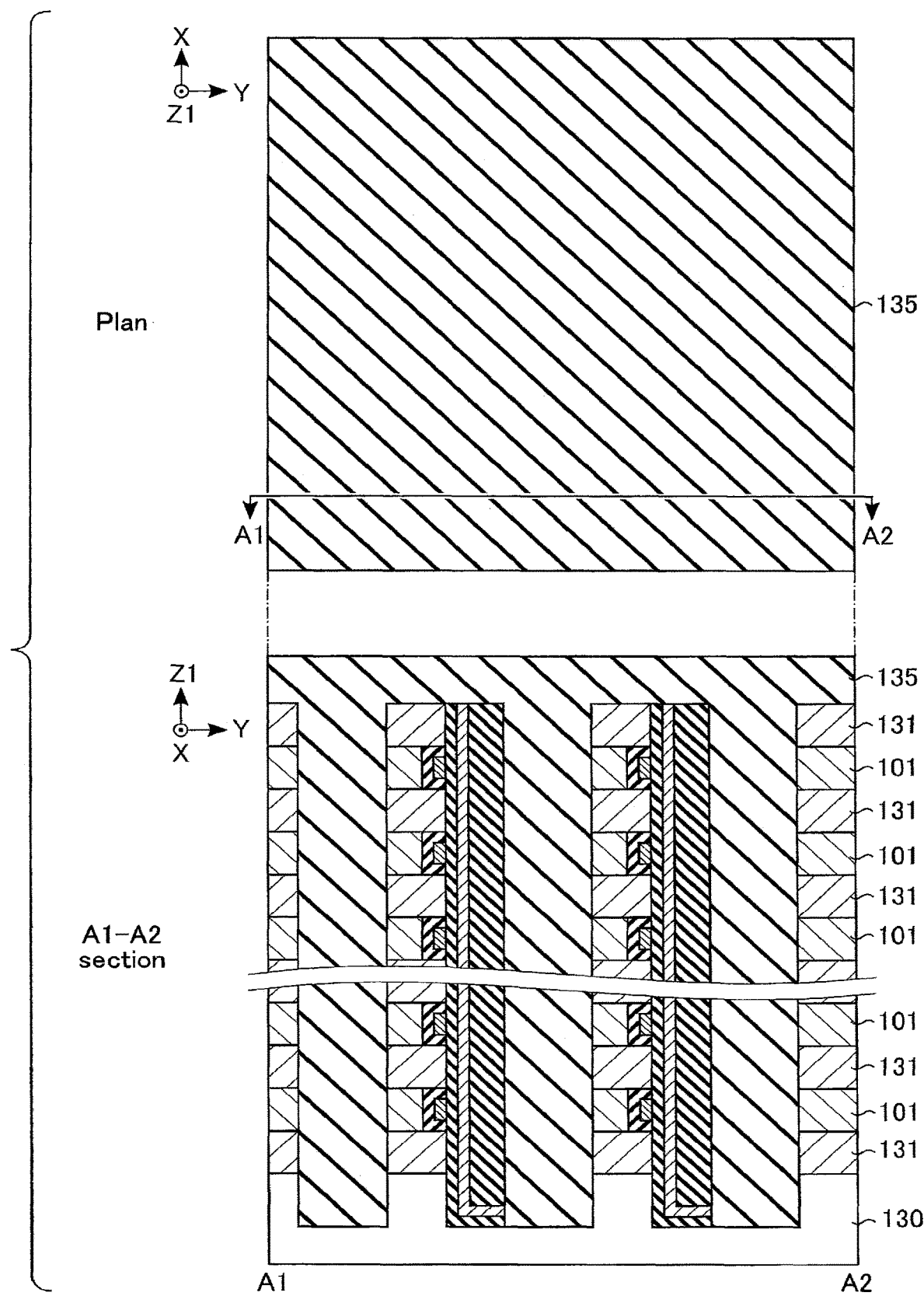

As shown in FIG. 20, an insulating layer 135 is formed in such a manner as to fill areas AR1 and AR2. The insulating layer 135 is formed of SiN, for example. It should be noted that air gaps may be formed in areas AR1 and AR2. In the staircase coupling portion, areas AR2b are filled with the insulating layer 135.

1.2.2 Manufacturing Method of Contact Plug CP

Next, an example of a method of manufacturing contact plug CP will be described with reference to FIGS. 21 to 30. FIGS. 21 to 30 show a plan of the staircase coupling portion of the memory cell array 11 and a cross-sectional view taken along line B1-B2 (referred to as the B1-B2 section).

In the description below, reference will be made to the case where MaCE is used for etching the contact plug CP and area AR3. Needless to say, the method of forming the contact plug CP is not limited to this. For example, the contact plug CP may be formed by dry etching. In this case, the second portion CP2 of the contact plug CP and area AR3 are not used.

Figure 21:
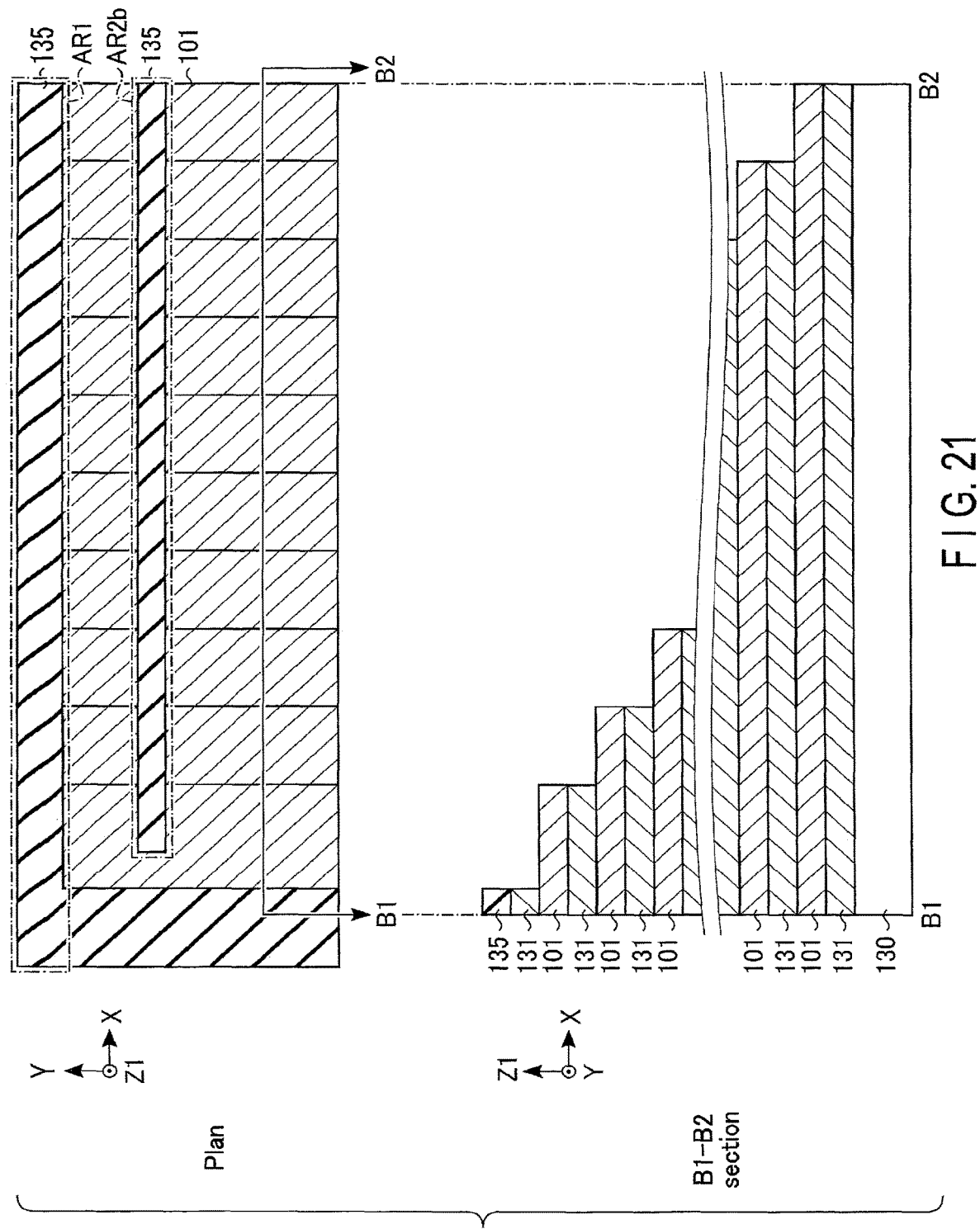
FIG. 21 to FIG. 30 are diagrams of the staircase coupling portion of the memory cell array and illustrate the manufacturing process of the semiconductor memory device according to the first embodiment.

As shown in FIG. 21, after the formation of the memory pillar MP, a terrace corresponding to each interconnect layer 101 is formed. More specifically, for example, the insulating layer 135 and uppermost sacrificial layer 131 in the region corresponding to the terrace of each interconnect layer 101 are removed to expose the uppermost interconnect layer 101. At this time, the insulating layer 135 provided on the cell portion and areas AR1 and AR2b is not removed. Next, a mask is formed such that a region corresponding to the terrace of the lowermost interconnect layer 101 (select gate line SGS) is exposed. A resist may be used for forming the mask, as long as the etching selectivity with respect to the interconnect layers 101, sacrificial layers 131 and insulating layer 135 can be obtained. Next, the interconnect layers 101 and the sacrificial layers 131 are removed one by one. Next, the mask is etched such that a region corresponding to the terrace of the second interconnect layer 101 (word line WL0) from the bottom is exposed. As a result, the region corresponding to the terrace of the lowermost layer and the region corresponding to the terrace of the second interconnect layer 101 from the bottom are exposed. Next, interconnect layers 101 and the sacrificial layers 131 are removed one by one. As a result, two layers consisting of interconnect layer 101 and sacrificial layer 131 are removed from above the terrace of the lowermost interconnect layer 101. By repeating the above process, terraces arranged in a staircase manner are formed.

Figure 22:
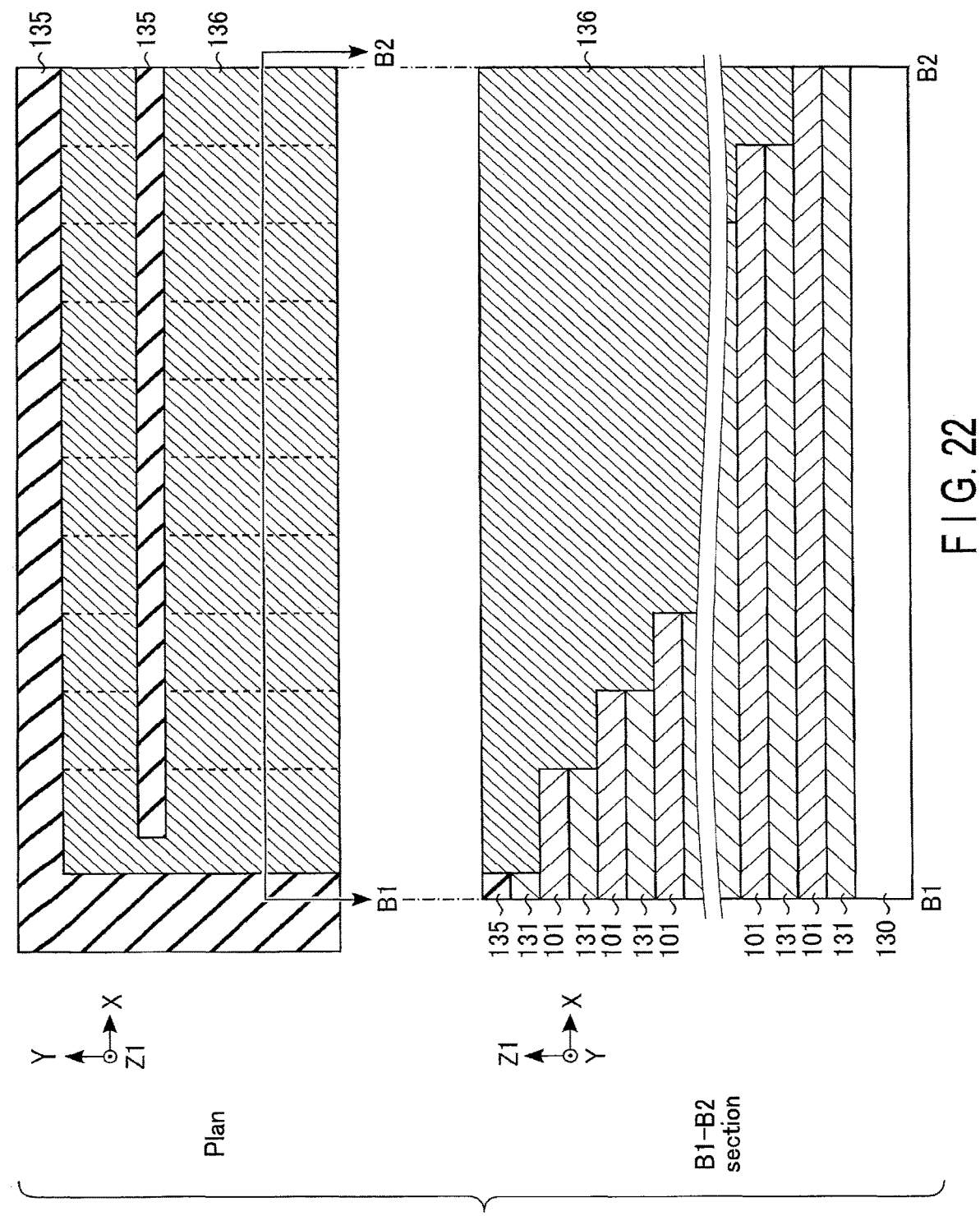

As shown in FIG. 22, the regions where the terraces are formed are filled with a semiconductor layer 136. Next, the surface of the resultant structure is made flat by CMP, for example. The semiconductor layer 136 is formed of, for example, SiGe having a Ge concentration higher than that of the sacrificial layers 131 (SiGe). The Ge concentration of the semiconductor layer 136 (SiGe) is preferably 20% or more. Where SiGe having a high Ge concentration is used, the semiconductor layer 136 is etched by MaCE such that the semiconductor layer 136 spreads slightly in the lateral direction (XY plane) with respect to the area of the catalyst metal.

Figure 23:
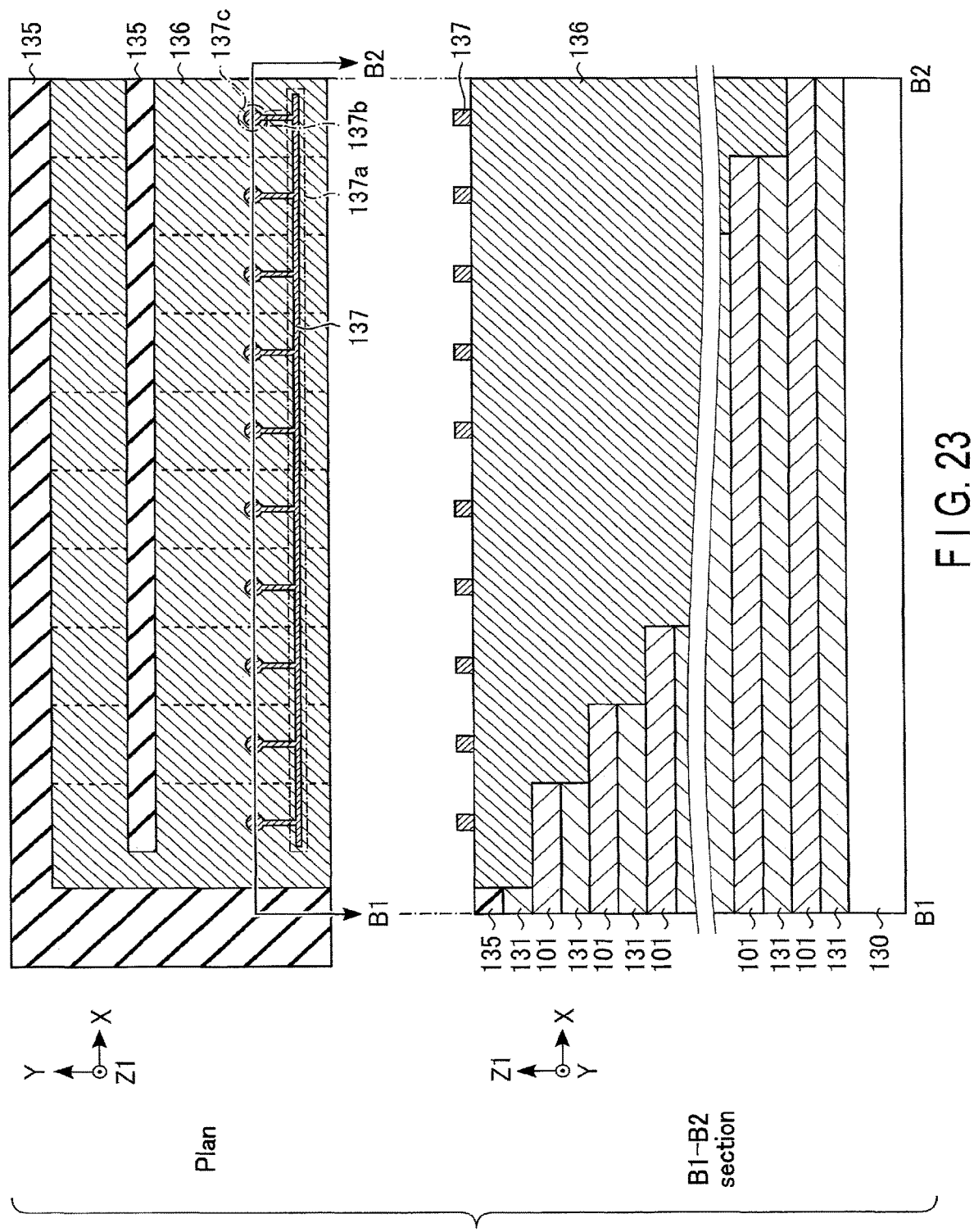

As shown in FIG. 23, a. catalyst layer 137 corresponding to area AR3 and contact plug CP is formed on the semiconductor layer 136. The catalyst layer 137 includes a line-shaped portion 137a corresponding to area AR3 and a circular portion 137b corresponding to the contact plug CP. The catalyst layer 137 is formed of a metal that acts as a catalyst during MaCE; it is formed of Au, for example.

Figure 24:
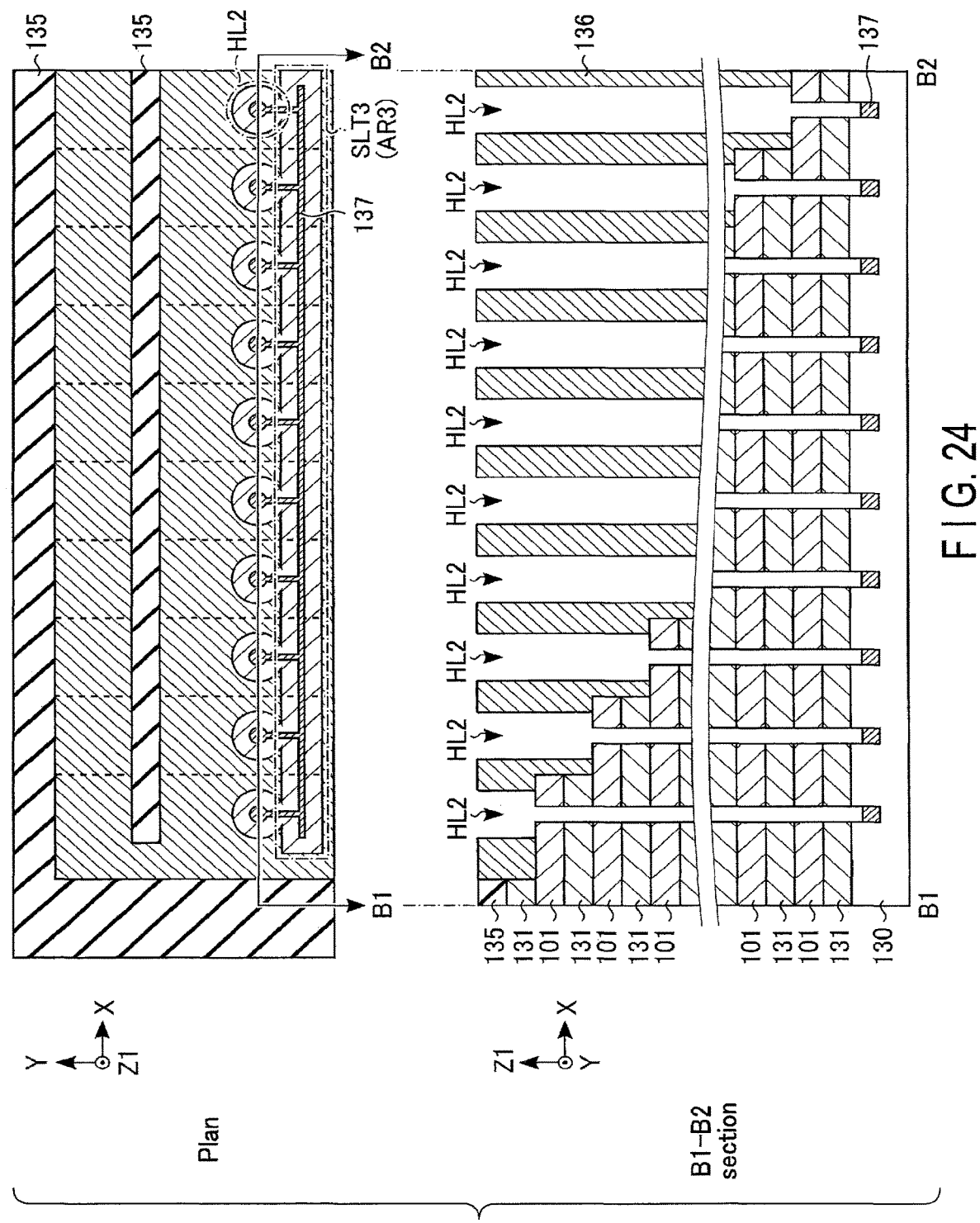

As shown in FIG. 24, semiconductor layer 136, interconnect layer 101 and sacrificial layer 131 are etched by MaCE. As a result, a slit SLT3 corresponding to area AR3 and a hole HL2 corresponding to the contact plug CP are formed. The bottom of the slit SLT3 corresponding to area AR3 and the bottom of the hole HL2 reach the semiconductor substrate 130. The catalyst layer 137 remains on the bottom faces of the slit SLT3 corresponding to area AR3 and the hole HL2. The semiconductor layer 136 is etched such that it spreads in the lateral direction (XY plane) with respect to the catalyst layer 137. Thus, the slit SLT3 and hole HL2 in the semiconductor layer 136 (that is, on the terrace) may be overlapped with each other. Further, the inner diameter of the hole HL2 in the semiconductor layer 136 (on the terrace) is larger than the inner diameter of the hole HL2 in interconnect layer 101 and sacrificial layer 131 below the terrace. Similarly, the width of the slit SLT3 as viewed in the X direction and the Y direction in the semiconductor layer 136 (on the terrace) is larger than the width of the slit SLT3 in interconnect layer 101 and sacrifice layer 131 below the terrace.

Figure 25:
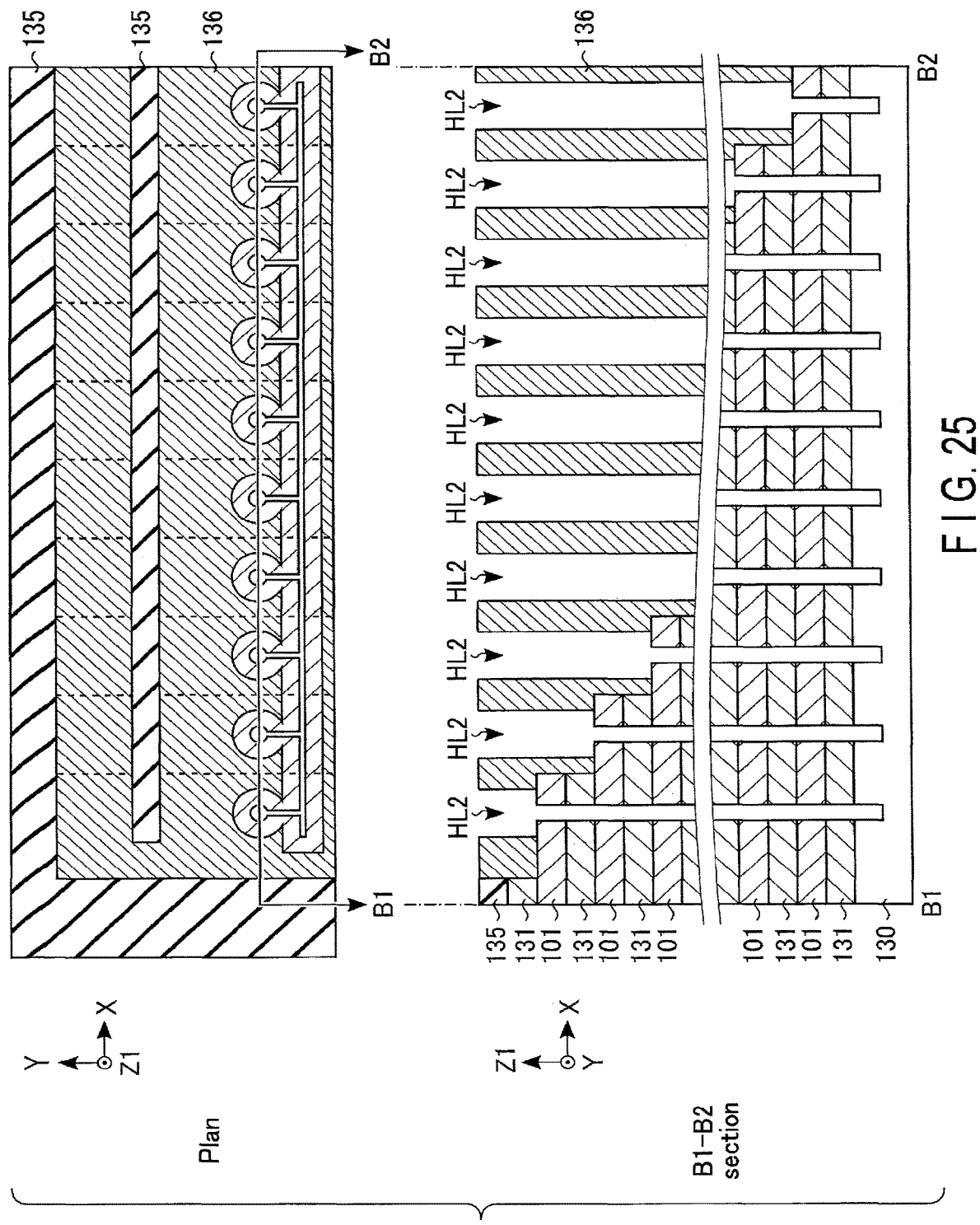

As shown in FIG. 25, the catalyst layer 137 is removed by wet etching using, for example, aqua regia, an iodine-based solution, or a cyan-based solution.

Figure 26:
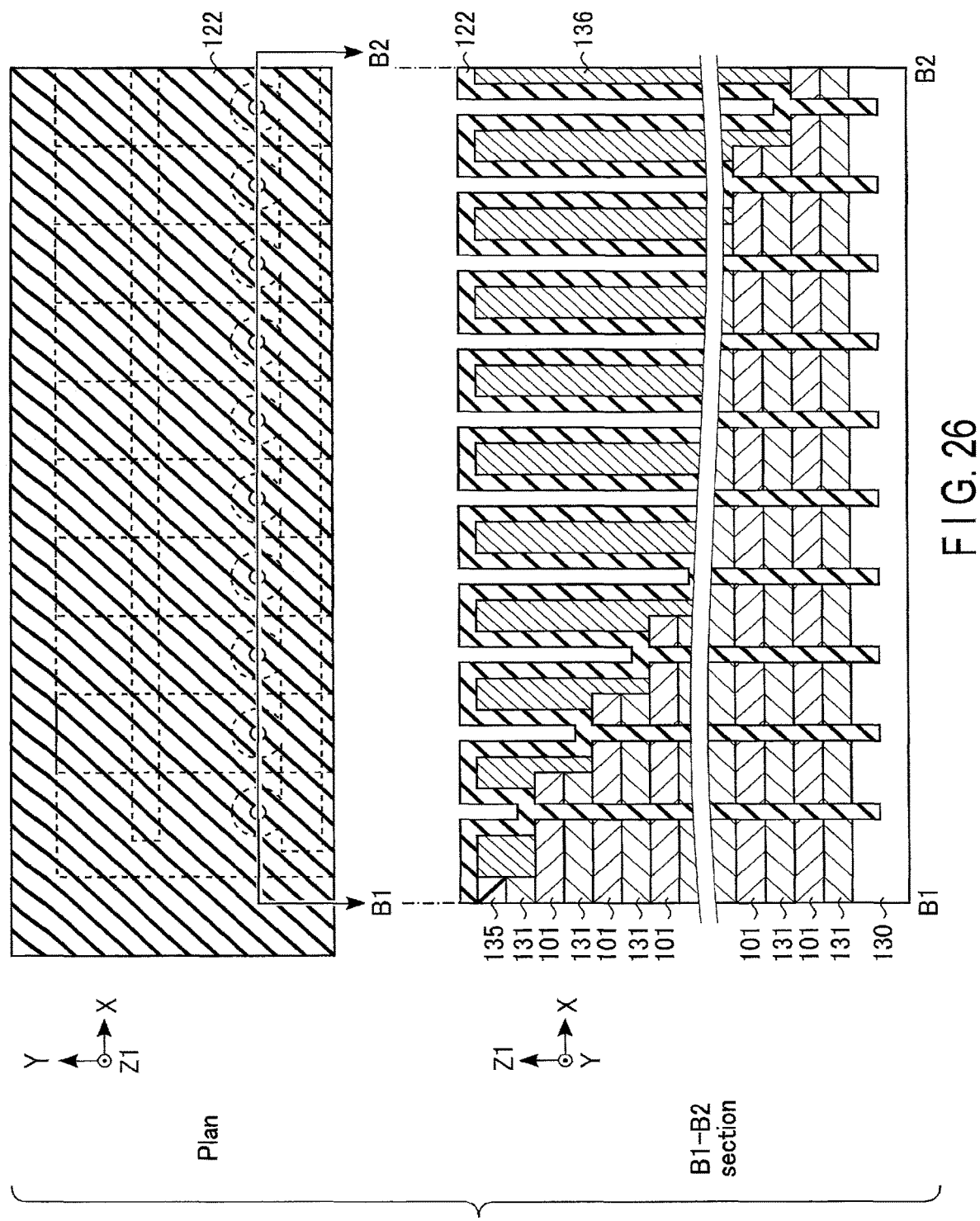

As shown in FIG. 26, an insulating layer 122 having a film thickness that fills the hole HL2 in interconnect layer 101 and sacrificial layer 131 corresponding to area AR3 of the slit SLT3 and the second portion CP2 of the contact plug CP and that does not fill the hole HL2 in the semiconductor layer 136 (on the terrace) corresponding to the first portion CP1 of the contact plug CP is formed. In order not to fill the hole HL2 in the semiconductor layer 136 (on the terrace), the inner diameter of the hole HL2 (that is, the contact plug CP) is larger than the width of the slit SLT3 as viewed in the Y direction (that is, area AR3).

Figure 27:
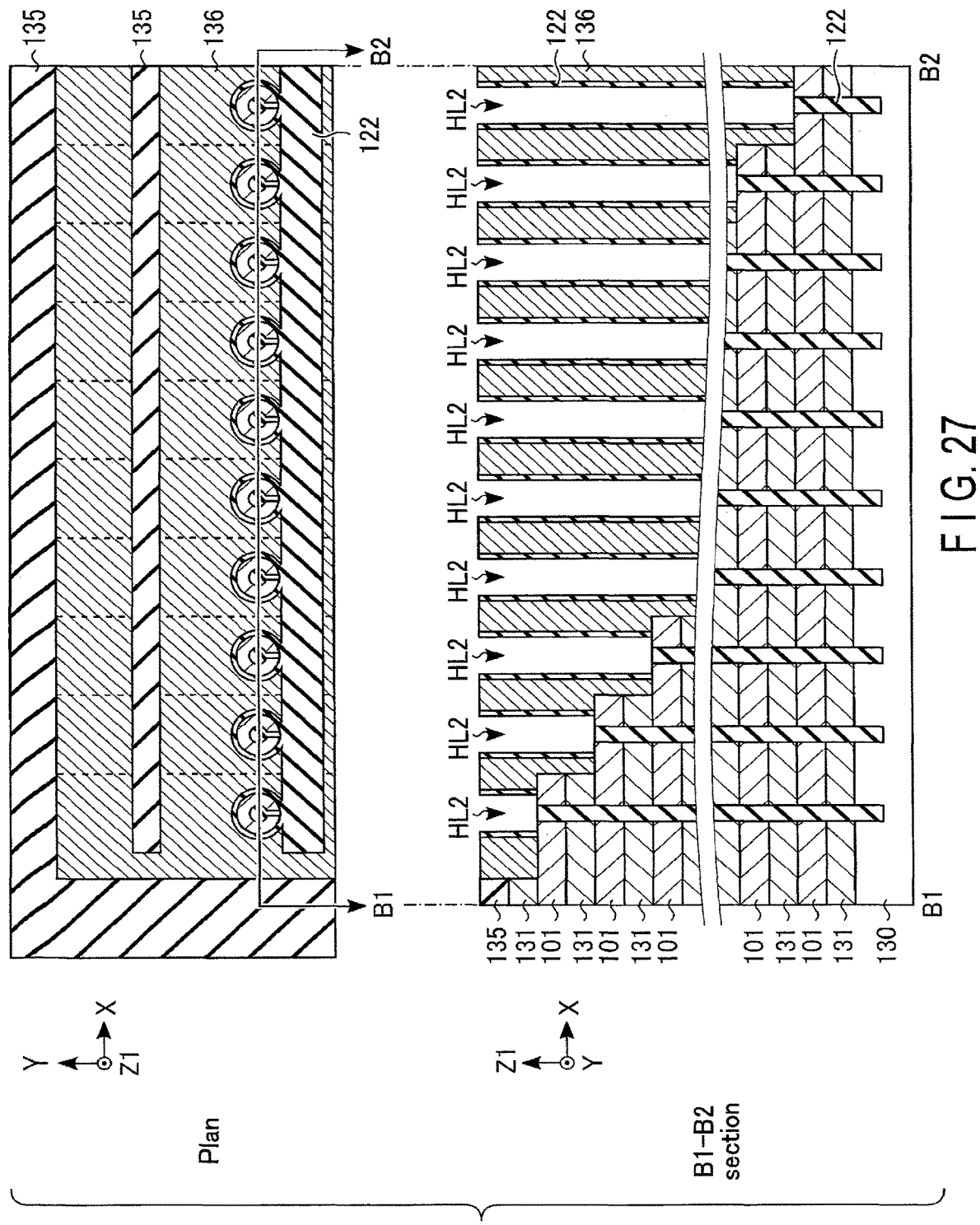

As shown in FIG. 27, the insulating layer 122 is etched, for example, by RIE (reactive ion etching) such that the semiconductor layer 136 and the insulating layer 122 on the terrace are removed and the insulating layer 122 remains on the side face of the hole HL2 above the terrace.

Figure 28:
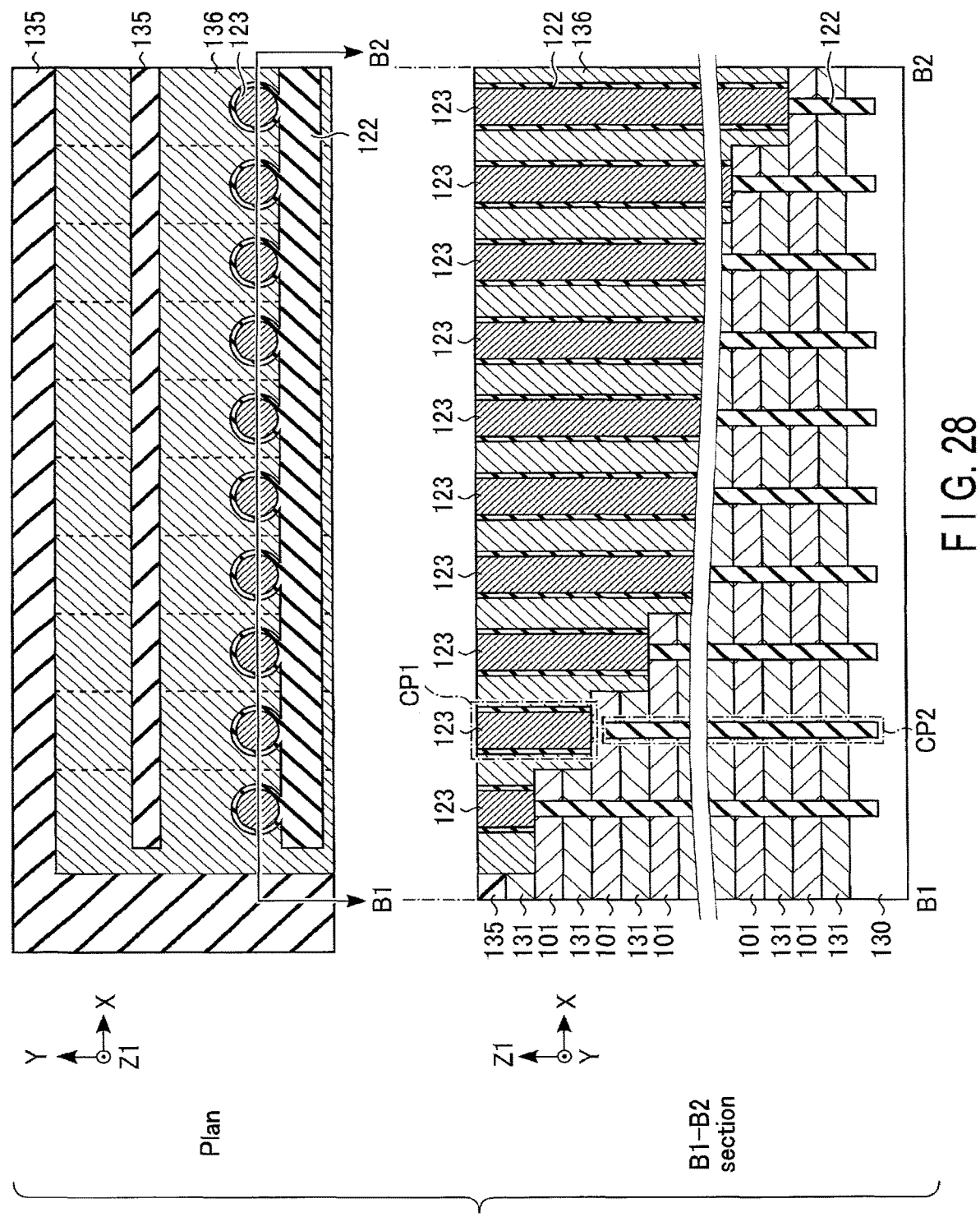

As shown in FIG. 28, a conductor 123 is formed to fill the first portion CP1 of the contact plug CP. More specifically, TiN is first formed, for example, by CVD. Next, W is formed by CVD, and the first portion CP1 is filled. Then, TiN and W on the semiconductor layer 136 are removed by CMP.

Figure 29:
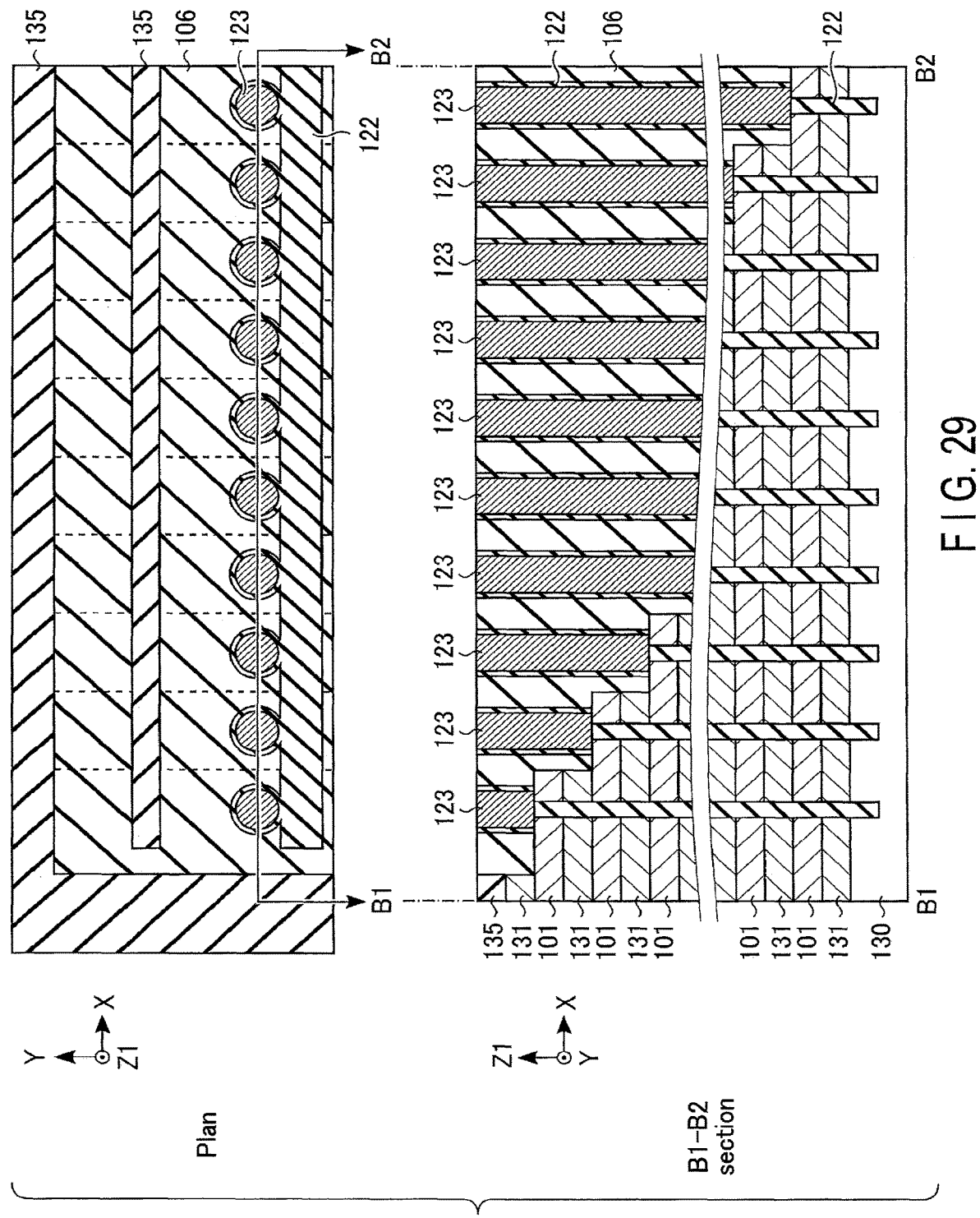

As shown in FIG. 29, the semiconductor layer 136 is removed, for example, by wet etching using HF and nitric acid ($HNO_3$) or dry etching using a high-temperature gas of hydrochloric acid (HCl). Next, insulating layer 106 is formed such that the region where the semiconductor layer 136 is removed is filled. Then, the surface is planarized by CMP such that insulating layer 135 is exposed.

Figure 30:
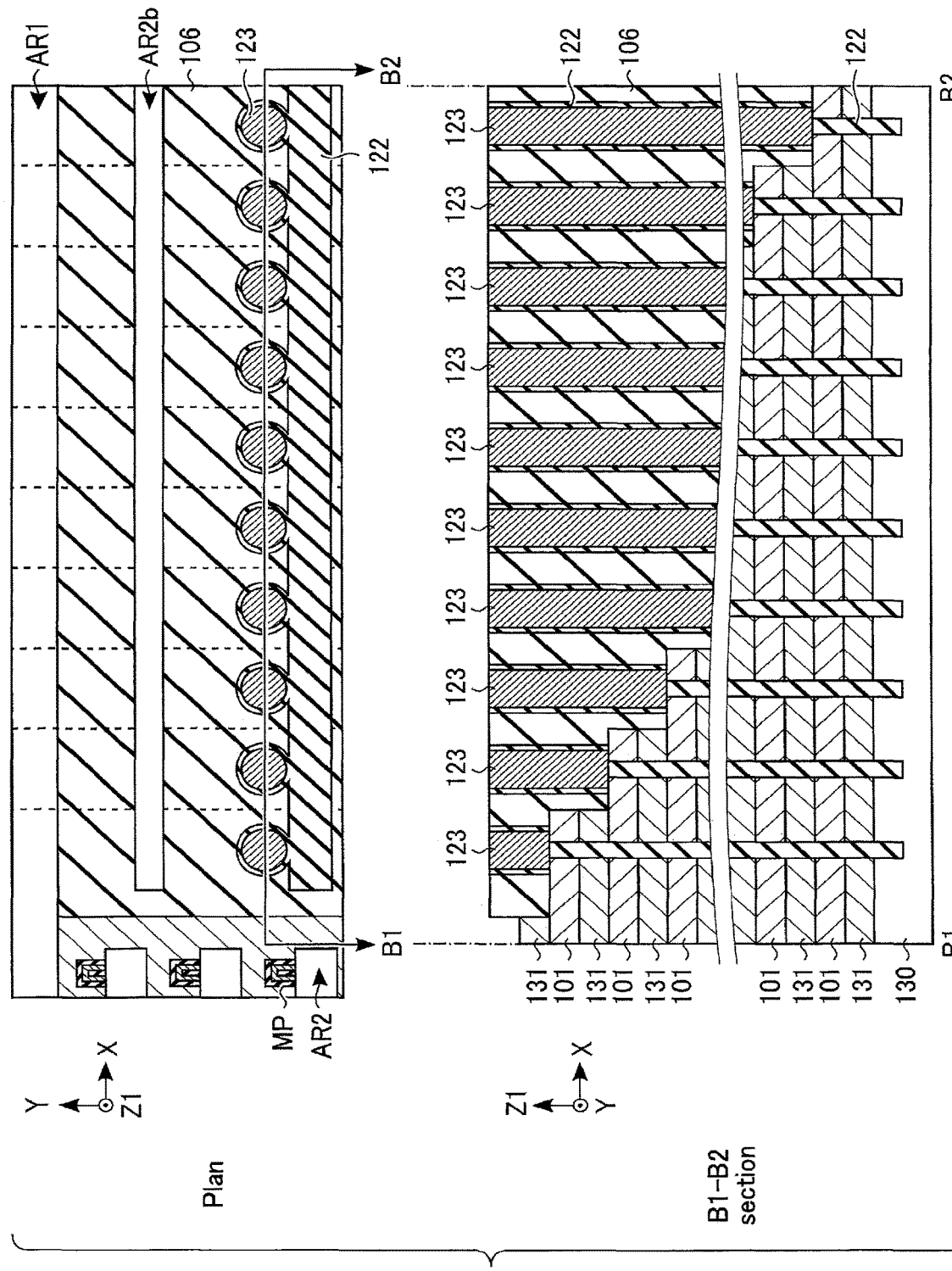

As shown in FIG. 30, insulating layer 135 is removed, for example, by wet etching.

1.2.3 Manufacturing Method of Interconnect Layer 124 and Replacement Method

Next, an example of the manufacturing method of interconnect layer 124 and an example of the replacement method will be described with reference to FIGS. 31 to 36. FIGS. 31 to 36 show a plan of the cell portion of the memory cell array 11 and an A1-A2 section.

Figure 31:
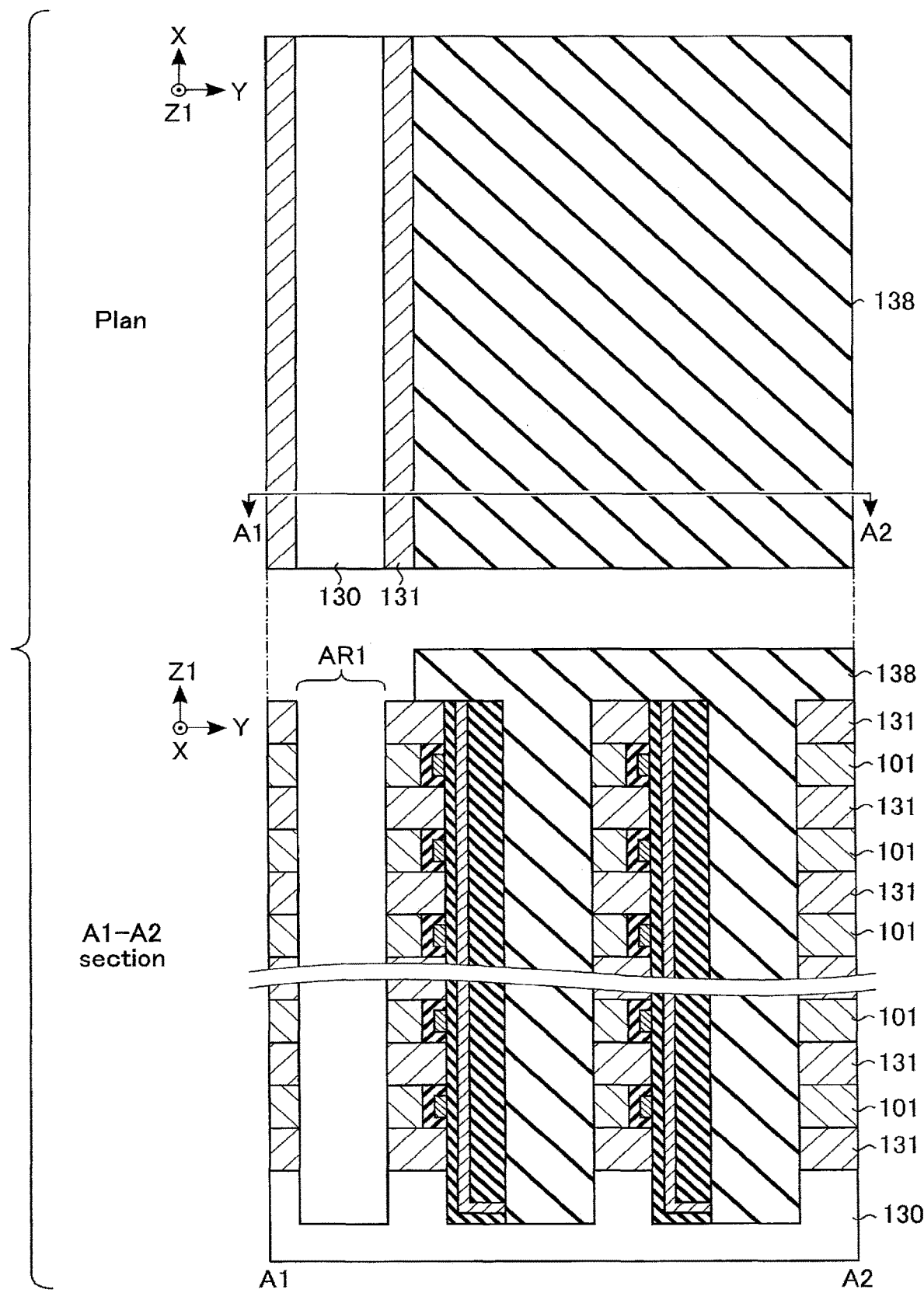
FIG. 31 to FIG. 36 are diagrams of the cell portion of the memory cell array and illustrate the manufacturing process of the semiconductor memory device according to the first embodiment.

As shown in FIG. 31, an insulating layer 138 is formed after a contact plug CP is formed. The insulating layer 138 is formed of SiN, for example. Next, the insulating layer 138 is removed to expose area AR1. Thus, area AR2 (and AR2b) is filled with the insulating layer 138, with area AR1 exposed. It should be noted that air gaps may be formed in area AR2 (and AR2b)

Figure 32:
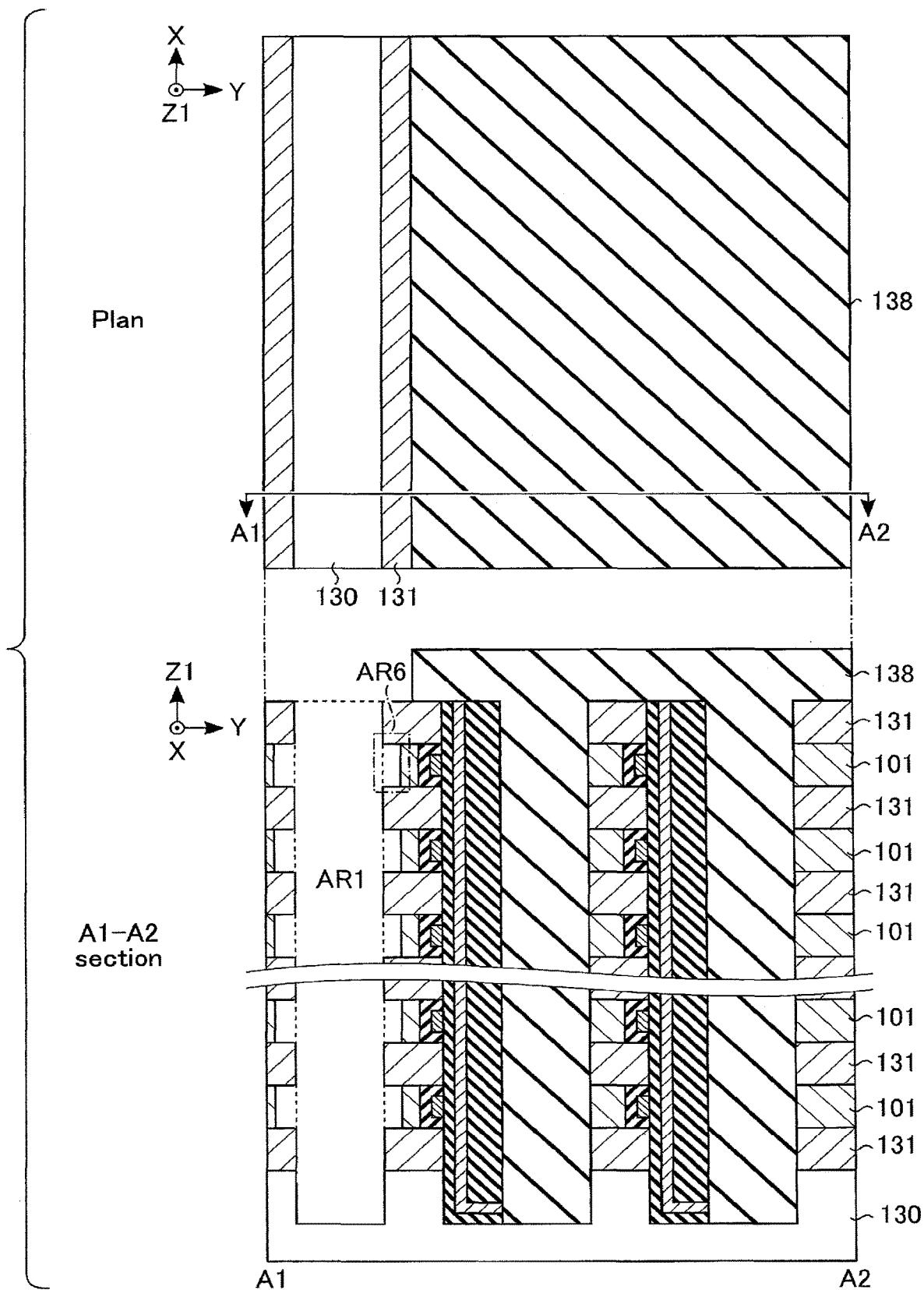

As shown in FIG. 32, interconnect layer 101 is etched from the side face of area AR1, for example, by wet etching to form area AR6. Area AR6 corresponds to interconnect layer 124.

Figure 33:
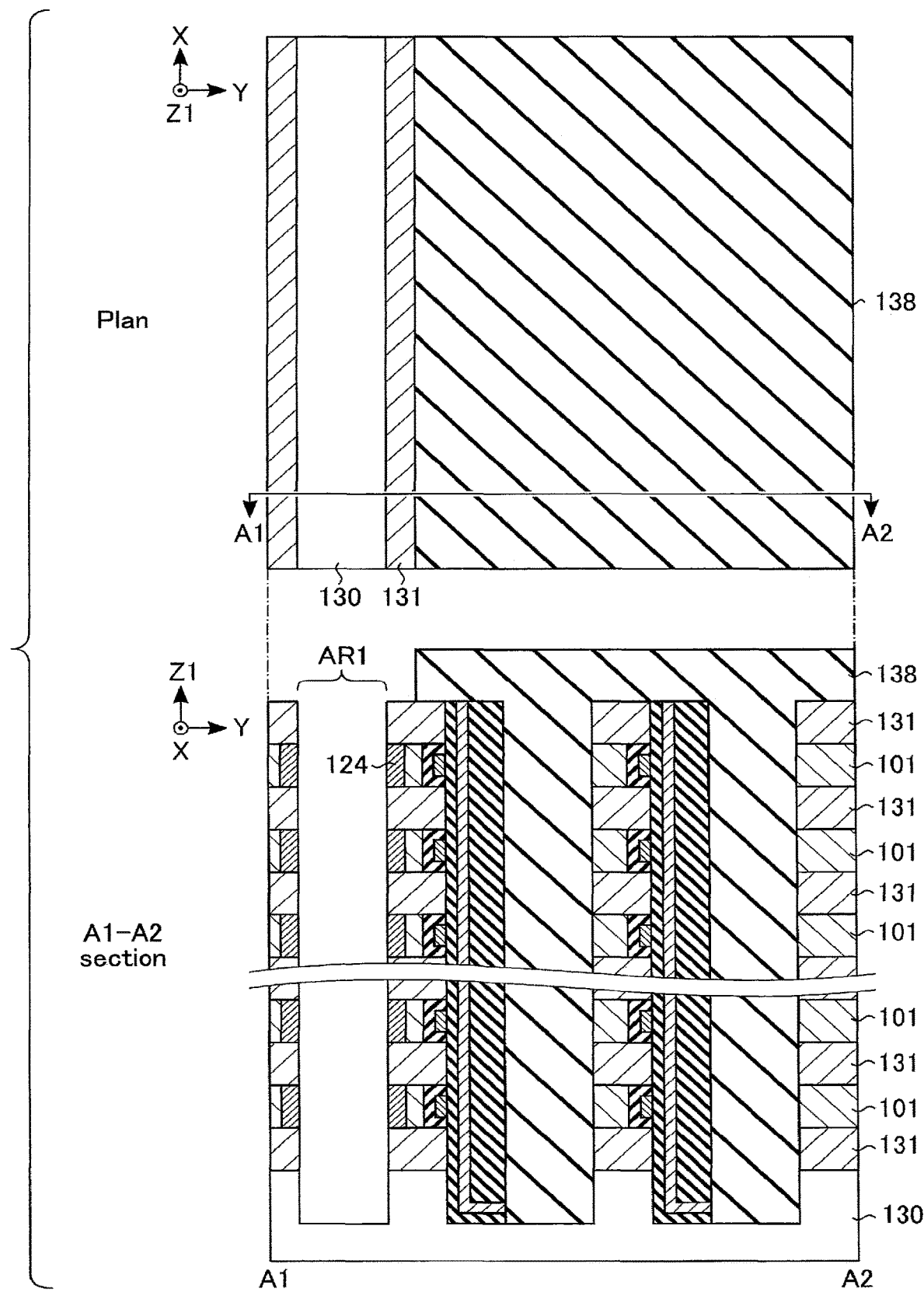

As shown in FIG. 33, interconnect layer 124 is formed in area AR6. More specifically, TiN is first formed by CVD, and then W is formed by CVD to fill area AR6. Next, TiN and W formed outside area AR6 are removed by wet etching, CDE (chemical dry etching), or the like. As a result, interconnect layer 124 is formed in area AR6.

Figure 34:
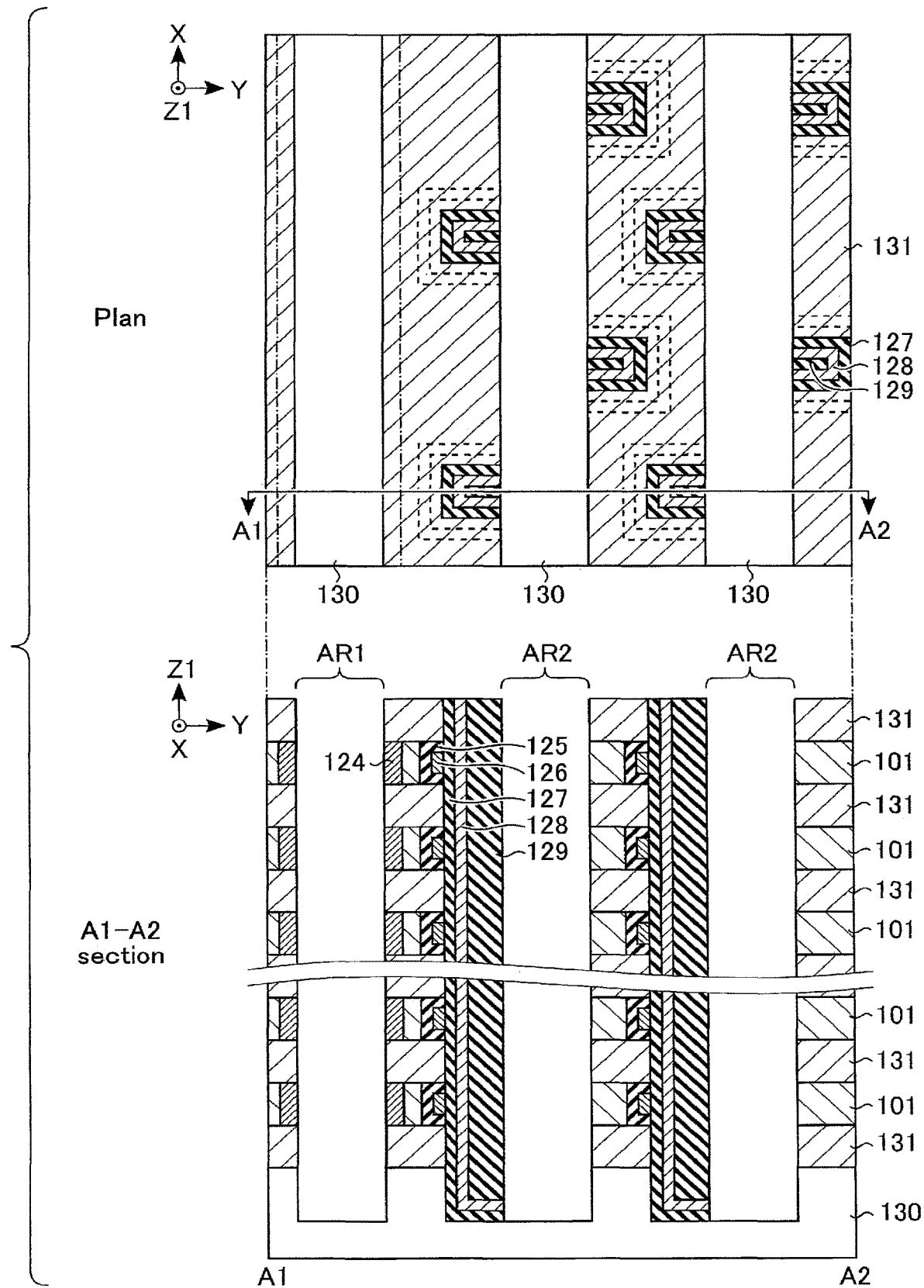

As shown in FIG. 34, the insulating layer 138 is removed, for example, by wet etching.

Figure 35:
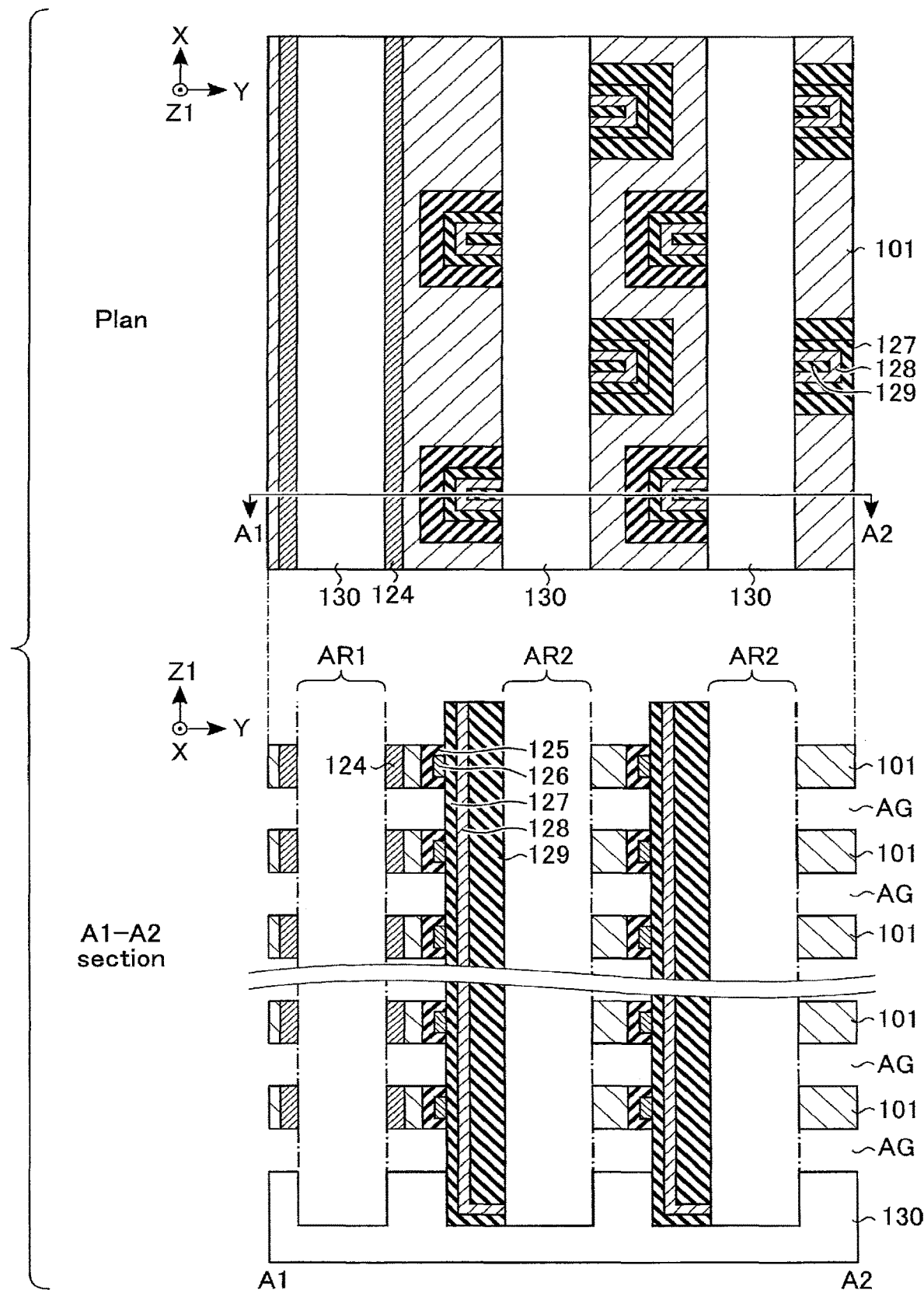

As shown in FIG. 35, the sacrificial layer 131 is removed, for example, by wet etching. As a result, an air gap AG is formed between interconnect layers 101.

Figure 36:
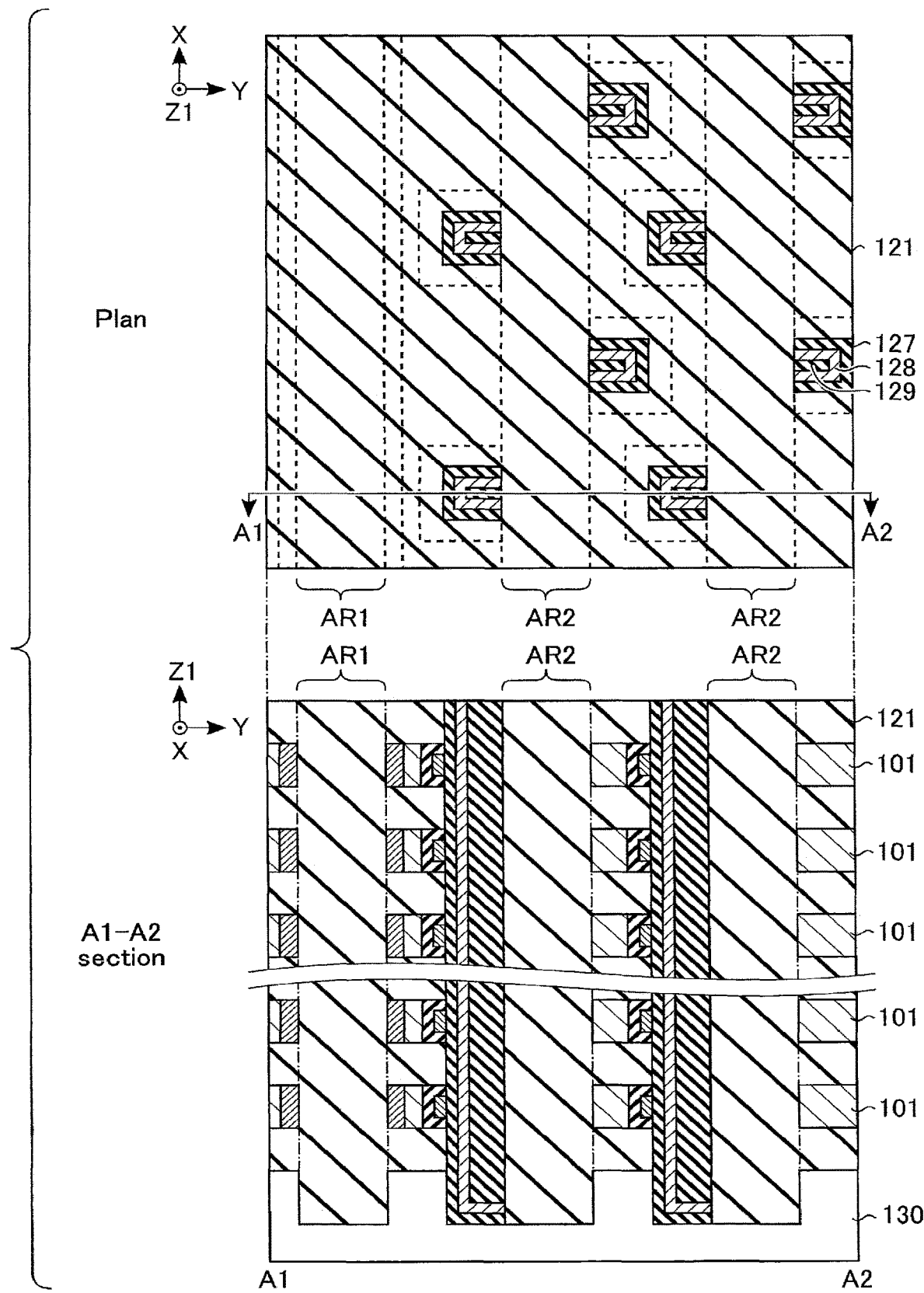

As shown in FIG. 36, an insulating layer 121 is formed, for example, by CVD, to fill the air gap AG and areas AR1, AR2 and AR2b (staircase coupling portion). Next, the surface is planarized by CMP. It should be noted that the air gap AG may be incompletely filled, and an air gap may remain between interconnect layers 101.

1.2.4 Bonding of Array Chip and Circuit Chip

Next, an example of how the array chip 100 and the circuit chip 200 are bonded will be described with reference to FIGS. 37 to 41.

Figure 37:
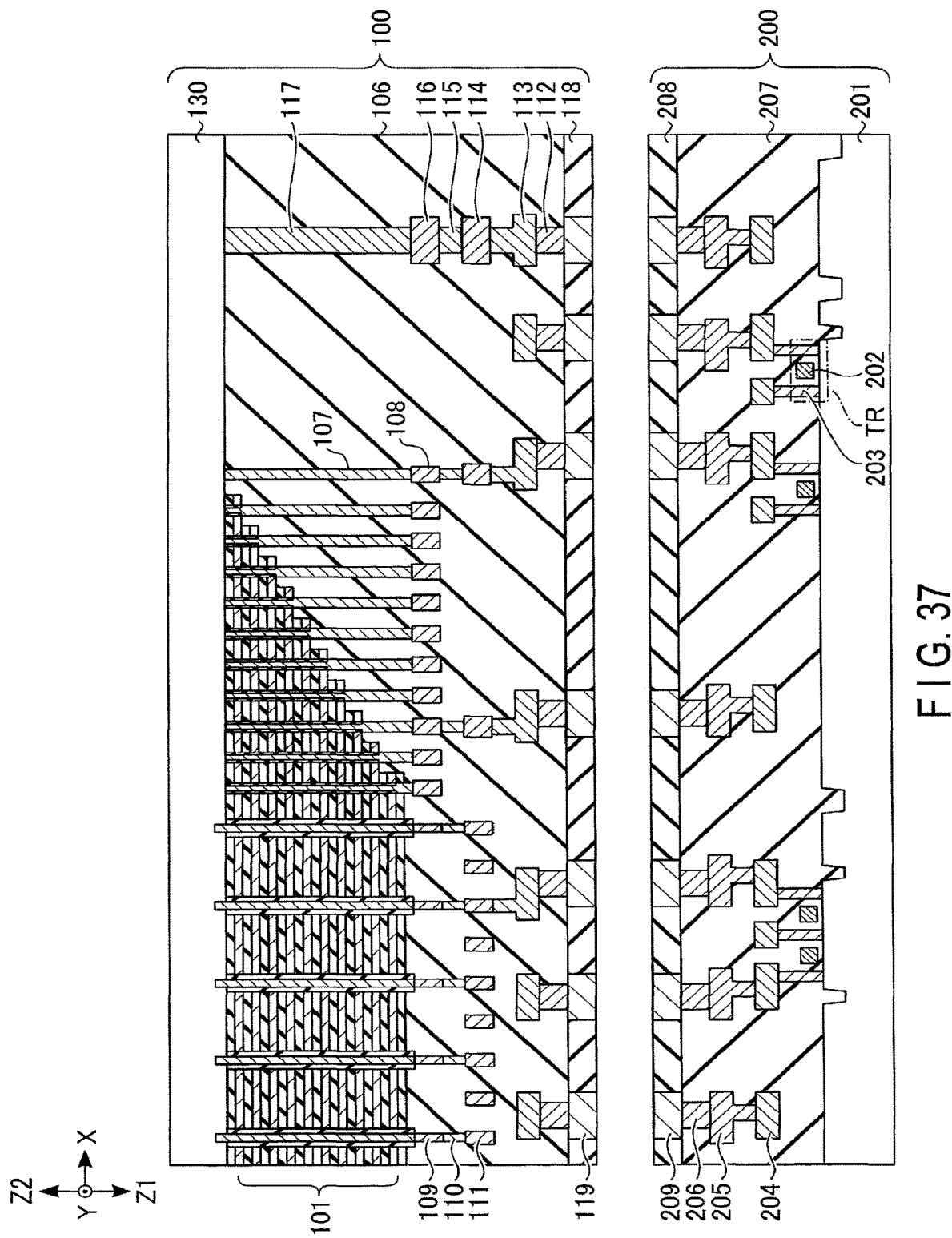
FIG. 37 is a cross-sectional view of the semiconductor memory device and illustrates the manufacturing process of the semiconductor memory device according to the first embodiment.

As shown in FIG. 37, the wafer on which the array chip 100 is mounted and the wafer on which the circuit chip 200 is mounted are pasted together by mechanical pressure. Thus, insulating layer 118 and insulating layer 208 are bonded together. It should be noted that the surfaces of insulating layer 118 and insulating layer 208 may be activated (terminated with OH groups) by plasma treatment and bonded by hydrogen bonding between the OH groups. Next, the bonded array chip 100 and circuit chip 200 are annealed, for example, at 400° C. Thus, electrode pads 119 (for example, Cu) and electrode pads 209 (for example, Cu) are joined.

Figure 38:
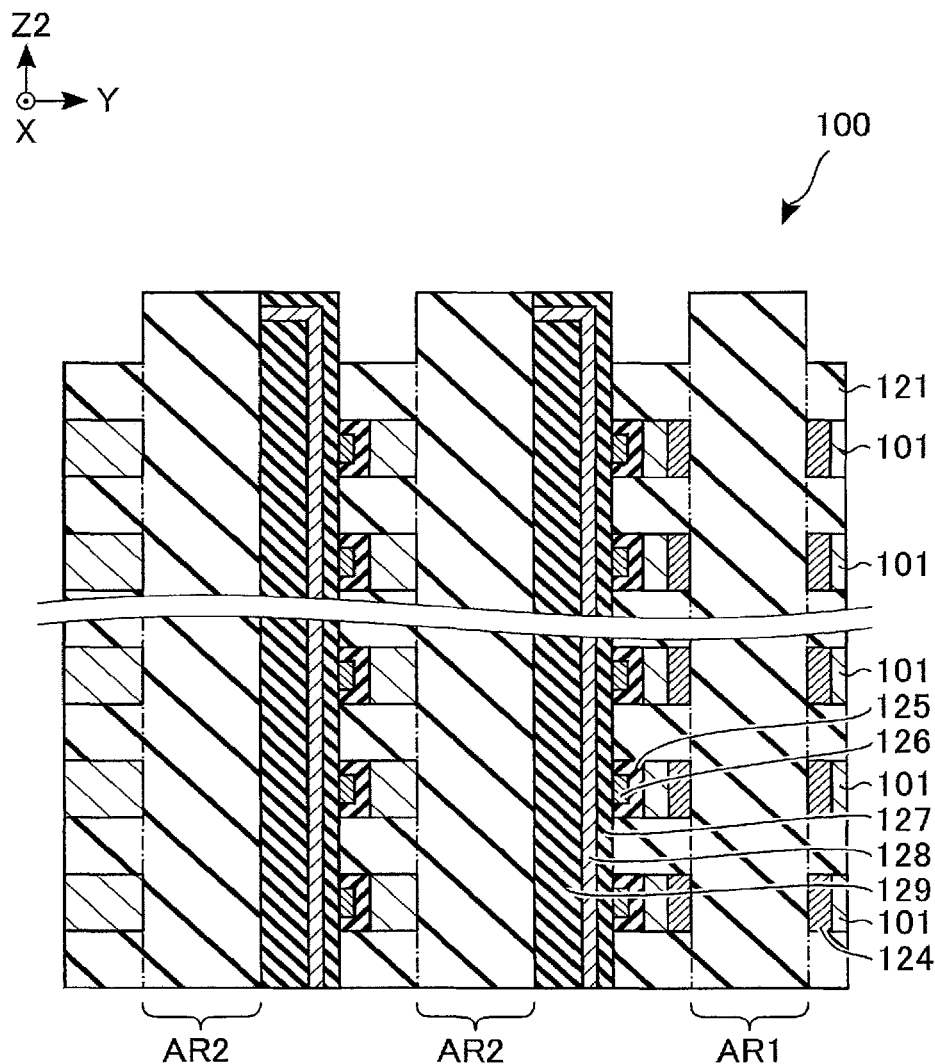
FIG. 38 to FIG. 41 are cross-sectional views of the cell portion of the memory cell array and illustrate the manufacturing process of the semiconductor memory device according to the first embodiment.

As shown in FIG. 38, after the array chip 100 and the circuit chip 200 are bonded together, the semiconductor substrate 130 of the array chip 100 is removed, for example, by wet etching. At this time, semiconductor layer 128 is not exposed. Next, an insulating layer 103 is formed on insulating layer 121 such that contact plugs CP are covered in the staircase coupling portion (not shown).

Figure 39:
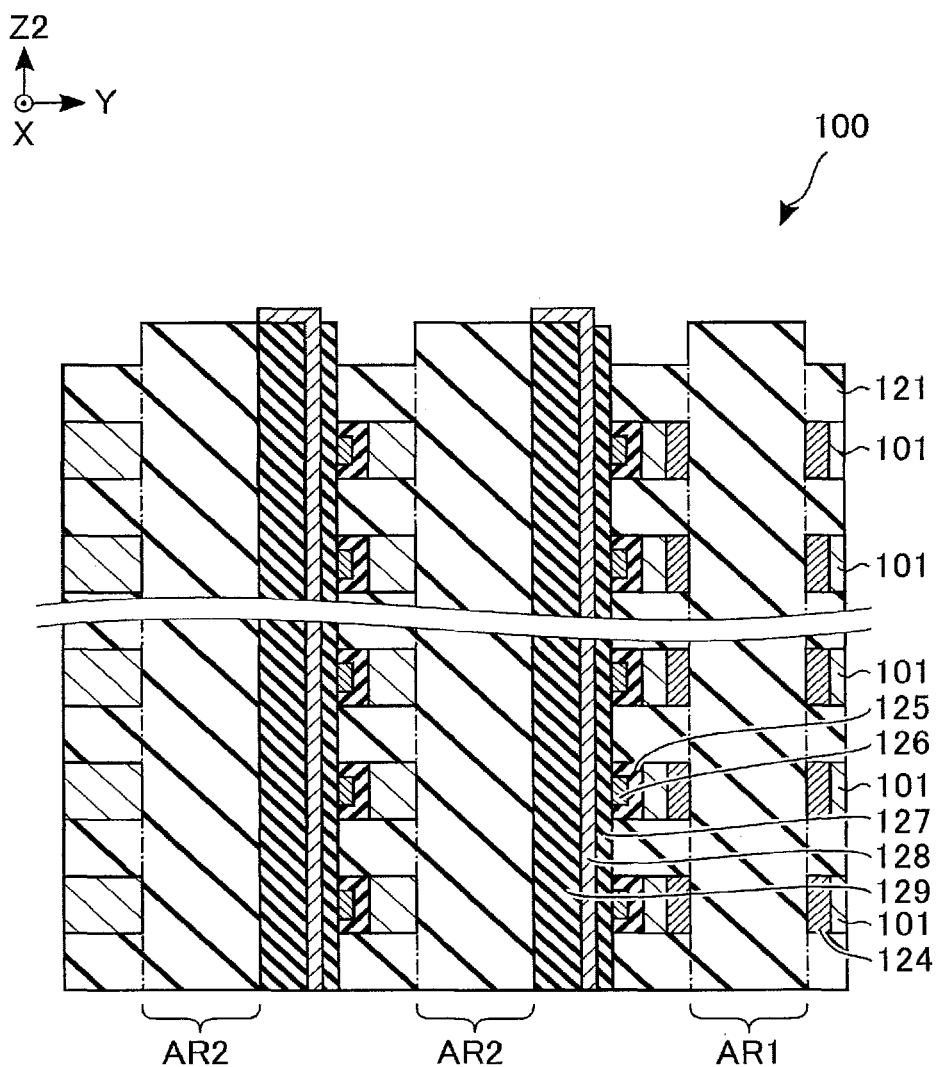

As shown in FIG. 39, the surfaces of the insulating layer 121 and tunnel insulating film 127 are etched such that the surface of the semiconductor layer 128 is exposed in the Z2 direction.

Figure 40:
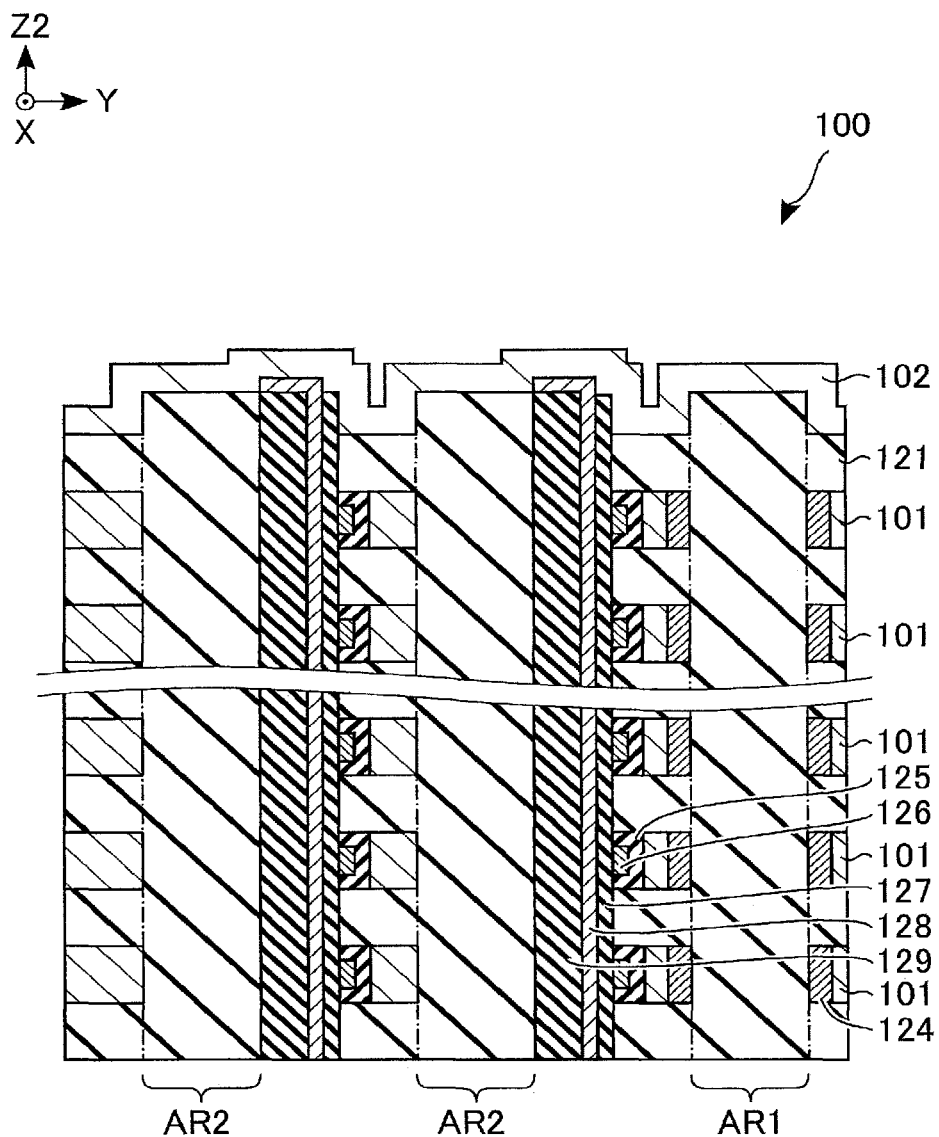

As shown in FIG. 40, interconnect layer 102 is formed on the insulating layer 121 and semiconductor layer 128 in the cell portion in the Z2 direction by CVD, for example. At this time, areas AR1, AR2 and AR4 (column portions MP1 of the memory pillars MP) protrude in the Z2 direction from the uppermost interconnect layer 101 (select gate line SGS) as viewed in the Z2 direction. For this reason, the upper face of interconnect layer 102 as viewed in the Z2 direction (the bottom face of interconnect layer 102 as viewed in the Z1 direction) has an uneven shape in the XY plane.

Figure 41:
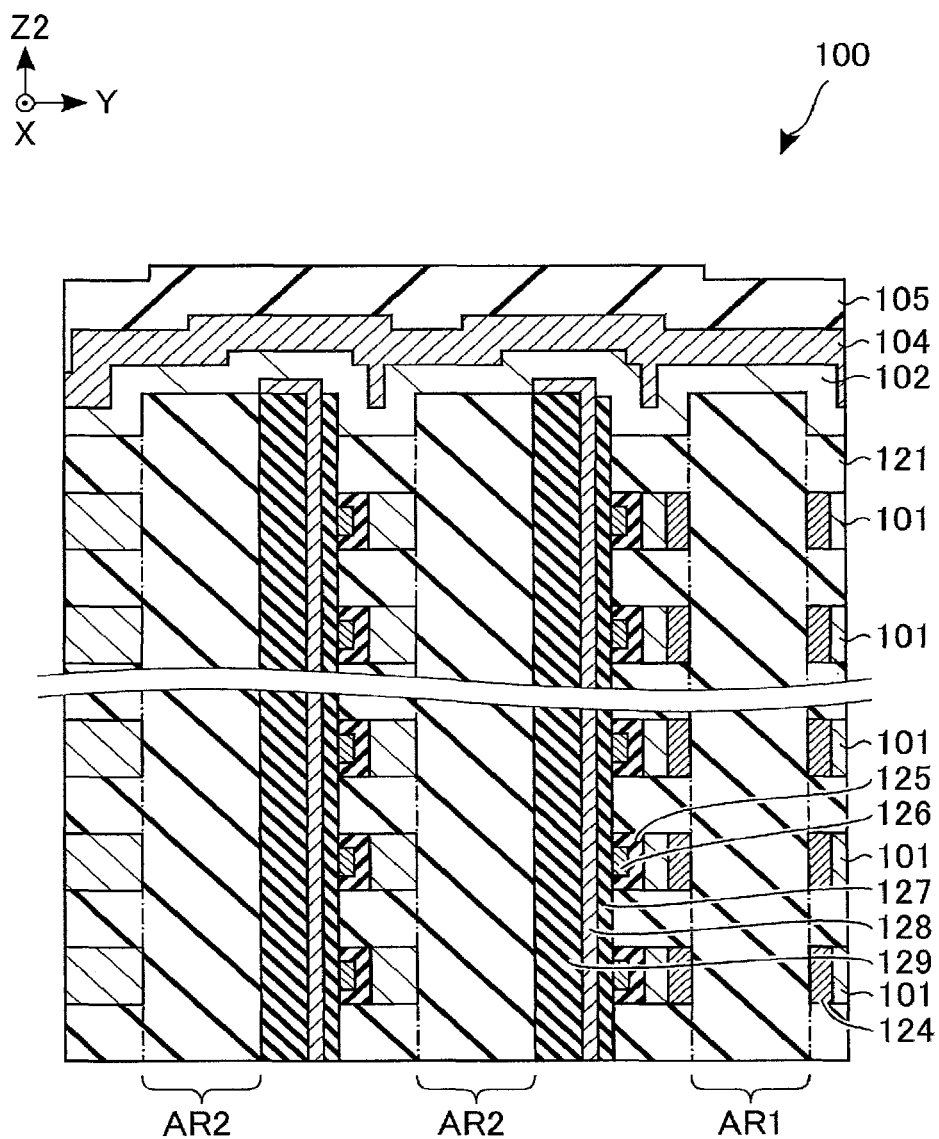

As shown in FIG. 41, in the Z2 direction, interconnect layer 104 is formed on interconnect layer 102 in the cell portion and insulating layer 103 in the staircase coupling portion. After electrode pads PD etc. are formed in the peripheral region, insulating layer 105 is formed.

1.3 Example of Residual Catalyst Metal

Figure 42:
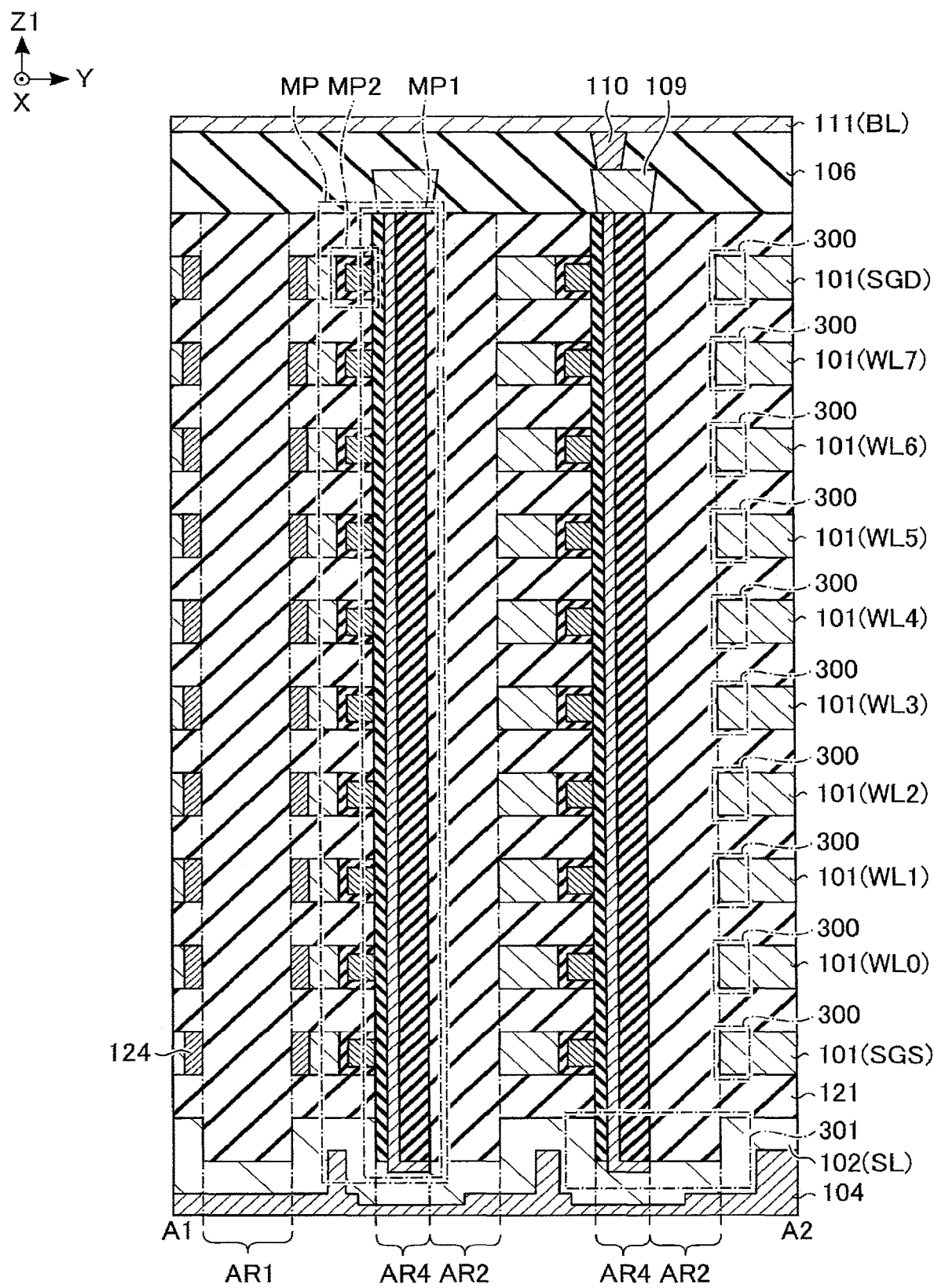
FIG. 42 is a cross-sectional view of the cell portion of the memory cell array and illustrates an example of a region where catalyst metal tends to remain in the semiconductor memory device according to the first embodiment.
Figure 43:
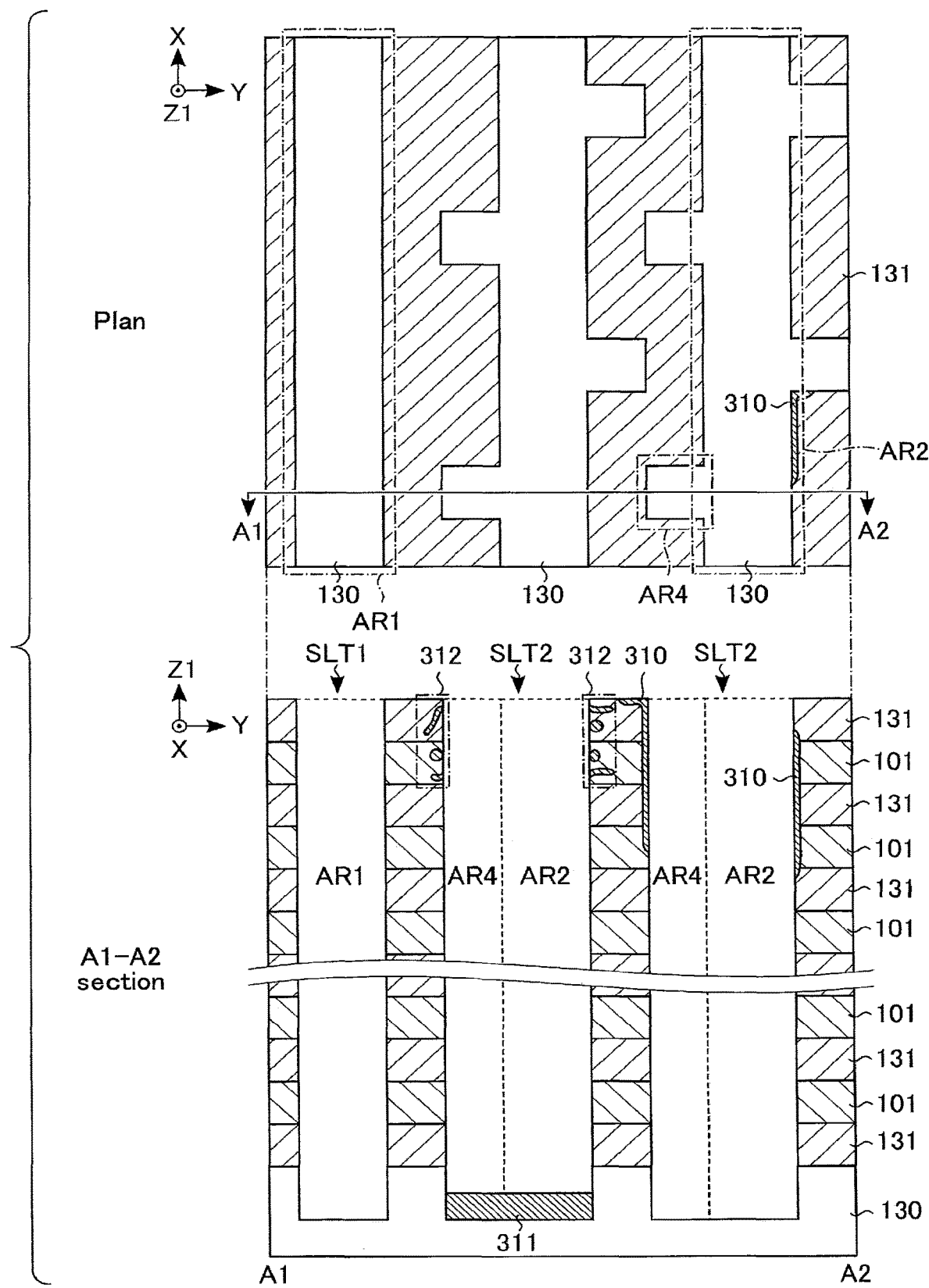
FIG. 43 is a diagram of the cell portion of the memory cell array and illustrates an example in which the catalyst metal remains in the manufacturing process of the semiconductor memory device according to the first embodiment.

Next, an example of a residual catalyst metal will be described with reference to FIGS. 42 and 43. FIG. 42 shows regions where a catalyst metal is likely to remain in the cross section of the cell portion shown in FIG. 6. FIG. 43 shows an example of how the catalytic metal remains after the MaCE described with reference to FIG. 11.

As shown in FIG. 42, where the memory cell array 11 is formed using MaCE, in the cell portion, the catalytic metal may remain in the regions 300 in the vicinity of the ends of interconnect layers 101 in contact with areas AR2 and in the regions 301 in the vicinity of the bottoms of areas AR1, AR2 and AR4. Similarly, in the staircase coupling portion, the catalyst metal may remain in the regions in the vicinity of the ends of interconnect layers 101 in contact with the side faces of areas AR2b and AR3 and contact plugs CP and in the regions in the vicinity of the bottoms of areas AR2b and AR3 and contact plugs CP. Needless to say, the regions where the catalyst metal remains is not limited to the regions mentioned above.

More specifically, as shown in FIG. 43, in the wet etching process using the second chemical solution of the MaCE described with reference to FIG. 11, the wafer is immersed in the second chemical solution to dissolve the catalyst metal (Au in the present embodiment) in the second chemical solution. Thereafter, the second chemical solution is removed by rinsing treatment using water and drying treatment. At this time, the metal 310 dissolved in the second chemical solution may adhere again to the wafer surface, for example, to the surface of the uppermost sacrificial layer 131 and the exposed side faces of the sacrificial layers 131 and interconnect layers 101.

In addition, before the wet etching step using the second chemical solution, a metal 311 into which catalyst layer 132a or 132b has altered may not be dissolved in the second chemical solution and remain, for example, in the bottom of area AR1, AR2 or AR4.

Further, in MaCE, a porous region having pores may be caused in the vicinity of the exposed surfaces of the semiconductor layers due to the impurities contained in the stacked semiconductor layers (interconnect layers 101 and the sacrificial layers 131). Residual metal 312 tends to remain on the exposed surfaces, particularly on the etched bottom (e.g., the bottoms of areas AR1, AR2 and AR4) and a porous layer.

Since the residual metals 310, 311 and 312 are very small in amount, they have little effect on the semiconductor elements, and are difficult to find even by observation with an electron microscope. However, the existence of such residual metals can be confirmed by immersing the semiconductor memory device 1 in the third chemical solution and measuring the nonvolatile component that remains after the third chemical solution is evaporated by a highly sensitive trace metal analysis method such as ICP-MS (inductively coupled plasma mass spectrometry).

The third chemical solution is used for dissolving a metal to be analyzed and may have a plurality of compositions, or a plurality of chemical solution treatments may be performed. A chemical solution containing $HNO_3$, HCl or HF is preferably used.

1.4 Advantages of Present Embodiment

With the configuration of the present embodiment, it is possible to provide a semiconductor memory device that can be manufactured at low cost. This advantage will be described in detail.

In a three-dimensionally stacked NAND type flash memory, the number of word lines WL tends to be increased as the degree of integration increases. For example, where a memory hole corresponding to a memory pillar MP is etched by dry etching, the etching time for etching the memory hole becomes longer as the number of word lines WL increases, and the throughput of the apparatus lowers. For this reason, the process unit cost for etching a memory hole tends to increase, due to an increase in the amount of etching gas used in one-time etching and an increase in the number of apparatuses required for etching the memory hole.

On the other hand, with the configuration of the present embodiment, a memory hole can be etched by wet etching (MaCE) using a catalytic metal. Therefore, an inexpensive wet etching apparatus can be used instead of an expensive vacuum apparatus used for dry etching. Thus, the process unit cost for etching a memory hole can be reduced. Accordingly, an increase in the manufacturing cost of a semiconductor memory device can be suppressed.

In addition, with the configuration of the present embodiment, a hole shape (area AR4) and a line shape (areas AR1 and AR2) can be etched simultaneously. In the case of dry etching, a hole shape and a line shape are etched individually due to the difference in etching characteristics. In the present embodiment, however, the hole shape and the line shape can be etched simultaneously, so that the manufacturing cost of the etching process can be reduced.

Further, with the configuration of the present embodiment, a catalyst metal that has a shape corresponding to a hole and a shape corresponding to a line can be used when a hole is formed by MaCE. Thus, when the hole is formed, it is prevented from bending in the Z direction.

Further, with the configuration of the present embodiment, a hole (area AR4) and a line (area AR2) can be etched at a time by MaCE. For this reason, the angle of the contact portion of the hole and line can be made approximately 90°.

Figure 44:
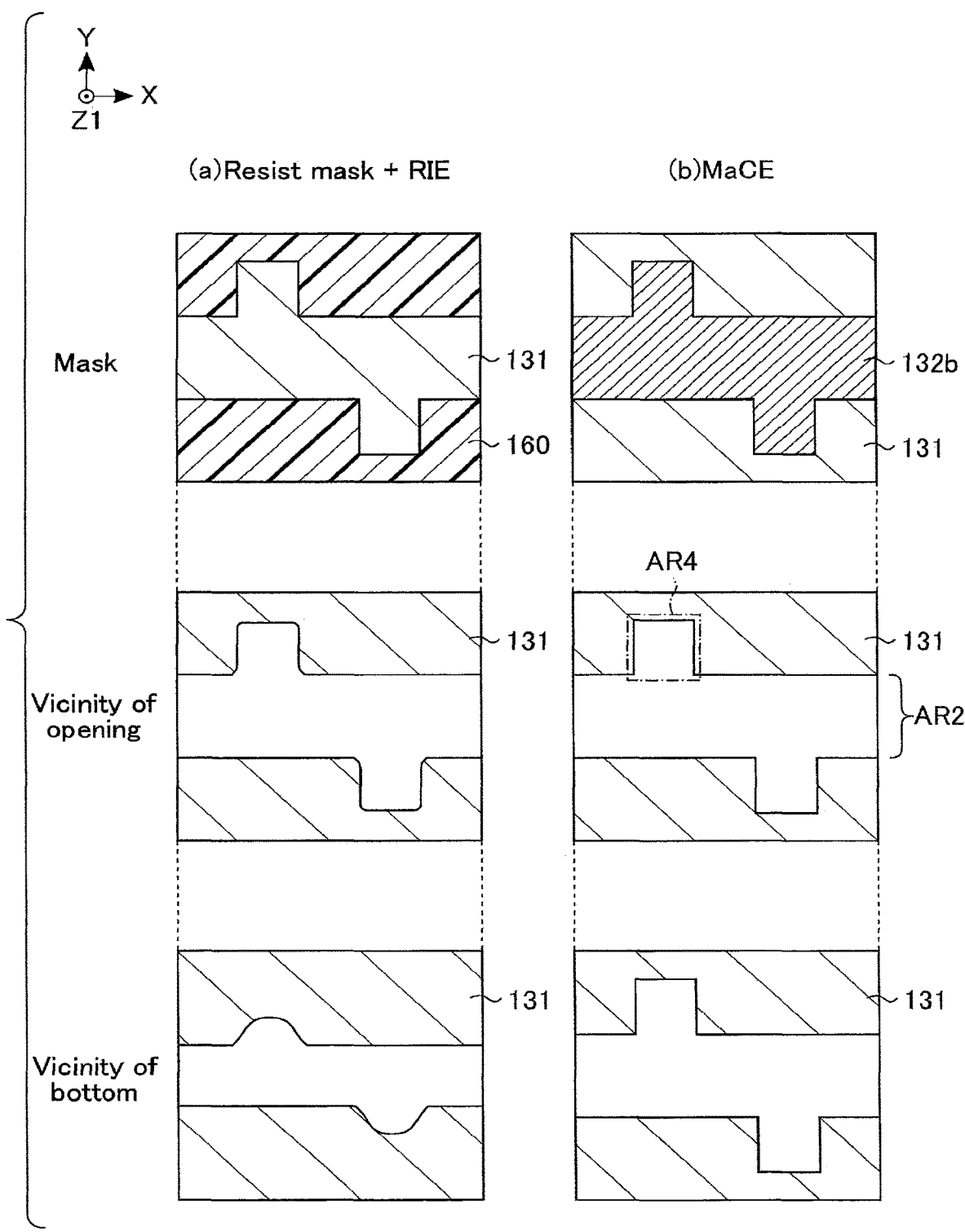
FIG. 44 is an example diagram that compares etched shapes of holes and lines formed using RIE and etched shapes of holes and lines formed using MaCE.

Still further, with the configuration of the present embodiment, the use of MaCE suppresses the shape variation of a hole and a line in the vicinity of an opening and in the vicinity of a bottom. This advantage will be described with reference to FIG. 44. FIG. 44 is an example diagram that compares the case where a hole (area AR4) and a line (area AR2) are etched using a resist mask pattern and RIE and the case where a hole (area AR4) and a line (area AR2) are etched using MaCE. The example in FIG. 44 shows a mask surface, a plan of a etched shape in the vicinity of the opening, and a plan of a etched shape in the vicinity of the bottom.

As shown in FIG. 44, for example, in the case of a resist mask, a mask pattern formed of resist 160 is formed in a region that is not etched, and a stacked body (interconnect layers 101 and sacrificial layers 131) in a region to be etched is exposed. The corners of the resist 160 are retracted by etching. In the case of RIE, the etched shape is generally a tapered shape (the shape is smaller at the bottom). For this reason, the angle e of the hole corner extending from the opening to the bottom increases to be 90° or more, and the widths of the hole and line as viewed in the Y direction decrease. Thus, the shape of the memory cell transistor MC differs between the upper portion of the memory pillar MP and the lower portion thereof. In contrast, where MaCE is used, the shape of the catalyst layer 132b is transferred in the vicinity of the bottom as well, so that variations in the etched shapes of a hole and a line can be suppressed in the depth direction (Z direction). That is, variations in the shape and characteristics of the memory cell transistor MC can be suppressed.

Furthermore, with the configuration of the present embodiment, after the array chip 100 and the circuit chip 200 are bonded together, the semiconductor substrate 130 can be removed to form interconnect layer 102 (source line SL). Thus, interconnect layer 102 can be formed such that it covers areas AR1 and AR2 and the memory pillar MP in accordance with the shape of the protrusion. Since interconnect layer 102 can be formed with a substantially uniform film thickness, an increase in the interconnect resistance due to a locally thin film can be suppressed.

Furthermore, with the configuration of the present embodiment, a region where the sacrificial layers 131 and interconnect layers 101 are stacked without replacement can be left in at least part of the edge region and peripheral region. With this structure, the internal stress of the chip can be relaxed.

2. Second Embodiment

Next, a description will be given of the second embodiment. In connection with the second embodiment, a description will be given of how the layout of a memory pillar MP differs from that of the first embodiment. Hereinafter, a description will be given focusing on the points in which the second embodiment differs from the first embodiment.

2.1 Planar Configuration of Memory Cell Array

Figure 45:
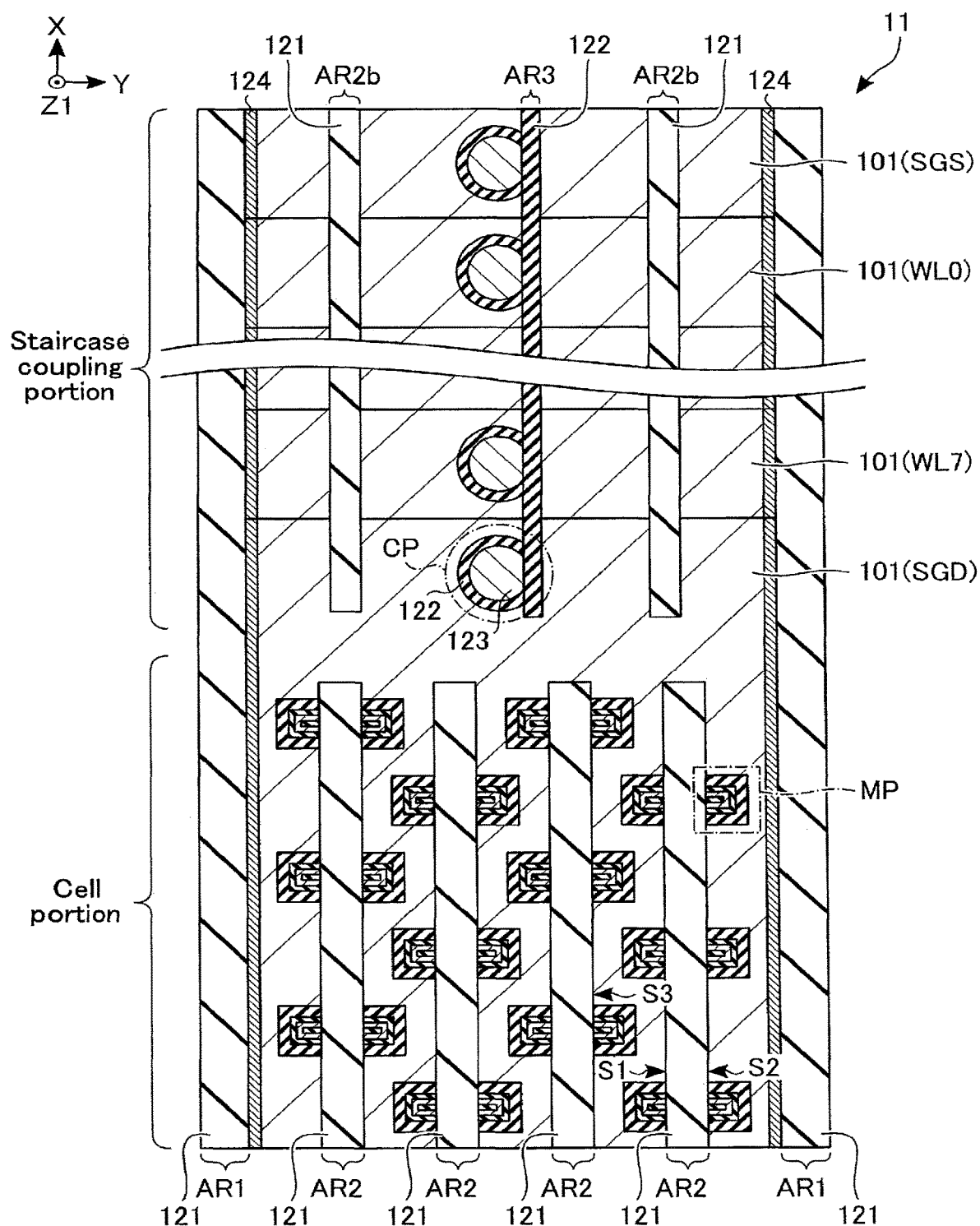
FIG. 45 is a plan of a memory cell array provided in a semiconductor memory device according to a second embodiment.

Next, an example of the planar configuration of the memory cell array 11 according to the second embodiment will be described with reference to FIG. 45. FIG. 45 shows part of one block BLK, and illustration of part of the insulating layers is omitted to simplify the description.

As shown in FIG. 45, in one area AR2 of the cell portion, for example, a plurality of memory pillars MP are arranged side by side in the X direction such that they are in contact with one side face S1 of area AR2 (insulating layer 121) extending in the X direction and facing the Y direction. Similarly, a plurality of memory pillars MP are arranged side by side in the X direction such that they are in contact with the other face S2 of area AR2 extending in the X direction and being opposite to side face S1. The memory pillars MP that are in contact with side face S1 and the memory pillars MP that are in contact with side face S2 are arranged at the same positions as viewed in the X direction.

Further, between two adjacent areas AR2, the plurality of memory pillars MP that are in contact with the opposite side faces (for example, side face S1 and side face S3) are alternately arranged in the X direction. Accordingly, interconnect layer 101 provided between the two adjacent areas AR2 includes portions P1 extending in the Y direction and portions P2 extending in the X direction, and these portions are alternately coupled at the ends to provide a zigzag shape, as in the first embodiment.

2.2 Advantages of Present Embodiment

With the configuration of the present embodiment, the advantages similar to those of the first embodiment can be obtained.

3. Third Embodiment

A description will be given of the third embodiment. In connection with the third embodiment, reference will be made to the case where the shapes of the tunnel insulating film 127, the semiconductor layer 128, and the core layer 129 provided in memory pillar MP (column portion MP1) are different from those of the first embodiment. Hereinafter, a description will be given focusing on the points in which the third embodiment differs from the first and second embodiments.

3.1 Configuration of Cell Portion

Figure 47:
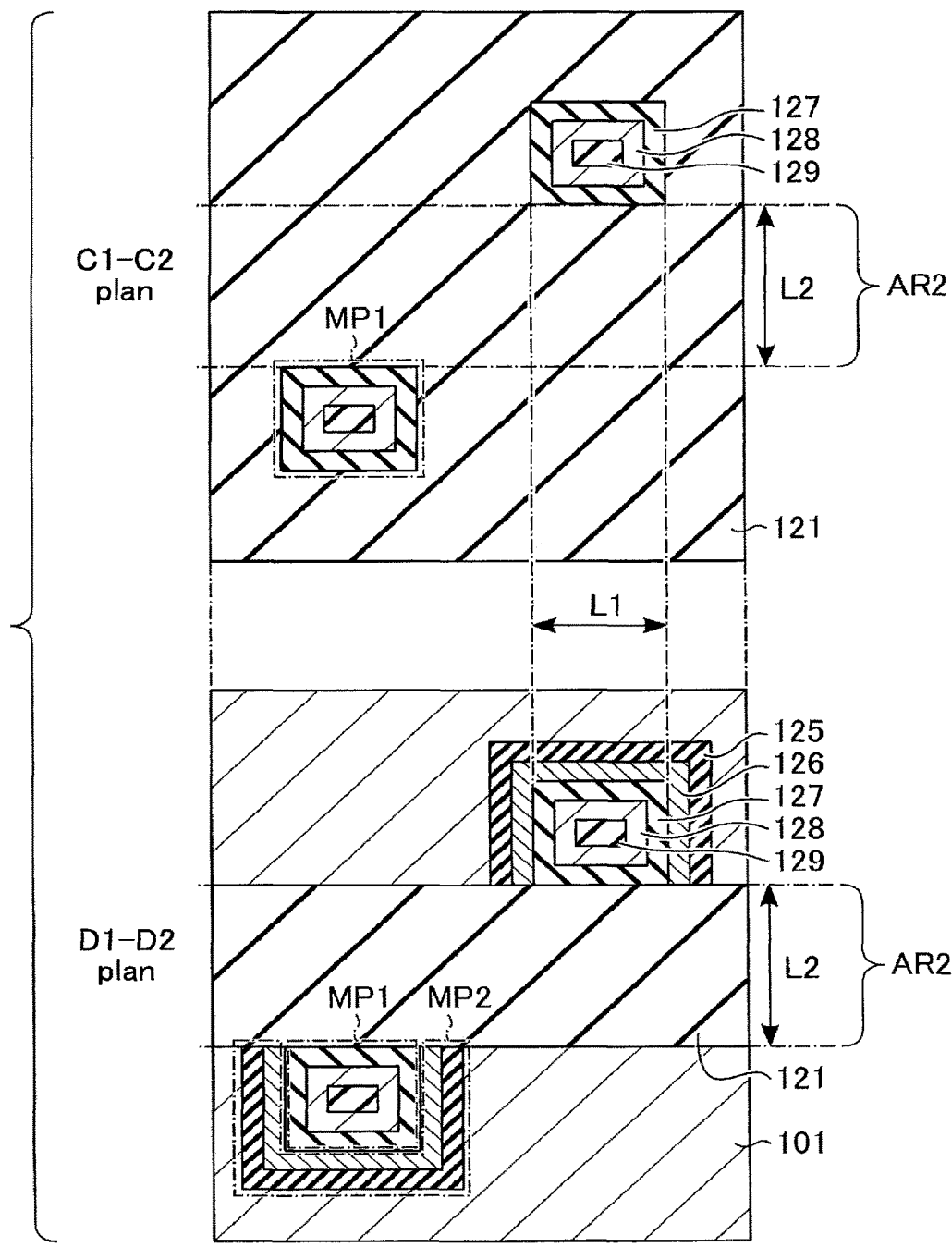
FIG. 47 is plans of the cell portion of the memory cell array provided in the semiconductor memory device according to the third embodiment.

An example of the configuration of the cell portion of the memory cell array 11 will be described with reference to FIGS. 46 and 47. FIG. 46 is a cross-sectional view of the cell portion. FIG. 47 shows plans taken along line C1-C2 and line D1-D2 of FIG. 46.

As shown in FIG. 46, the column portion MP1 of the memory pillar MP includes a tunnel insulating film 127, a semiconductor layer 128, and a core layer 129 which extend in the Z1 direction. The tunnel insulating film 127 has a tubular shape whose one side face (outer peripheral face) is in contact with the side face of area AR4. The side faces (outer peripheral faces) of the semiconductor layer 128 are in contact with the tunnel insulating film 127, and the bottom face thereof is in contact with interconnect layer 102. The inside of the semiconductor layer 128 is filled with the core layer 129.

Next, a description will be given of the planar configuration of the memory pillar MP.

As shown in FIG. 47, the column portion MP1 has, for example, a quadrangular prism shape whose upper face is substantially quadrangular, as in FIG. 7 referred to in connection with the first embodiment. The shape of the upper face of the column portion MP1 is not limited to the quadrangle. For example, the shape of the upper face of the column portion MP1 may be polygonal or semicircular as long as one side is in contact with area AR2. The side faces of the tunnel insulating film 127 are in contact with the four side faces of the column portion MP1 (area AR4). The side faces (outer peripheral faces) of the semiconductor layer 128 are in contact with the tunnel insulating film 127. A core layer 129 is provided inside the semiconductor layer 128.

The configuration of branch portion MP2 is the same as that of the first embodiment shown in FIG. 7.

3.2 Manufacturing Method of Memory Pillar

Next, a description will be given of the point in which the manufacturing method of the memory pillar MP differs from that of the first embodiment. According to the first embodiment, in the process shown in FIG. 17, the memory pillar MP is formed after the insulating layer 134 in area AR2 is removed. On the other hand, according to the present embodiment, the memory pillar MP is formed without the insulating layer 134 being removed.

3.3 Advantages of Present Embodiment

With the configuration of the present embodiment, the advantages similar to those of the first embodiment can be obtained.

It should be noted that the second embodiment and the third embodiment may be combined. That is, the arrangement of the memory pillars MP in the cell portion may be similar to that of the second embodiment.

4. Fourth Embodiment

Then, a description will be given of the fourth embodiment . In connection with the fourth embodiment, reference will be made to the where a MONOS type memory pillar MP using an insulating layer is applied to a charge storage layer 126. Hereinafter, a description will be given focusing on the points in which the fourth embodiment differs from the first and second embodiments.

4.1 Planar Configuration of Memory Cell Array

Next, an example of the planar configuration of the memory cell array 11 according to the fourth embodiment will be described with reference to FIG. 48. FIG. 48 shows part of one block BLK, and illustration of part of the insulating layers is omitted to simplify the description.

As shown in FIG. 48, the arrangement of the memory pillars MP is the same as that of the first embodiment, but the configuration of the memory pillars MP is different from that of the first embodiment. The configuration of the staircase coupling portion is the same as that of the first embodiment.

4.2 Configuration of Cell Portion

Figure 49:
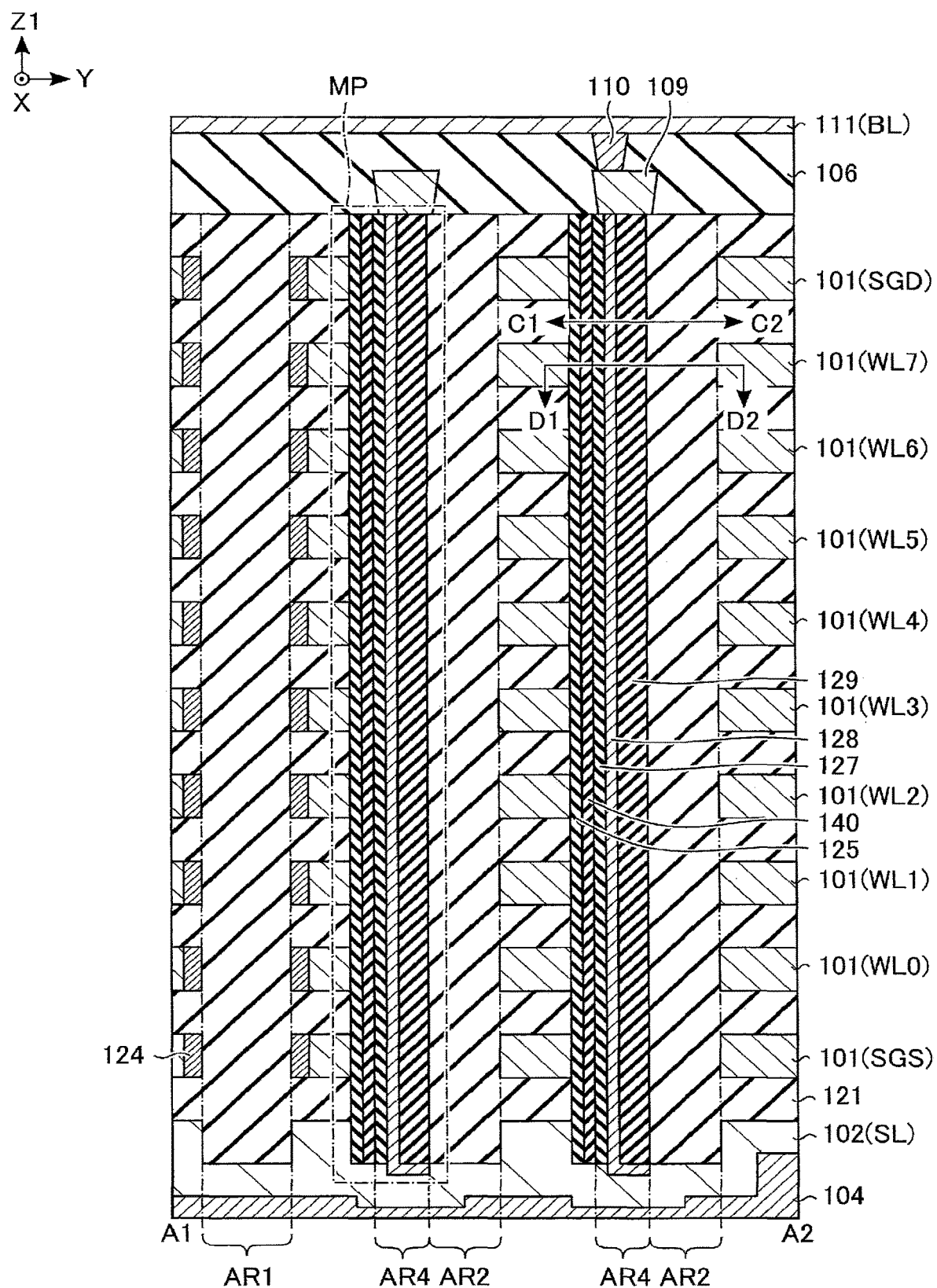
FIG. 49 is a cross-sectional view of a cell portion of the memory cell array provided in the semiconductor memory device according to the fourth embodiment.
Figure 50:
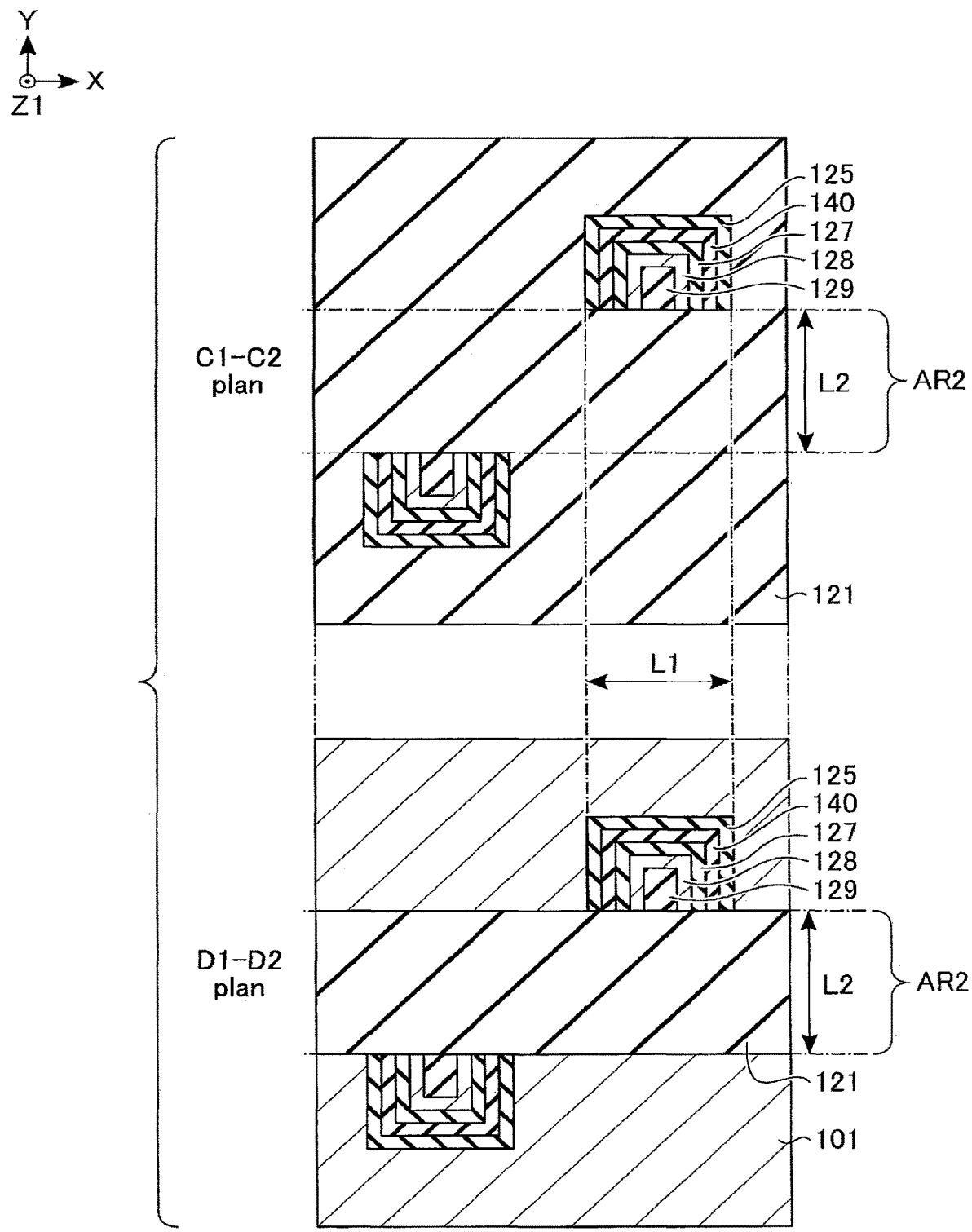
FIG. 50 is plans of the cell portion of the memory cell array provided in the semiconductor memory device according to the fourth embodiment.

Next, an example of the configuration of the cell portion of the memory cell array 11 will be described with reference to FIGS. 49 and 50. FIG. 49 shows a cross-sectional view of the cell portion taken along line A1-A2 of FIG. 48. FIG. 50 shows plans taken along line C1-C2 and line D1-D2 of FIG. 49.

As shown in FIG. 49, one face of memory pillar MP of the present embodiment is in contact with the insulating layer 121 in area AR2. The memory pillars MP penetrate (pass) the plurality of interconnect layers 101 and extend in the Z1 direction. For example, the height positions of the top and bottom faces of the memory pillar MP are substantially the same as the height position of area AR1, as viewed in the Z1 direction. The memory pillar MP includes a block insulating film 125, a charge storage layer 140, a tunnel insulating film 127, a semiconductor layer 128, and a core layer 129. The charge storage layer 140 is formed of SiN, for example.

Next, a description will be given of the planar configuration of the memory pillar MP.

As shown in FIG. 50, the memory pillar MP of the present embodiment has a quadrangular prism shape whose upper face is substantially quadrangular. The shape of the upper face of the memory pillar MP is not limited to the quadrangle. For example, the shape of the upper face of the memory pillar MP may be polygonal or semicircular as long as one side is in contact with area AR2. The shape of the memory pillar MP of the present embodiment is the same between in the C1-C2 plan and in the D1-D2 plan.

More specifically, the block insulating film 125, the charge storage layer 140, and the tunnel insulating film 127 are stacked on three side faces of the memory pillar MP that are not in contact with the insulating layer 121 in area AR2. Inside the memory pillar MP, the semiconductor layer 128 is provided such that the side faces thereof are in contact with the three side faces of the tunnel insulating film 127 and the bottom face thereof is in contact with interconnect layer 102. Inside the memory pillar MP, a core layer 129 is provided such that a space surrounded by the semiconductor layer 128 and the insulating layer 121 in area AR2 is filled.

In the present embodiment, the relationship L1<L2 is satisfied, where L1 is the width (length) of the memory pillar as viewed in the X direction, and L2 is the width (length) of area AR2 as viewed in the Y direction.

4.3 Manufacturing Method of Memory Pillar

Next, a description will be given of the points in which the manufacturing method of the memory pillar MP differs from that of the first embodiment. According to the first embodiment, area AR5 corresponding to branch portion MP2 is formed, as shown in FIG. 16. On the other hand, according to the present embodiment, the block insulating film 125, the charge storage layer 140, the tunnel insulating film 127, the semiconductor layer 128, and the core layer 129 are formed, without area AR5 being formed. Then, the block insulating film 125, the charge storage layer 140, the tunnel insulating film 127, the semiconductor layer 128, and the core layer 129 formed on the uppermost sacrificial layer 131 and in areas AR1 and AR2 are removed. As a result, the block insulating film 125, the charge storage layer 140, the tunnel insulating film 127, the semiconductor layer 128, and the core layer 129 remain in area AR4, and memory pillar MP is thus formed.

4.4 Advantages of Present Embodiment

With the configuration of the present embodiment, the advantages similar to those of the first embodiment can be obtained.

It should be noted that the second embodiment and the fourth embodiment may be combined. That is, the arrangement of the memory pillars MP in the cell portion may be similar to that of the second embodiment.

5. Fifth Embodiment

Then, a description will be given of the fifth embodiment. In the fifth embodiment, reference will be made to the case where the shape of the memory pillar MP in the MONOS type memory pillar MP is different from that of the fourth embodiment. Hereinafter, a description will be given focusing on the points in which the fifth embodiment differs from the first to fourth embodiments.

5.1 Configuration of Cell Portion

Figure 51:
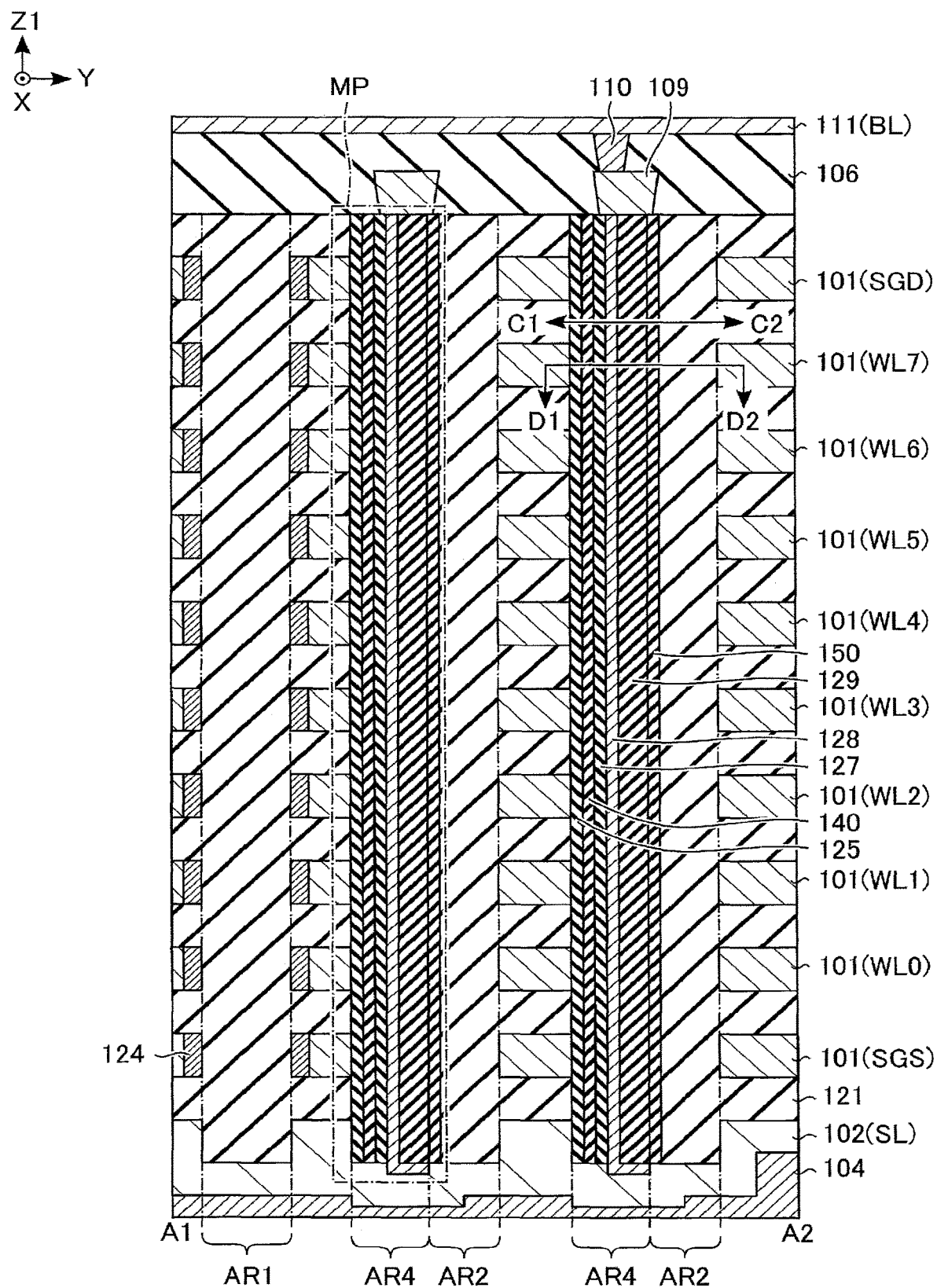
FIG. 51 is a cross-sectional view of a cell portion of a memory cell array provided in a semiconductor memory device according to a fifth embodiment.
Figure 52:
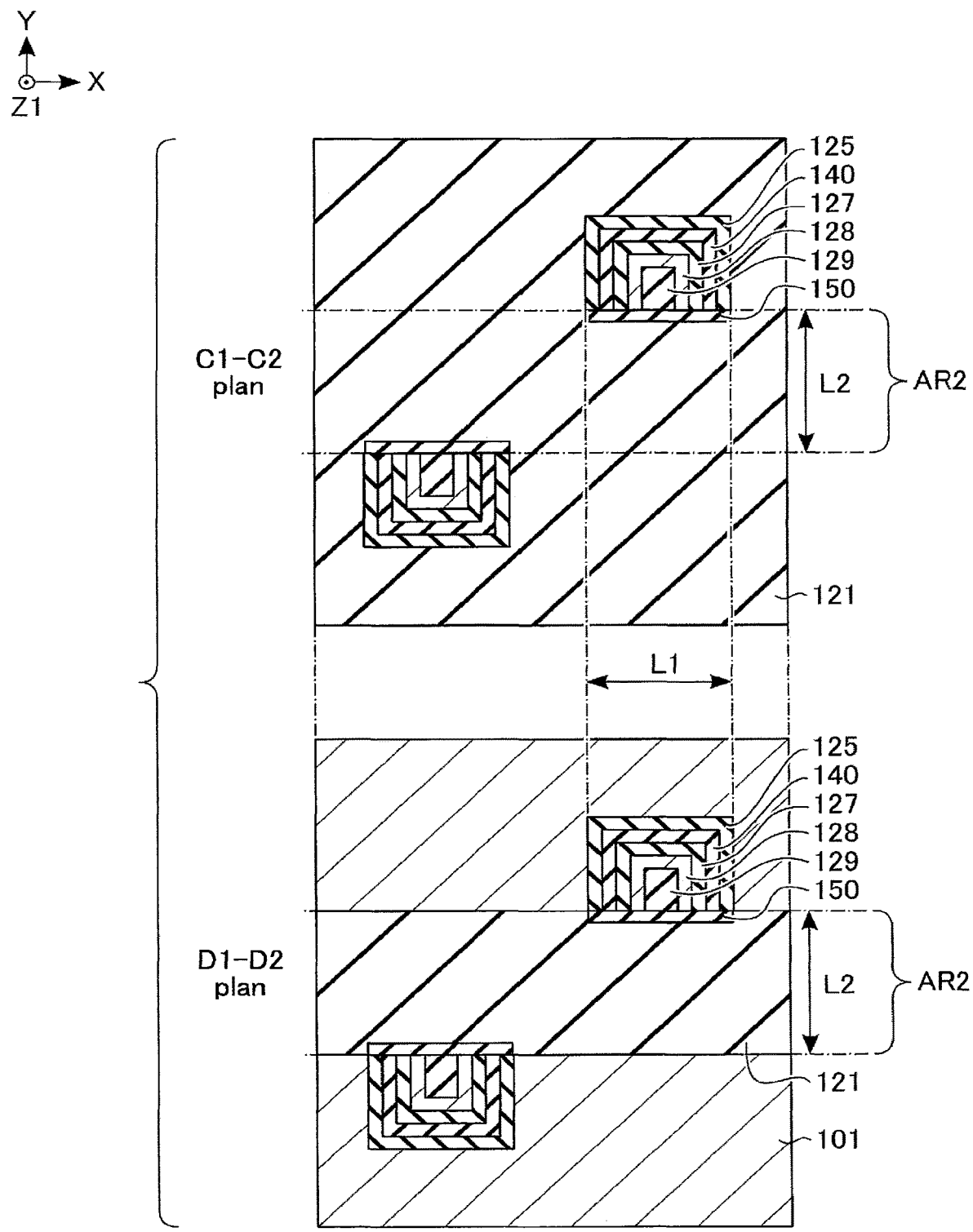
FIG. 52 is plans of the cell portion of the memory cell array provided in the semiconductor memory device according to the fifth embodiment.

An example of the configuration of the cell portion of the memory cell array 11 will be described with reference to FIGS. 51 and 52. FIG. 51 is a cross-sectional view of the cell portion. FIG. 52 shows plans taken along line C1-C2 and line D1-D2 of FIG. 51.

As shown in FIG. 51, the memory pillar MP of the present embodiment includes an insulating layer 150 provided in area AR2 and extending in the Z1 direction. The other configurations are the same as those shown in FIG. 49 referred to in connection with the fourth embodiment.

Next, a description will be given of the planar configuration of the memory pillar MP.

As shown in FIG. 52, the memory pillar MP of the present embodiment has a quadrangular prism shape whose upper face is substantially quadrangular. The shape of the upper face of the memory pillar MP is not limited to the quadrangle. For example, the shape of the upper face of the memory pillar MP may be polygonal or semicircular as long as one side is in contact with area AR2. The memory pillar MP of the present embodiment has the same shape between in the C1-C2 plan and in the D1-D2 plan.

The configurations of the block insulating film 125, the charge storage layer 140, the tunnel insulating film 127, the semiconductor layer 128, and the core layer 129 are similar to those shown in FIG. 50 of the fourth embodiment. The insulating layer 150 extends in the X direction and is provided such that one side face thereof is in contact with the block insulating film 125, charge storage layer 140, tunnel insulating film 127, semiconductor layer 128 and core layer 129 in area AR2.

5.2 Manufacturing Method of Memory Pillar

Next, a brief description will be given of the points in which the manufacturing method of the memory pillar MP differs from that of the fourth embodiment. In the present embodiment, area AR2 is not filled, and the side faces of the block insulating film 125, the charge storage layer 140, the tunnel insulating film 127, the semiconductor layer 128, and the core layer 129 in area AR4 are exposed in area AR2. In this state, the insulating layer 150 is formed by selective CVD. For example, where the charge storage layer 140 is SiN, SiN is formed by selective ALD (atomic layer deposition). In this case, SiN (insulating layer 150) is formed on the exposed side face of the memory pillar MP in area AR2, starting from the exposed SiN (charge storage layer 140) in area AR2. SiN (insulating layer 150) is formed until the surfaces of the block insulating film 125, the charge storage layer 140, the tunnel insulating film 127, the semiconductor layer 128, and the core layer 129 exposed in area AR2 are covered.

5.3 Advantages of Present Embodiment

With the configuration of the present embodiment, the advantages similar to those of the first embodiment can be obtained.

It should be noted that the second embodiment and the fifth embodiment may be combined. That is, the arrangement of the memory pillars MP in the cell portion may be similar to that of the second embodiment.

6. Sixth Embodiment

Next, a description will be given of the sixth embodiment. In connection with the sixth embodiment, reference will be made to the case where, in the MONOS type memory pillar MP, the shapes of the block insulating film 125, charge storage layer 140, tunnel insulating film 127, semiconductor layer 128 and core layer 129 are different from those of the fourth embodiment. Hereinafter, a description will be given focusing on the points in which the sixth embodiment differs from the first to fifth embodiments.

6.1 Configuration of Cell Portion

Figure 53:
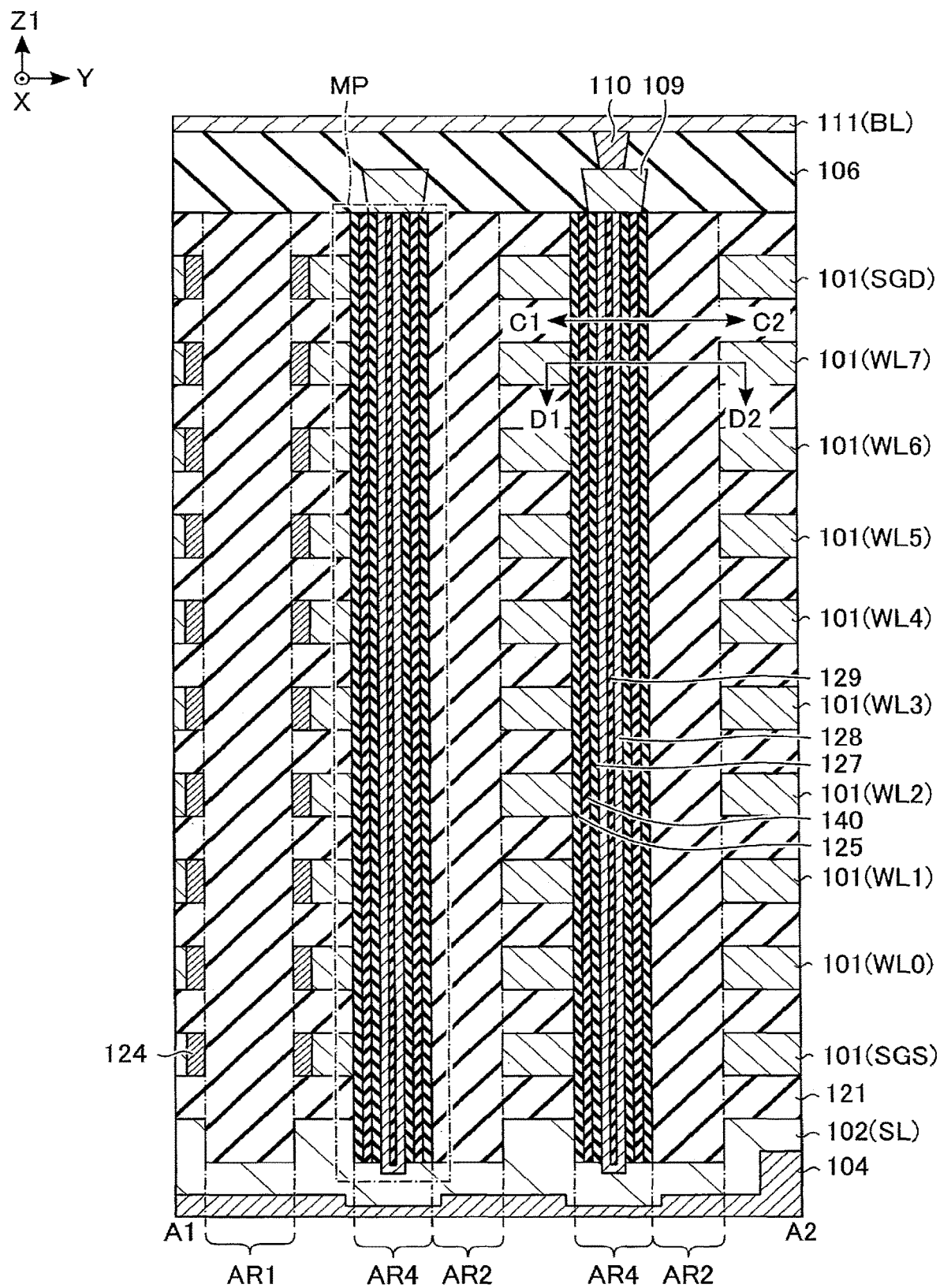
FIG. 53 is a cross-sectional view of a cell portion of a memory cell array provided in a semiconductor memory device according to a sixth embodiment.
Figure 54:
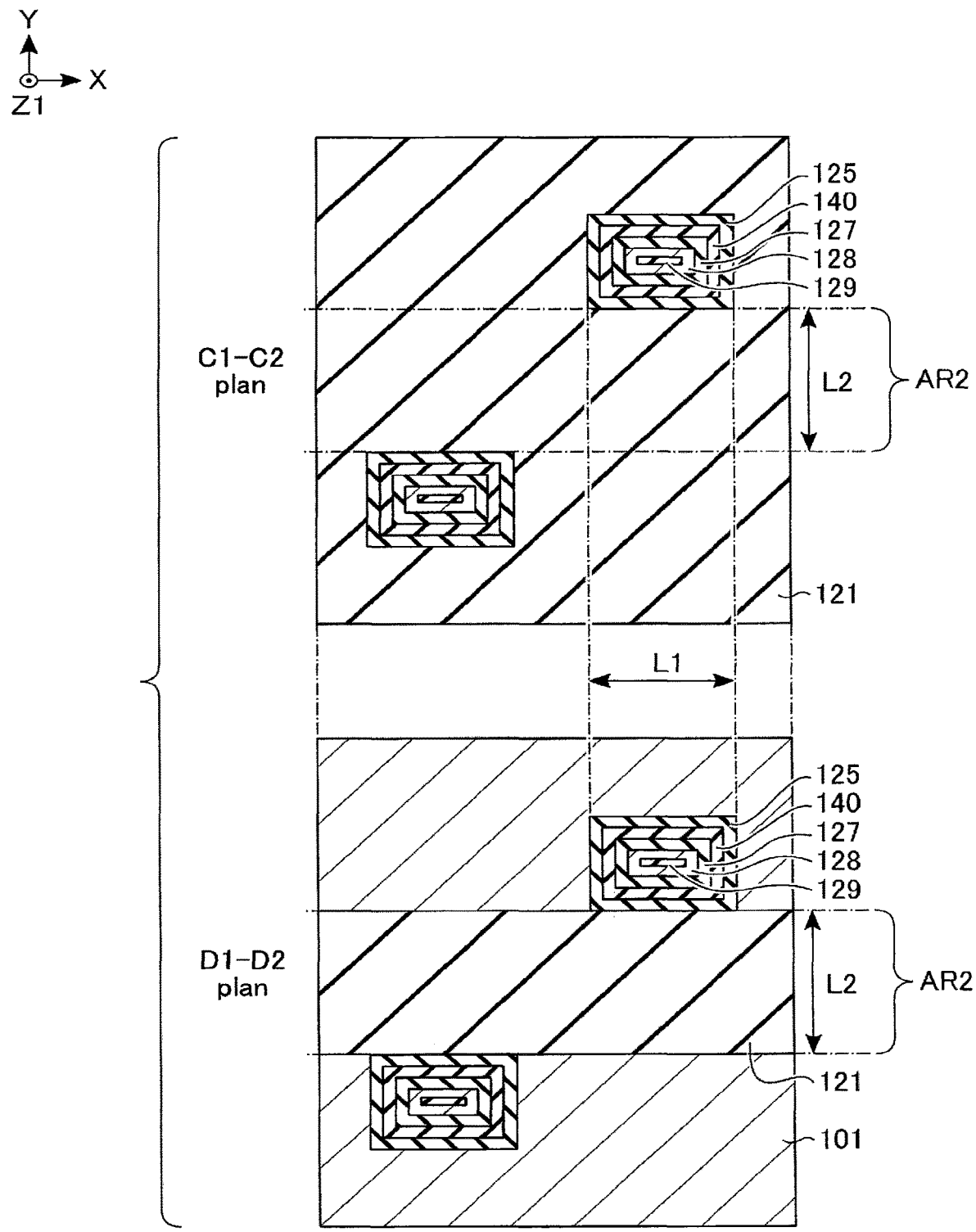
FIG. 54 is plans of the cell portion of the memory cell array provided in the semiconductor memory device according to the sixth embodiment.

An example of the configuration of the cell portion of the memory cell array 11 will be described with reference to FIGS. 53 and 54. FIG. 53 is a cross-sectional view of the cell portion. FIG. 54 shows plans taken along line C1-C2 and line D1-D2 of FIG. 53.

As shown in FIG. 53, the memory pillar MP includes a block insulating film 125, a charge storage layer 140, a tunnel insulating film 127, a semiconductor layer 128, and a core layer 129, which extend in the Z1 direction. The block insulating film 125, the charge storage layer 140, and the tunnel insulating film 127 are sequentially stacked from the side face of area AR4, and each of them has a tubular shape. The side faces (outer peripheral faces) of the semiconductor layer 128 is in contact with the tunnel insulating film 127, and the bottom face thereof is in contact with interconnect layer 102. The inside of the semiconductor layer 128 is filled with a core layer 129.

Next, a description will be given of the planar configuration of the memory pillar MP.

As shown in FIG. 54, the memory pillar MP has, for example, a quadrangular prism shape whose upper face is substantially quadrangular. The shape of the upper face of the column portion MP1 is not limited to the quadrangle. For example, the shape of the upper face of the column portion MP1 may be polygonal or semicircular as long as one side is in contact with area AR2. The side faces of the block insulating film 125 are in contact with the four side faces of the column portion MP1 (area AR4). The side faces (outer peripheral faces) of the charge storage layer 140 are in contact with the block insulating film 125. The side faces (outer peripheral faces) of the tunnel insulating film 127 are in contact with the charge storage layer 140. The side faces (outer peripheral faces) of the semiconductor layer 128 are in contact with the tunnel insulating film 127. A core layer 129 is provided inside the semiconductor layer 128.

6.2 Manufacturing Method of Memory Pillar

Next, a description will be given of the points in which the manufacturing method of the memory pillar MP differs from that of the fourth embodiment. According to the fourth embodiment, memory pillar MP is formed after the insulating layer 134 in area AR2 is removed. On the other hand, according to the present embodiment, the memory pillar MP is formed without the insulating layer 134 being removed.

6.3 Advantages of Present Embodiment

With the configuration of the present embodiment, the advantages similar to those of the first embodiment can be obtained.

It should be noted that the second embodiment and the sixth embodiment may be combined. That is, the arrangement of the memory pillars MP in the cell portion may be similar to that of the second embodiment.

7. Seventh Embodiment

Next, a description will be given of the seventh embodiment. In connection with the seventh embodiment, a description will be given of how the shape of memory pillar MP differs from that of the first to sixth embodiments. Hereinafter, a description will be given focusing on the points in which the seventh embodiment differs from the first to sixth embodiments.

7.1 Planar Configuration of Memory Pillar MP

Figure 55:
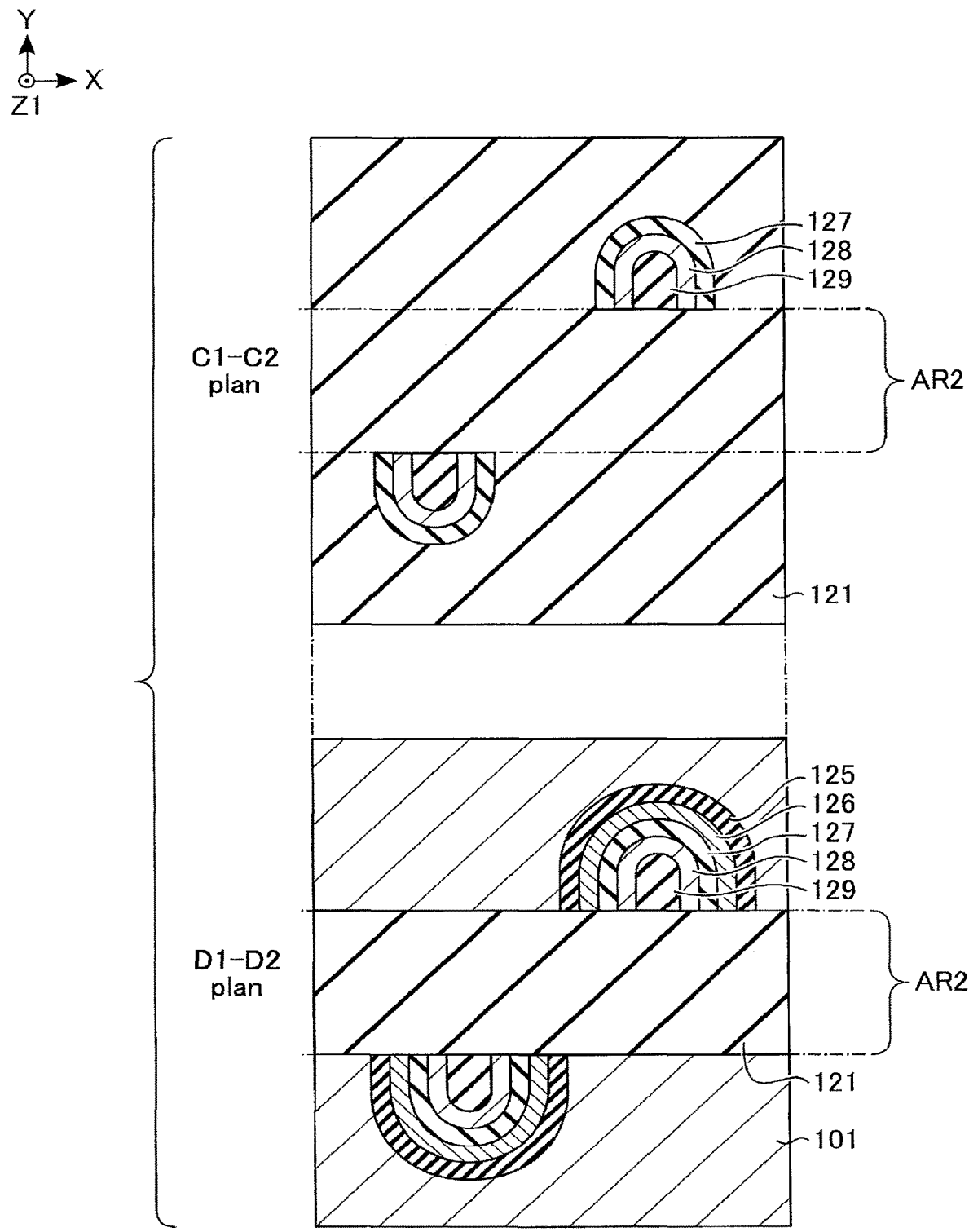
FIG. 55 is plans of a cell portion of a memory cell array provided in a semiconductor memory device according to a seventh embodiment.

A planar configuration of the memory pillar MP will be described with reference to FIG. 55. FIG. 55 is a plan view showing a C1-C2 plan and a D1-D2 plan.

As shown in FIG. 55, the face of the memory pillar MP facing area AR2 has an arc shape. In other words, the memory pillar MP has a U-shape.

7.2 Advantages of Present Embodiment

With the configuration of the present embodiment, the advantages similar to those of the first to sixth embodiments can be obtained.

In addition, in the configuration of the present embodiment, the memory pillar MP has a U-shape and does not have a corner at the contact portion with interconnect layer 101. Thus, an electric field from word line WL is prevented from being applied to a particular region of the memory cell transistor MC.

8. Modifications

A semiconductor memory device according to the above embodiments includes: a first interconnect layer (102); a second interconnect layer (BL) electrically coupled to the first interconnect layer; a plurality of third interconnect layers (101) stacked apart from each other in a first direction (Z direction) between the first interconnect layer and the second interconnect layer in the first direction, and extending in a second direction (X direction) that intersects the first direction; a first insulating layer (AR2) passing through the plurality of third interconnect layers, including one end that is in contact with a first face (S4) of the first interconnect layer, and extending in the second direction; a first memory pillar (MP) including a first semiconductor layer (128) and a charge storage layer (126), the first semiconductor layer passing through the plurality of third interconnect layers, including a side face in contact with a second face (S1) of the first insulating layer extending in the second direction and facing a third direction (Y direction) intersecting the first and second directions, including one end in contact with the first face of the first interconnect layer, and extending in the first direction, and the charge storage layer being capable of storing data and provided between the plurality of third interconnect layers and the first semiconductor layer. A distance between a third face (S5) of the first interconnect layer opposite to the first face and the second interconnect layer in the first direction, differs at a position corresponding to the first insulating layer from at positions corresponding to the third interconnect layers.

By application of the configurations of the above embodiments, it is possible to provide a semiconductor memory device that can be manufactured at low cost.

The embodiments are not limited to those described above, and various modifications can be made.

In addition, the "coupling" as used in the above embodiments is intended to include a state where a transistor, a resistor or the like is interposed between the coupled elements.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first interconnect layer;
   a second interconnect layer electrically coupled to the first interconnect layer;
   a plurality of third interconnect layers stacked apart from each other in a first direction between the first interconnect layer and the second interconnect layer in the first direction, and extending in a second direction that intersects the first direction;

a first insulating layer passing through the plurality of third interconnect layers, including one end that is in contact with a first face of the first interconnect layer, and extending in the second direction;

a first memory pillar including a first semiconductor layer and a charge storage layer, the first semiconductor layer passing through the plurality of third interconnect layers, including a side face in contact with a second face of the first insulating layer extending in the second direction and facing a third direction intersecting the first and second directions, including one end in contact with the first face of the first interconnect layer, and extending in the first direction, and the charge storage layer being capable of storing data and provided between the plurality of third interconnect layers and the first semiconductor layer, wherein a distance between a third face of the first interconnect layer opposite to the first face and the second interconnect layer in the first direction, differs at a position corresponding to the first insulating layer from at positions corresponding to the third interconnect layers.

2. The device according to claim 1, wherein
the first memory pillar includes a first portion including the first semiconductor layer, and a plurality of second portions provided between the first portion and respective ones of the plurality of third interconnect layers and each including the charge storage layer.

3. The device according to claim 2, wherein
a length of the first portion in the second direction is less than a length of the first insulating layer in the third direction.

4. The device according to claim 1, further comprising:
a second insulating layer arranged adjacent to the first insulating layer in the third direction, passing through the plurality of third interconnect layers, and extending in the second direction; and
a second memory pillar passing through the plurality of third interconnect layers, including a side face in contact with a fourth face of the second insulating layer extending in the second direction and facing the second face, and including a second semiconductor layer that includes one end in contact with the first face of the first interconnect layer and extends in the first direction,
wherein each of the plurality of third interconnect layers has a zigzag shape between the first insulating layer and the second insulating layer.

5. The device according to claim 1, wherein
the first semiconductor layer includes third and fourth portions each including one end in contact with the first insulating layer, and a fifth portion including one end coupled to other end of the third portion and other end coupled to other end of the fourth portion.

6. The device according to claim 4, further comprising:
a third memory pillar passing through the plurality of third interconnect layers, including a side face in contact with the second face, arranged adjacent to the first memory pillar in the second direction, and including a third semiconductor layer that includes one end in contact with the first face and extends in the first direction,
wherein the second memory pillar is arranged between the first memory pillar and the third memory pillar in the second direction.

7. The device according to claim 2, wherein
each of the plurality of second portions further includes a third insulating layer in contact with a fifth face of the charge storage layer that faces one of the plurality of third interconnect layers and a sixth face of the charge storage layer that faces the first direction.

8. The device according to claim 2, wherein
the first portion further includes a fourth insulating layer extending in the first direction and provided between the charge storage layer and the first semiconductor layer.

9. The device according to claim 1, wherein
the charge storage layer is extending in the first direction and is passing through the plurality of third interconnect layers, and
a length of the first memory pillar in the second direction is less than a length of the first insulating layer in the third direction.

10. The device according to claim 1, wherein
the first memory pillar includes a plurality of the charge storage layers.

11. A semiconductor memory device comprising:
an array region; and
an edge region surrounding the array region,
wherein the array region includes:
a first interconnect layer;
a second interconnect layer electrically coupled to the first interconnect layer;
a plurality of third interconnect layers stacked apart from each other in a first direction between the first interconnect layer and the second interconnect layer in the first direction, and extending in a second direction that intersects the first direction;
a first insulating layer passing through the plurality of third interconnect layers, including one end that is in contact with a first face of the first interconnect layer, and extending in the second direction;
a first memory pillar including a first semiconductor layer and a charge storage layer, the first semiconductor layer passing through the plurality of third interconnect layers, including a side face in contact with a second face of the first insulating layer extending in the second direction and facing a third direction intersecting the first and second directions, including one end in contact with the first face of the first interconnect layer, and extending in the first direction, and the charge storage layer being capable of storing data and provided between the plurality of third interconnect layers and the first semiconductor layer, and
the edge region includes a plurality of second semiconductor layers and a plurality of third semiconductor layers that are stacked alternately.

12. The device according to claim 11, wherein
the first memory pillar includes a first portion including the first semiconductor layer, and a plurality of second portions provided between the first portion and respective ones of the plurality of third interconnect layers and each including the charge storage layer.

13. The device according to claim 12, wherein
a length of the first portion in the second direction is less than a length of the first insulating layer in the third direction.

14. The device according to claim 11, further comprising:
a second insulating layer arranged adjacent to the first insulating layer in the third direction, passing through the plurality of third interconnect layers, and extending in the second direction; and
a second memory pillar passing through the plurality of third interconnect layers, including a side face in contact with a fourth face of the second insulating layer extending in the second direction and facing the second face, and including a fourth semiconductor layer that includes one end in contact with the first face of the first interconnect layer and extends in the first direction, wherein each of the plurality of third interconnect layers has a zigzag shape between the first insulating layer and the second insulating layer.

15. The device according to claim 11, wherein
the first semiconductor layer includes third and fourth portions each including one end in contact with the first insulating layer, and a fifth portion including one end coupled to other end of the third portion and other end coupled to other end of the fourth portion.

16. The device according to claim 14, further comprising:
a third memory pillar passing through the plurality of third interconnect layers, including a side face in contact with the second face, arranged adjacent to the first memory pillar in the second direction, and including a fifth semiconductor layer that includes one end in contact with the first face and extends in the first direction,
wherein the second memory pillar is arranged between the first memory pillar and the third memory pillar in the second direction.

17. The device according to claim 12, wherein
each of the plurality of second portions further includes a third insulating layer in contact with a fifth face of the charge storage layer that faced one of the plurality of third interconnect layers and a sixth face of the charge storage layer that faces the first direction.

18. The device according to claim 12, wherein
the first portion further includes a fourth insulating layer extending in the first direction and provided between the charge storage layer and the first semiconductor layer.

19. The device according to claim 11, wherein
the third semiconductor layer and the third interconnect layers include an identical material.

20. A semiconductor memory device comprising:
a first interconnect layer;
a second interconnect layer electrically coupled to the first interconnect layer;
a plurality of third interconnect layers stacked between the first interconnect layer and the second interconnect layer in a first direction and extending in a second direction intersecting the first direction;
a plurality of first insulating layers stacked alternately with the plurality of third interconnect layers in the first direction and extending in the second direction;
a second insulating layer passing through the plurality of third interconnect layers, including one end that is in contact with a first face of the first interconnect layer, and extending in the second direction;
a first memory pillar including a first semiconductor layer and a charge storage layer, the first semiconductor layer passing through the plurality of third interconnect layers, including a side face in contact with a second face of the second insulating layer extending in the second direction and facing a third direction intersecting the first and second directions, including one end in contact with the first face of the first interconnect layer, and extending in the first direction, and the charge storage layer being capable of storing data and provided between the plurality of third interconnect layers and the first semiconductor layer,
wherein a distance between the one end of the second insulating layer and the second interconnect layer is longer than a distance between the first insulating layer located closest to the second interconnect layer and the second interconnect layer in the first direction.

* * * * *